United States Patent
Kunikiyo

(10) Patent No.: US 6,639,288 B1
(45) Date of Patent: Oct. 28, 2003

(54) SEMICONDUCTOR DEVICE WITH A PARTICULAR CONDUCTOR ARRANGEMENT

(75) Inventor: Tatsuya Kunikiyo, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/597,465

(22) Filed: Jun. 19, 2000

Related U.S. Application Data

(63) Continuation of application No. 09/326,030, filed on Jun. 4, 1999, now Pat. No. 6,096,641.

(30) Foreign Application Priority Data

Jan. 19, 1999  (JP) ............................................. 11-10487

(51) Int. Cl.⁷ .......................... H01L 29/76; H01L 29/94; H01L 31/062; H01L 31/113; H01L 31/119
(52) U.S. Cl. ....................................... 257/412; 257/386
(58) Field of Search ................................ 257/382–413, 257/750–774; 438/300–306

(56) References Cited

U.S. PATENT DOCUMENTS

| | | | | |
|---|---|---|---|---|
| 4,990,974 A | * | 2/1991 | Vinal ........................ | 257/408 |
| 5,349,225 A | * | 9/1994 | Redwine et al. ............ | 257/408 |
| 5,600,168 A | * | 2/1997 | Lee ............................ | 257/412 |
| 5,741,722 A | * | 4/1998 | Lee ............................ | 438/396 |
| 5,998,847 A | * | 12/1999 | Assaderaghi et al. | |
| 6,023,088 A | * | 2/2000 | Son ........................... | 257/347 |
| 6,028,362 A | * | 2/2000 | Omura ....................... | 257/752 |
| 6,111,293 A | * | 8/2000 | Liao ........................... | 257/382 |
| 6,177,336 B1 | * | 1/2001 | Lin et al. .................... | 438/305 |

FOREIGN PATENT DOCUMENTS

JP          408046186 A    *   2/1996

* cited by examiner

*Primary Examiner*—Cuong Quang Nguyen
(74) *Attorney, Agent, or Firm*—Oblon, Spivak, McClelland, Maier & Neustadt, P.C.

(57) ABSTRACT

A tungsten nitride (6b) is provided also on side surface of a tungsten (6c), to increase an area where the tungsten (6c) and the tungsten nitride (6b) are in contact with each other. On a gate insulating film (2), a polysilicon side wall (5) having high adhesive strength to the gate insulating film is disposed. The polysilicon side wall (5) is brought into a close contact with the tungsten nitride (6b) on the side surface of the tungsten (6c). With this structure improved is adhesive strength of a metal wire or a metal electrode which is formed on an insulating film of a semiconductor device.

20 Claims, 31 Drawing Sheets

FIG. 32
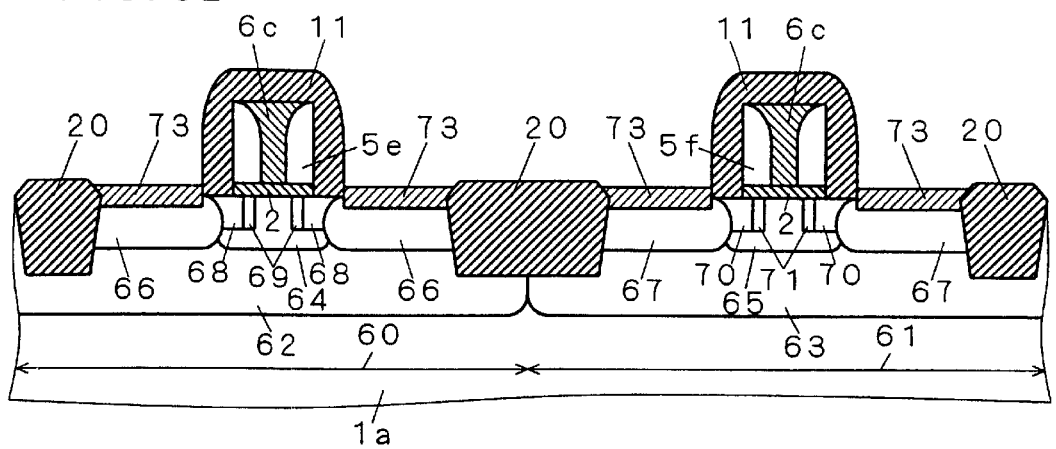
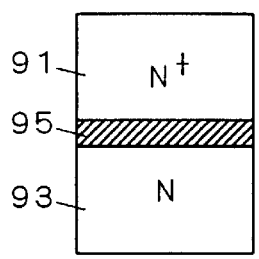
FIG. 33A
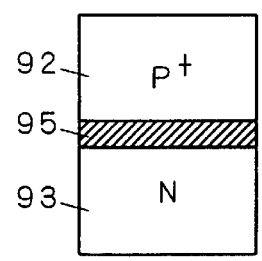
FIG. 33B
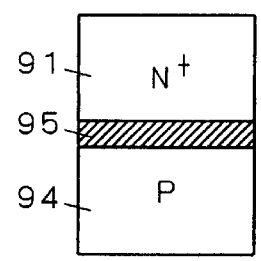
FIG. 33C
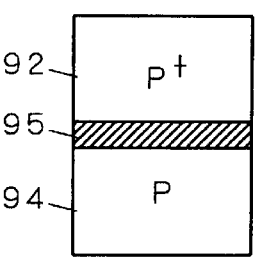
FIG. 33D
FIG. 34A
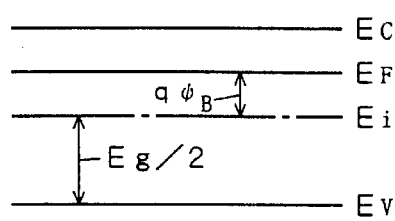
FIG. 34B
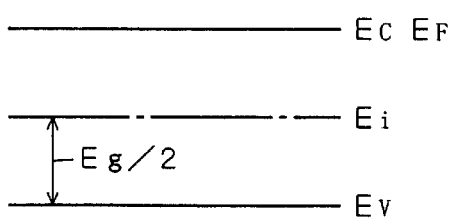
FIG. 34C
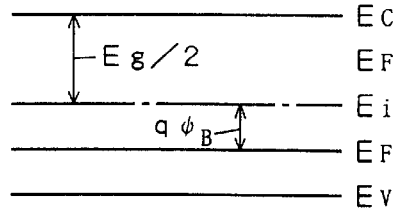
FIG. 34D
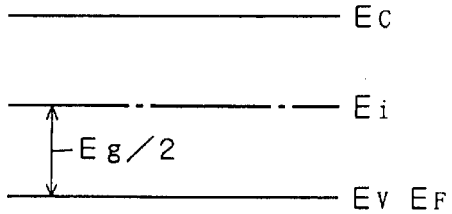

P⁺ POLYSILICON GATE ELECTRODE   SiO₂   N-TYPE SILICON SUBSTRATE

SEMICONDUCTOR DEVICE WITH A PARTICULAR CONDUCTOR ARRANGEMENT

This application is a Continuation of application Ser. No. 09/326,030 Filed on Jun. 4, 1999 now U.S. Pat. No. 6,096,641.

BACKGROUND OF THE INVENTION

1. Field of the Invention

The present invention relates to a method of manufacturing a semiconductor device such as a MOS (Metal Oxide Semiconductor) capacitor, a MOS transistor and a semiconductor integrated circuit, and more particularly to a method of manufacturing a semiconductor device in which a conductor is formed on an insulating film.

2. Description of the Background Art

As an example of background-art semiconductor device, a MOS capacitor, a MOS transistor and a semiconductor integrated circuit will be taken for the following discussion. In the MOS capacitor and the MOS transistor, an electrode on a gate insulating film corresponds to a conductor formed on an insulating film. In the semiconductor integrated circuit, a wire on an interlayer insulating film corresponds to the conductor formed on the insulating film.

FIG. 61 is a schematic diagram showing an example of sectional structure of a background-art MOS capacitor. In the MOS capacitor of FIG. 61, a gate insulating film 202 is provided on an N-type impurity diffusion layer 201b existing on one of major surfaces of a semiconductor substrate 201a. On the gate insulating film 202, a polysilicon 203 doped with boron and a tungsten silicide 204 are layered in this order, constituting a gate electrode. On the tungsten silicide 204, an insulating film 205 is formed. Arrows 206 of FIG. 61 indicate that the boron in the polysilicon 203 reaches the N-type impurity diffusion layer 201b through the gate insulating film 202. Such a phenomenon as the boron in the polysilicon 203 goes through the gate insulating film 202 is caused by thermal diffusion of the boron in the gate insulating film 202, resulting from a heat treatment for electrically activating a dopant in the semiconductor substrate 201b. That results in disadvantageous variation of threshold voltage of the MOS structure. Further, the boron in the polysilicon 203 is sucked from the polysilicon 203 out into the tungsten silicide (WSix) 204 as indicated by arrows 207 during the above heat treatment. The character x of WSix represents composition ratio, usually taking a value in a range from 2 to 3.

When the temperature of the boron in the polysilicon 203 falls due to movement of the boron such as going through the gate insulating film 202 and being sucked out into the tungsten silicide 204, the polysilicon 203 is depleted in application of negative voltage with reference to the semiconductor substrate 201a to the tungsten silicide 204. With depletion of the polysilicon 203, gate capacitance decreases, as shown in FIG. 62, in a region in which a channel is to be inverted, i.e., a region to which a negative voltage is applied.

The same occurs in the MOS transistor as does in the MOS capacitor. FIG. 63 shows a sectional structure of a background-art MOS transistor which is a constituent of a memory cell of a DRAM. The structure of the MOS transistor of FIG. 63 will be first discussed. The MOS transistor of FIG. 63 is isolated from other elements (not shown) on a semiconductor 1a by a shallow trench isolation 20 formed of a silicon oxide film on one of major surfaces of the semiconductor substrate 1a. Hereinafter, the shallow trench isolation is referred to as STI. In the one major surface of the semiconductor substrate 1a surrounded by the STI 20, an N-type source/drain region 13 is formed, to be connected to a storage capacitor (not shown). In the one major surface of the semiconductor substrate 1a surrounded by the STI 20, an N-type source/drain region 14 is so formed as not to come into contact with the N-type source/drain region 13. The N-type source/drain region 14 is connected to a bit line (not shown). A region between the N-type source/drain regions 13 and 14 is defined as a channel region, and a gate insulating film 2 is formed on the channel region in the one major surface of the semiconductor substrate 1a. On the gate insulating film 2, a doped polysilicon 18 is formed in a layered manner, and a tungsten silicide 19 is formed in a layered manner thereon. The doped polysilicon 18 and the tungsten silicide 19 constitute a gate electrode. Further, on the one major surface of the semiconductor substrate 1a, a nitrided oxide film 10a is so formed as to cover the gate insulating film 2 and the gate electrode, and an insulating film 10b having a thickness of about 50 nm is formed thereon.

For the same reason as in the MOS capacitor, when the doped polysilicon 18 is depleted and the gate capacitance decreases, a drain current decreases in the MOS transistor, causing deterioration of circuit performance. For example, Japanese Patent Application Laid Open Gazette No. 5-243564 discloses a MOS transistor consisting of tungsten side walls and a polysilicon doped with phosphorus for control of threshold voltage, and this structure also has the problem of depletion of the gate electrode.

As a method of solving the above problem of gate depletion proposed is use of a metal gate electrode. FIG. 64 shows an example of structure of a MOS capacitor using a metal gate electrode. In the MOS capacitor of FIG. 64, a tungsten 209 is used instead of the polysilicon 203 and the tungsten silicide 204 of FIG. 61. The tungsten 209 is formed on the gate insulating film 202 with a thin tungsten nitride 208 (WNx) interposed therebetween. The tungsten nitride 208 is placed below the tungsten 209 in order to prevent diffusion of tungsten atoms into the gate insulating film 202 to form fixed charges. If the fixed charges are formed, the threshold voltage of the transistor disadvantageously varies more widely than expected in a designing stage. Further, in order to prevent diffusion of tungsten atoms into other regions, the insulating film 205 is provided on the tungsten 209. In the structure of the MOS capacitor of FIG. 64, no depletion of the gate electrode occurs. Therefore, no decrease of drain current due to the gate depletion occurs.

Having the above structure, even when the metal nitride such as a tungsten nitride is sandwiched between the metal gate electrode and the gate insulating film, the background semiconductor device has a problem that poor cohesiveness between the metal gate electrode such as tungsten and the gate insulating film makes the metal gate electrode easy to remove. The problem becomes more serious as the semiconductor device becomes smaller since an area of contact between the gate insulating film 202 and the tungsten 209 becomes smaller as the gate length 210 or the gate width becomes smaller.

The problem that the metal gate electrode is easy to remove arises not only in the case where the tungsten is used as the gate electrode but also in the case where the metal is used as the bit line of the DRAM. For example, FIG. 65 shows a sectional structure of a region where the memory cell of the DRAM is formed when cut by one section parallel to a word line and in this figure, a bit line 219 formed of metal such as tungsten is disadvantageously easy to remove.

Now, a structure of the DRAM shown in FIG. 65 will be discussed. On the one major surface of the semiconductor substrate 1a, the STI 20 is formed, isolating the MOS transistor whose one of constituents is an N-type impurity diffusion layer 220. Entirely on the semiconductor substrate 1a having this structure, an interlayer insulating film 212 is formed, and a nitride film 213 is formed further thereon. A storage node 215 is formed on the nitride film 213 and inside a through hole which penetrates the nitride film 213 and the interlayer insulating film 212 to reach the N-type impurity diffusion layer 220. A dielectric 216 is sandwiched between the storage node 215 and a cell plate 217 corresponding to the storage node 215. An interlayer insulating film 214 is so formed on the nitride film 213 as to cover the storage node 215 and the cell plate 217. On the interlayer insulating film 214, an insulating film 218 is formed, and the bit line 219 is placed thereon.

The bit line 219 is formed by depositing a tungsten film on the insulating film 218 and then etching needless part of the tungsten film with a patterned resist as a mask. It is expected that the integration of a memory cell should be improved as generations of DRAM advance, and presently the minimum width of the bit line 219 ranges from about 0.1 μm to about 0.2 μm. Also in the structure of FIG. 65, because of poor cohesiveness between the insulating film 218 and the tungsten wire 219, the wire 219 is removed from the insulating film 218 in some portion of the bit line on a wafer, to be broken, or the removed tungsten is -displaced to cause a short circuit with a neighboring bit line.

SUMMARY OF THE INVENTION

The present invention is directed to a method of manufacturing a semiconductor device. According to a first aspect of the present invention, the method comprises the steps of: (a) forming a first insulating film on one major surface of a semiconductor substrate; (b) forming an adhesive member on the first insulating film; (c) forming a barrier layer on the first insulating film and side surfaces of the adhesive member; and (d) forming a conductor on the barrier layer, and in the method of the first aspect, the barrier layer prevents a substance which is a constituent material of the conductor from diffusing.

Preferably, the step (b) includes the steps of (b-1) forming a second insulating film on the first insulating film, the second insulating film having a hole in a portion where the conductor and the adhesive member are to be formed, the hole reaching the first insulating film; (b-2) filling the hole with composition material of the adhesive member; and (b-3) etching the composition material of the adhesive member anisotropically to form the adhesive member in an inner wall of the hole.

Preferably, the second insulating film includes a silicon oxide film and a silicon nitride film, and the step (b-1) includes the steps of (b-1-1) forming the silicon nitride film on the first insulating film; (b-1-2) forming the silicon oxide film on the silicon nitride film; and (b-1-3) forming the hole in the silicon oxide film and the silicon nitride film in this order.

Preferably, the step;(d) includes the steps of (d-1) filling the hole in which the adhesive member is formed with composition material of the conductor; (d-2) planarizing the composition material of the conductor with the second insulating film as a stopper; and (d-3) removing the second insulating film.

Preferably, the step (d-2) includes the step of (d-2-1) reducing difference in level of the conductor existing on the second insulating film.

Preferably, the hole is also provided in other portion than the portion where the conductor and the adhesive member are formed so that the composition material of the conductor is formed uniformly in the step (d-1).

According to a second aspect of the present invention, in the method of the first aspect, the adhesive member includes an adhesive member made of a material that can adhere to the first insulating film and the barrier layer with adhesive strength higher than that between the conductor and the barrier layer.

According to a third aspect of the present invention, the method comprises the steps of: (a) forming a first insulating film on one major surface of a semiconductor substrate; (b) forming an adhesive member on the first insulating film; and (c) forming a conductor on the first insulating film while being in contact with side surfaces of the adhesive member, and in the method of the third aspect, the adhesive member is made of a material that can adhere to the first insulating film and the conductor with adhesive strength higher than that between the conductor and the first insulating film.

According to a fourth aspect of the present invention, in the method of any one of the first to third aspects, the step (b) includes the steps of (b-1) forming a second insulating film on the first insulating film, the second insulating film having a hole in a portion where the conductor and the adhesive member are to be formed, the hole reaching the first insulating film; (b-2) filling the hole with composition material of the adhesive member; and (b-3) etching the composition material of the adhesive member anisotropically to form the adhesive member in an inner wall of the hole.

According to a fifth aspect of the present invention, in the method of the fourth aspect, the second insulating film includes a silicon oxide film and a silicon nitride film, and the step (b-1) includes the steps of (b-1-1) forming the silicon nitride film on the first insulating film; (b-1-2) forming the silicon oxide film on the silicon nitride film; and (b-1-3) forming the hole in the silicon oxide film and the silicon nitride film in this order.

According to a sixth aspect of the present invention, in the method of the first aspect, the step (c) includes the steps of (c-1) filling the hole in which the adhesive member is formed with composition material of the conductor; (c-2) planarizing the composition material of the conductor with the second insulating film as a stopper; and (c-3) removing the second insulating film.

According to a seventh aspect of the present invention, in the method of the sixth aspect, the step (c-2) includes the step of (c-2-1) reducing difference in level of the conductor existing on the second insulating film.

According to an eighth aspect of the present invention, in the method of the sixth aspect, the hole is also provided in other portion than the portion where the conductor and the adhesive member are to be formed so that the composition material of the conductor is formed uniformly in the step (c-1).

The present invention is also directed to a semiconductor device. According to a ninth aspect of the present invention, the semiconductor device comprises: a semiconductor substrate having an insulating film on its one major surface where constituent elements are incorporated; a first conductor formed on the insulating film, being electrically associated with the constituent elements; and an adhesive member formed on the insulating film while being in contact with the side surfaces of the first conductor, adhering to the insulating film and the first conductor with adhesive strength higher than that between the first conductor and the insulating film.

Preferably, the first;conductor has a trapezoidal section whose lower base on a side of the insulating film is shorter than its upper base, and the widest portion in a section of a gate electrode consisting of the first conductor and the adhesive member is defined by the upper base of the first conductor.

Preferably, the first conductor includes a gate electrode of a MOS transistor, and the insulating film includes a gate insulating film of the MOS transistor.

Preferably, the gate insulating film has a surface layer made of silicon oxide or titanium nitride in an interface with the adhesive member; and a dielectric layer provided below the surface layer, having permittivity higher than that of the surface layer.

Preferably, the adhesive member includes a silicon or a silicon germanium with impurity undoped in an interface with the insulating film.

Preferably, the adhesive member includes a silicon or a silicon germanium as a degenerate semiconductor having a conductivity type different from that of a channel of the MOS transistor in an interface with the insulating film.

Preferably, the adhesive member includes a silicon or a silicon germanium as a degenerate semiconductor having the same conductivity type as that of a channel of the MOS transistor in an interface with the insulating film.

Preferably, the first conductor includes interconnection of a semiconductor integrated circuit for being connected to the constituent elements incorporated in the semiconductor substrate.

Preferably, the semiconductor substrate further comprises an isolation insulating film for isolating a plurality of semiconductor devices formed in the semiconductor substrate; and a second conductor formed on the isolation insulating film, not being electrically associated with the constituent elements of the semiconductor device, and the adhesive member assists adhesion between the isolation insulating film and the second conductor.

According to a tenth aspect of the present invention, in the semiconductor device of the ninth aspect, the first conductor includes at least one of a metal and superconductor, the adhesive member includes a silicon, a silicon germanium, a metal oxide or a metal nitride, and the insulating film has a silicon oxide, a silicon nitride oxide or a titanium nitride in an interface with the adhesive member.

According to an eleventh aspect of the present invention, the semiconductor device comprises: a semiconductor substrate having an insulating film on its one major surface where constituent elements are incorporated; an adhesive member formed on the insulating film; a barrier layer formed on the insulating film and side surfaces of the adhesive member; and a first conductor formed on the barrier layer, being electrically associated with the constituent elements, and in the semiconductor device of the eleventh aspect, the barrier layer prevents a substance which is a constituent material of the first conductor from diffusing.

According to a twelfth aspect of the present invention, in the semiconductor device of the eleventh aspect, adhesive strength between the insulating film and the adhesive member and that between the adhesive member and the barrier layer are each higher than that between the first conductor and the barrier layer.

According to a thirteenth aspect of the present invention, in the semiconductor device of the eleventh or twelfth aspect, the barrier layer is made of tungsten nitride, tantalum nitride or titanium nitride, the first conductor includes at least one of a metal and a superconductor, the adhesive member includes a silicon, a silicon germanium, a metal oxide or a metal nitride, and the insulating film has a silicon oxide, a silicon nitride oxide or a titanium nitride in an interface with the adhesive member.

According to a fourteenth aspect of the present invention, in the semiconductor device of any one of the ninth to thirteenth aspects, the first conductor has a trapezoidal section whose lower base on a side of the insulating film is shorter than its upper base, and the widest portion in a section of a gate electrode consisting of the first conductor and the adhesive member is defined by the upper base of the first conductor.

According to a fifteenth aspect of the present invention, in the semiconductor device of any one of the ninth to fourteenth aspects, the first conductor includes a gate electrode of a MOS transistor, and the insulating film includes a gate insulating film of the MOS transistor.

According to a sixteenth aspect of the present invention, in the semiconductor device of the fifteenth aspect, the gate insulating film has a surface layer made of silicon oxide or titanium nitride in an interface with the adhesive member; and a dielectric layer provided below the surface layer, having permittivity higher than that of the surface layer.

According to a seventeenth aspect of the present invention, in the semiconductor device of the fourteenth or fifteenth aspect, the adhesive member includes a silicon or a silicon germanium with impurity undoped in an interface with the insulating film.

According to an eighteenth aspect of the present invention, in the semiconductor device of the fourteenth or fifteenth aspect, the adhesive member includes a silicon or a silicon germanium as a degenerate semiconductor having a conductivity type different from that of a channel of the MOS transistor in an interface with the insulating film.

According to a nineteenth aspect of the present invention, in the semiconductor device of the fifteenth or sixteenth aspect, the adhesive member includes a silicon or a silicon germanium as a degenerate semiconductor having the same conductivity type as that of a channel of the MOS transistor in an interface with the insulating film.

According to a twentieth aspect of the present invention, in the semiconductor device of any one of the ninth to fourteenth aspects, the first conductor includes interconnection of a semiconductor integrated circuit for being connected to the constituent elements incorporated in the semiconductor substrate.

According to a twenty-first aspect of the present invention, in the semiconductor device of any one of the ninth to twentieth aspects, the semiconductor substrate further comprises an isolation insulating film for isolating a plurality of semiconductor devices formed in the semiconductor substrate; and a second conductor formed on the isolation insulating film, not being electrically associated with the constituent elements of the semiconductor device, and the adhesive member assists adhesion between the isolation insulating film and the second conductor.

In the method of manufacturing a semiconductor device of the first aspect, since a contact area increases by an area where the barrier layer comes into contact with a side surface of the conductor, the conductor becomes hard to remove from the semiconductor substrate.

In the method of the second aspect, since the barrier layer on the side surface of the adhesive member is hard to remove, the adhesive strength between the conductor and the insulating film is effectively improved.

In the method of the third aspect, since the adhesive strength between the conductor and the semiconductor substrate is improved by the adhesive strength between the adhesive member and the conductor, the conductor becomes hard to remove from the semiconductor substrate.

In the method of the fourth aspect, by forming the hole at a position where the adhesive member is to be formed, the adhesive member can be easily formed at a desired position in a desired planar shape.

In the method of the fifth aspect, the damage such as etching from which the first insulating film suffers can be reduced in forming the hole.

In the method of the sixth aspect, the adhesive member can be easily formed on the side surface of the conductor through a simple operation of filling the adhesive member and the conductor together into the hole.

In the method of the seventh aspect, defects due to the difference in level of the conductor such as remainders of the conductor on the second insulating film and overetcing of the conductor in the hole can be reduced after planarization.

In the method of the eighth aspect, the hole is so disposed as to uniformly form the constituent material of the conductor to reduce the difference in level of the conductor existing on the second insulating film, and thereby defects due to the difference in level of the conductor such as remainders of the conductor on the second insulating film and overetcing of the conductor in the hole can be reduced after planarization.

In the semiconductor device of the ninth aspect, since the adhesive strength between the conductor and the semiconductor substrate is improved by the adhesive strength between the adhesive member and the conductor, the conductor becomes hard to remove from the semiconductor substrate.

In the semiconductor device of the tenth aspect, a relation of adhesive strength among the first conductor, the insulating film and the adhesive member can be easily achieved.

In the semiconductor device of the eleventh aspect, since a contact area increases by an area where the barrier layer comes into contact with a side surface of the first conductor, the first conductor becomes hard to remove from the semiconductor substrate.

In the semiconductor device of the twelfth aspect, since the barrier layer on the side surface of the adhesive member is hard to remove, the adhesive strength between the conductor and the insulating film is effectively improved.

In the semiconductor device of the thirteenth aspect, the function of the barrier layer and a relation among the adhesive strength between the insulating film and a lower-layer portion, that between the lower layer portion and the barrier layer and that between the first conductor and the barrier layer can be easily achieved.

In the semiconductor device of the fourteenth aspect the width of the gate electrode made of the first conductor and the adhesive member is not larger than the width of the upper base, for example, the mask when the first conductor is formed through photolithography, a structure suitable for improving integration can be provided.

In the semiconductor device of the fifteenth aspect, since removal of the gate electrode in the MOS transistor is prevented, it is possible to prevent the MOS transistor from not performing functions in accordance with design because of clearance between the gate electrode and the gate insulating film.

In the semiconductor device of the sixteenth aspect, the adhesive strength of the first conductor to the semiconductor substrate can be improved while the gate insulating film has high permittivity.

In the semiconductor device of the seventeenth aspect, silicon or silicon germanium is depleted to relieve an electric field strength at the gate end.

In the semiconductor device of the eighteenth aspect, a MOS transistor in which the gate electrode is not depleted can be easily provided.

In the semiconductor device of the nineteenth aspect, a MOS transistor in which a roll-off of a threshold voltage is relieved can be easily provided.

In the semiconductor device of the twentieth aspect, many wires existing in the integrated circuit are hard to remove, and a semiconductor device which is tough and manageable can be provided.

In the semiconductor device of the twenty-first aspect, removal of the second conductor is prevented and, for example, a break in a wire and a short circuit due to the removal of the second conductor can be prevented.

An object of the present invention is to improve the adhesive strength between a conductor and an insulating film on which the conductor is formed. Another object of the present invention is to provide a MOS transistor in which a gate electrode is made of a material having conductivity as high as or higher than metal has to prevent depletion of the gate electrode.

These and other objects, features, aspects and advantages of the present invention will become more apparent from the following detailed description of the present invention when taken in conjunction with the accompanying drawings.

BRIEF DESCRIPTION OF THE DRAWINGS

FIG. 32 is a schematic diagram showing another example of structure of a semiconductor device in accordance with the seventh preferred embodiment;

FIGS. 33A to 33D are conceptual diagrams showing a MOS structure in the background art;

FIGS. 34A to 34D are band diagrams each showing a band structure of a semiconductor;

DESCRIPTION OF THE PREFERRED EMBODIMENTS

The First Preferred Embodiment

In a method of manufacturing a semiconductor device in accordance with the first preferred embodiment of the present invention, an insulating film is formed on one of major surfaces of a semiconductor substrate and an adhesive member is formed further thereon. After that, barrier layers are formed on side surfaces of the insulating film and the adhesive member. A conductor is formed on the barrier layers. The adhesive member is formed on the insulating film, being made of a material which can adhere to the insulating film and the barrier layer with adhesive strength higher than that between the conductor and the barrier layer. A material of the barrier layer has a function of preventing diffusion of the substance which is a constituent material of the conductor. This barrier layer is formed between the adhesive member and the conductor, being in contact with both these layers. The barrier layer works to prevent the constituent material of the conductor from entering the inside of the adhesive member and further entering the insulating film through the adhesive member. Since the adhesive strength between the insulating film and the lower layer portion and that between the lower layer portion and the barrier layer are each higher than that between the conductor and the barrier layer, the semiconductor device of the present invention has higher adhesive strength than that with no adhesive member has by adhesion between side surfaces of the conductor and the barrier layer. Therefore, in the later manufacturing steps, the conductor is hard to remove from the insulating film, to reduce percentage of defective items to be produced.

FIGS. 1 to 5 each show a method of manufacturing a semiconductor device in accordance with the first preferred embodiment, which are schematic diagrams of sectional structures of the semiconductor substrate in respective steps. Though constituent elements are formed on the semiconductor substrate, some of them that are not essential for discussion on the present invention are omitted in FIGS. 1 to 5. In a case where a semiconductor integrated circuit including a MOS transistor is shown as the semiconductor device, for example, STIs are first formed for isolating the MOS transistor to be formed on the semiconductor substrate from other elements and then a well and a channel are formed by ion implantation, to form the semiconductor device, where these STIs and other elements are omitted.

Figure 1:
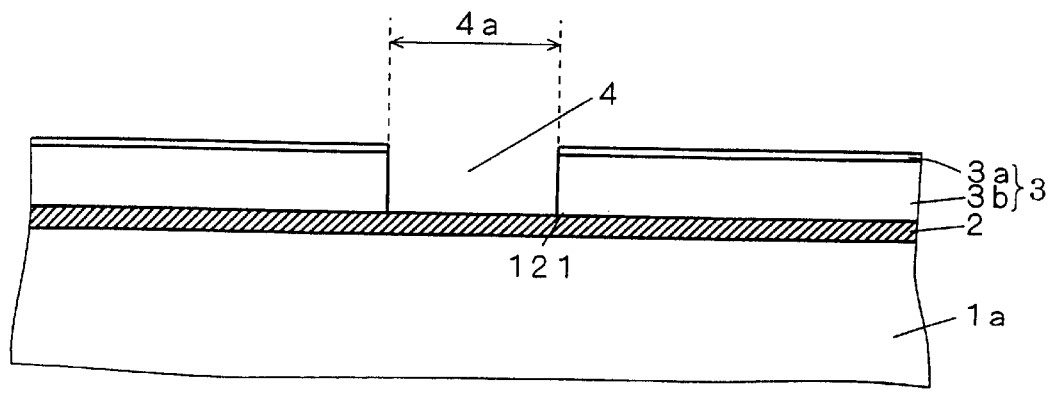
FIGS. 1 to 5 are schematic diagrams each showing a manufacturing step in a method of manufacturing a semiconductor device in accordance with a first preferred embodiment.

To obtain the sectional structure of FIG. 1, first, the gate insulating film 2 having a thickness of about 3 nm is formed of a silicon oxide film on the one major surface of the semiconductor substrate 1a. Subsequently, an insulating film 3 having a thickness of about 100 nm are formed on the gate insulating film 2, and then the insulating film 3 is coated with a resist and the resist is patterned through a transfer process. With the resist as a mask, part of the insulating film 3 is removed by anisotropic etching, to form a trench 4. The trench 4 which is a hole for forming a gate electrode is formed at a portion where the gate electrode is to be formed. It is desirable that the selection ratio between the gate insulating film 2 and the insulating film 3 should be sufficiently large in the anisotropic etching since the gate insulating film 2 is also removed by etching if the selection ratio is small (near "1"). For example, a film of double-layered structure consisting of a silicon nitride film ($Si_3N_4$) and a silicon oxide film ($SiO_2$) formed by the CVD method is used as the insulating film 3, and a nitrided oxide film (SiON) formed by nitriding and oxidizing the substrate in an NO or an $N_2O$ atmosphere is used as the gate insulating film 2. Removing the resist, the structure of FIG. 1 appears in which the trench 4 for forming the gate electrode is formed. The length of the trench 4 corresponds to a gate length on the mask, and is about 150 nm, for example.

Next, a polysilicon undoped with any impurity is so deposited entirely on the insulating film 3 up to about 30 nm as to be deposited also in the trench 4. Removing the polysilicon by anisotropic etching, polysilicon side walls 5 are formed as adhesive members on inner walls of the trench 4. The reason why the undoped polysilicon is deposited here is that this polysilicon is implanted with ions in the later step to be an N-type semiconductor or a P-type semiconductor depending on whether the transistor is N-type or P-type. Instead of this polysilicon, an undoped amorphous silicon or a polysilicon germanium may be used to produce the same effect. Because of crystal growth of grains of the polysilicon or the amorphous silicon in a heat treatment step after formation of the polysilicon, the grains of the polysilicon after the heat treatment become larger in size. Further, the grains of the amorphous silicon become larger than those of the polysilicon.

Figure 2:
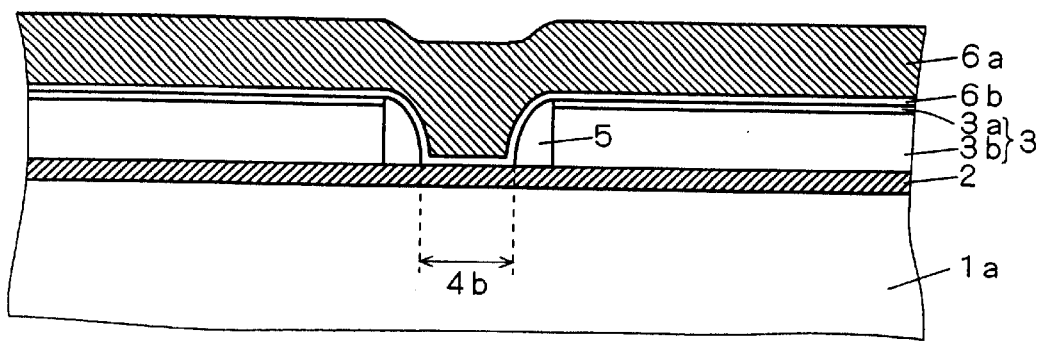

For example, a tungsten nitride 6b having a thickness 2 nm is deposited as a barrier layer on the exposed gate insulating film 2, the polysilicon side walls 5 and the insulating film 3. A tungsten film 6a is deposited on the tungsten nitride 6b to have a thickness of about 100 nm, to fill the trench 4 with the tungsten film 6a as shown in FIG. 2. The tungsten nitride 6b is placed in order to prevent diffusion of the tungsten as metal into the gate insulating film 2, the polysilicon side walls 5 and other regions causing reaction to produce contaminants.

Figure 3:
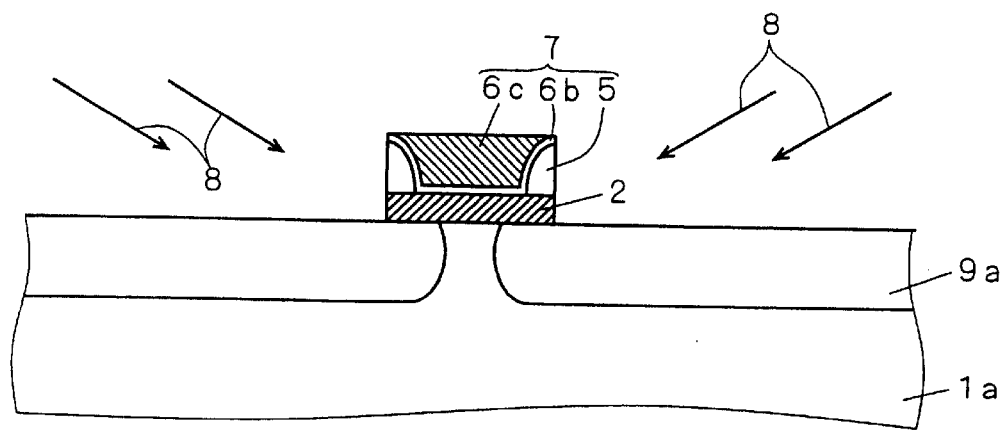

The tungsten film 6 a is planarized by the CMP (Chemical Mechanical Polishing), to form a gate electrode 7 with the trench 4 being filled. At this time, for planarization of the tungsten film 6a, a silicon nitride film 3a is also removed. The gate electrode thus obtained is constituted of the polysilicon side walls 5, the tungsten nitride 6b and a tungsten 6c having a trapezoidal section whose lower base is shorter than its upper base. After the trench 4 is formed as discussed above, through the step of filling the trench with metal, a series of steps of forming the gate electrode 7 and wires is termed a damascene process. Further steps of manufacturing the semiconductor device follow and the whole insulating film 3 and a portion of the gate insulating film 2 other than a portion below the gate electrode are removed by etching, to expose the gate electrode 7 as shown in FIG. 3 on the semiconductor substrate 1a. The cohesiveness between the tungsten 6c and the gate insulating film 2 made of a silicon oxide is poor even though the tungsten nitride 6b is sandwiched therebetween. However, since the adhesive strength between the gate insulating film 2 and the polysilicon side walls 5 and that between the polysilicon side walls 5 and the tungsten nitride 6b are each higher than that between the tungsten 6c and the tungsten nitride 6b, the adhesive strength between the tungsten nitride 6b and the tungsten 6c becomes higher by an increase of contact area between the tungsten nitride 6b and the tungsten 6c than that in the structure without the polysilicon side walls 5 as shown in FIG. 3, to make the tungsten 6c hard to remove from the insulating film 3 in the later manufacturing steps. The tungsten nitride 6b is essential also because it prevents tungsten-silicidation of the polysilicon side walls 5.

Figure 4:
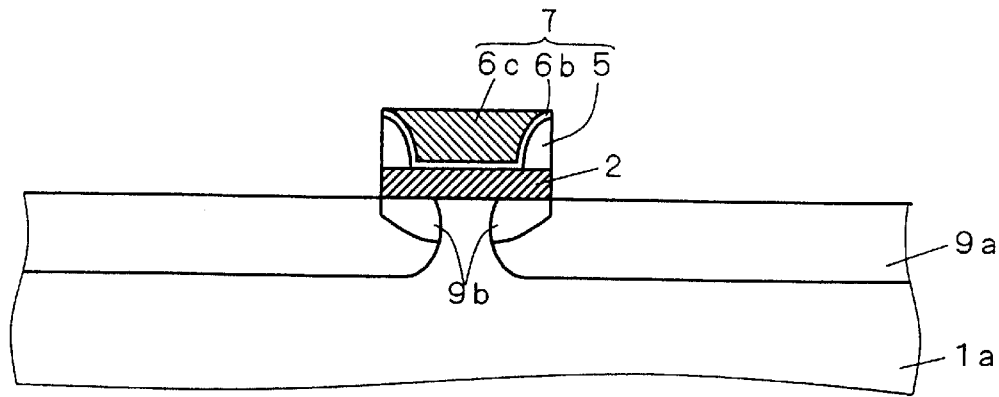

Next, for example, phosphorus ions 8 are implanted at a dose of $1 \times 10^{12}/cm^2$ at an energy of 20 keV at incident angle of 15 to 30 degrees. The rotation angle may be, for example, 0 to 360 degrees to make a continuous rotation, 0 degree, 90 degrees, 180 degrees and 270 degrees to make a four-stepped rotation, or 0 degree, 45 degrees, 90 degrees, 135 degrees, 180 degrees, 225 degrees, 270 degrees and 315 degrees to make an eight-stepped rotation. The phosphorus implanted into the semiconductor substrate 1a is used to form an $N^-$ source/drain region 9a as shown in FIG. 4. At the same time, the phosphorus is implanted also into the polysilicon side walls 5.

Further, before and after the phosphorus implantation, nitrogen ions may be implanted at a dose of $5 \times 10^{15}/cm^2$ at an energy of 20 keV at incident angle of 15 to 30 degrees. At this time, the nitrogen ions are implanted into the polysilicon side walls 5, the gate insulating film 2 and the semiconductor substrate 1a. Though the dopant in the polysilicon side walls 5 is diffused through the gate insulating film 2 and reaches the semiconductor substrate 1a, to cause variation of a threshold voltage in the MOS transistor, the implanted nitrogen ions work to prevent the variation of the threshold voltage. Further, the nitrogen ions block dangling bond of the silicon to reduce the interface level density in an interface between the semiconductor substrate 1a and the gate insulating film 2, and therefore hot carrier resistance is improved.

The amount of dopant in the polysilicon side walls 5 which is diffused to go through the gate insulating film 2 and reach the semiconductor substrate 1a becomes larger as the diffusion coefficient of the dopant in the polysilicon side walls 5 becomes larger. The dopant is diffused mainly through a grain boundary in the polysilicon side walls 5. The reason for this is that as the grain is a crystalline silicon, the diffusion coefficient of the dopant is the same as that of the crystalline silicon while the diffusion coefficient of the dopant in the grain boundary is hundreds times larger than that of the crystalline silicon. To reduce the diffusion coefficient of the dopant in the polysilicon side walls 5, it is only necessary to make the grain size of the polysilicon side walls 5 larger and make the grain boundary region smaller. Since larger grains are formed in the amorphous silicon than in the polysilicon side walls 5 after the heat treatment, the amorphous silicon has a larger effect of suppressing penetration of the dopant through the gate insulating film 2.

Figure 6:
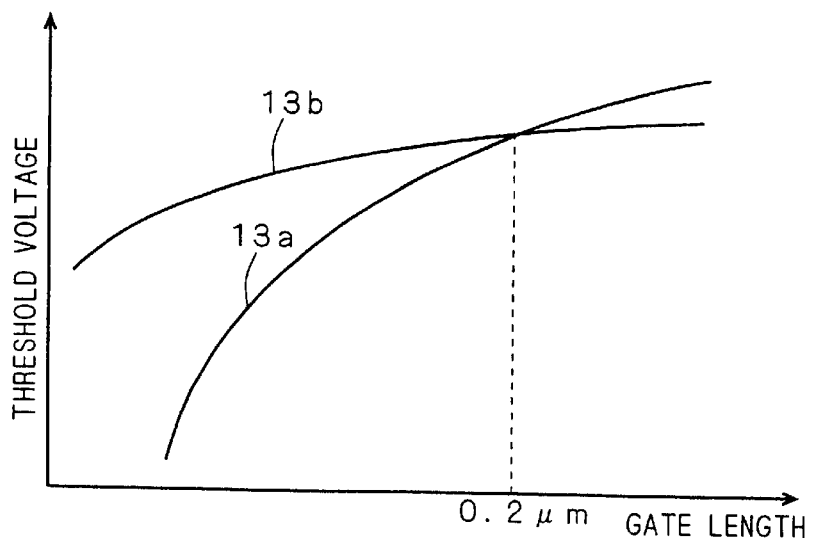
FIG. 6 is a graph showing a roll-off of a threshold voltage.

Further, boron may be implanted at a dose of $5 \times 10^{12}/cm^2$ at an energy of 10 keV at incident angle of 15 to 30 degrees before or after the implantation of phosphorus. The implantation of boron is made to form a $P^-$ layer 9b on an edge (on the side of the one major surface of a region below the gate insulating film 2) of the $N^-$ source/drain region 9a as shown in FIG. 4. The existence of $P^-$ layer 9b has an effect of suppressing a short channel effect of the MOS transistor, in particular, of easing variation of a roll-off of the threshold voltage. FIG. 6 shows this state. In FIG. 6, a curve 13a indicates a roll-off of a MOS transistor having no $P^-$ layer 9b while a curve 13b indicates that of a MOS transistor having the $P^-$ layer 9b. Since small variation of the threshold voltage in response to the variation of the gate length can suppress more variation of device characteristics in mass production, a gentler roll-off is better. That is why the $P^-$ layer 9b is formed.

Next, an oxide film or nitrided oxide film 10a having a thickness of about 5 nm is so formed as to cover the gate electrode 7. Further, the oxide film or nitrided oxide film 10a also-covers part of a region on the N⁻ source/drain region 9a surrounding the gate electrode 7. On the oxide film or nitrided oxide film 10a, an insulating film 10b having a thickness of about 50 nm is deposited. As a material of the insulating film, a TEOS film, a silicon oxide film, a silicon nitride film or a silicon nitrided oxide film may be used. The oxide film or nitrided oxide film 10a and the insulating film 10b constitute a side wall spacer 11 (see FIG. 5). To form the side-wall spacer 11, for example, an oxide film or nitrided oxide film is formed by the CVD (Chemical Vapor Deposition) method and a film to be the insulating film 10b is deposited, and then an anisotropic etching is performed with only an upper portion of the gate electrode 7 masked. The oxide film or nitrided oxide film 10a having a thickness of about 5 nm is placed below to reduce the interface level density of an interface between the semiconductor substrate 1a and the side walls 5. High interface level density in these portion causes an increase of leak current and a decrease in reliability of the MOS transistor. Since a silicon nitrided oxide film has lower interface level than a silicon oxide film, it is preferable, in order to reduce the interface level density, that the nitrided oxide film is placed below.

Further, the oxide film and the nitrided oxide film are used as the insulating film 10b for the side wall spacer 11 in order to suppress diffusion of the tungsten atoms into other regions. Though the TEOS film and the silicon oxide film have the same effect, the nitride film and the nitrided oxide film have a greater effect of suppressing diffusion of the tungsten atoms.

It is preferable, in order to achieve a desired adhesive strength, that the barrier layer is made of a tungsten nitride, a tantalum nitride or titanium nitride, the conductor includes at least one of metal and superconductor, the adhesive member includes a silicon, a silicon germanium, a metal oxide or a metal nitride and the gate insulating film has a silicon oxide, a silicon nitrided oxide or a titanium nitride in the interface with the adhesive member.

The gate electrode formed by the above-discussed manufacturing method can be applied to a gate electrode used for a buried-channel MOS transistor or a flash EEPROM as well as for the surface-channel MOS transistor.

The Second Preferred Embodiment

Now, a method of manufacturing a semiconductor device in accordance with the second preferred embodiment will be discussed. In the method of manufacturing a semiconductor device of the second preferred embodiment, an insulating film is formed on one of major surfaces of a semiconductor substrate and an adhesive member is formed thereon. After that, a conductor is so formed on the insulating film as to come into contact with the adhesive member with an inclined side. The adhesive member is formed of a material which can adhere to the insulating film and the conductor with adhesive strength higher than that between the conductor and the insulating film. Being manufactured through this manufacturing steps, the adhesive strength of the conductor to the insulating film is improved with the adhesive member, and therefore the conductor becomes hard to remove in the manufacturing process.

Figure 7:
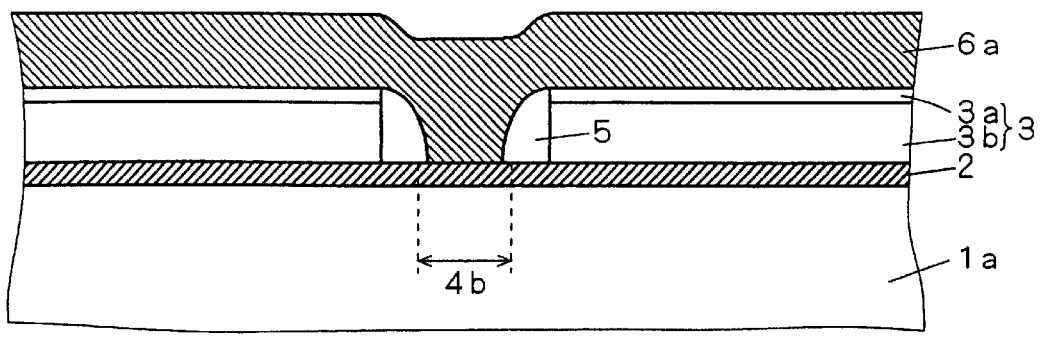
FIGS. 7 and 8 are schematic diagrams each showing a manufacturing step in a method of manufacturing a semiconductor device in accordance with a second preferred embodiment.
Figure 8:
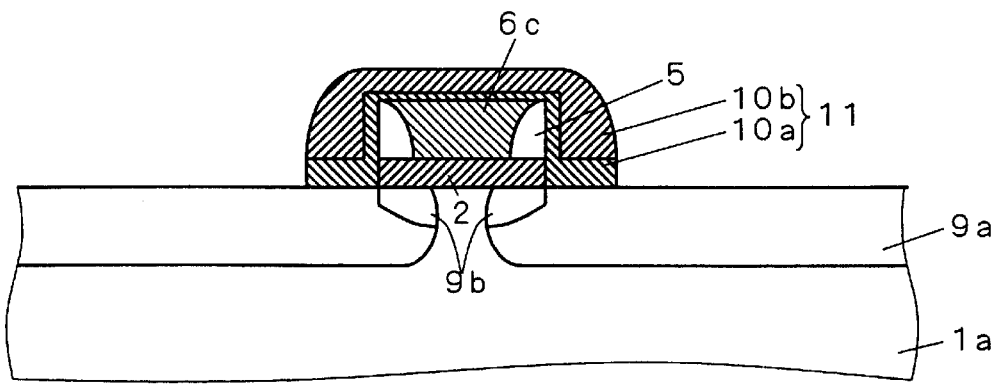

FIGS. 7 and 8 show the method of manufacturing a semiconductor device of the second preferred embodiment. The section of FIG. 7 corresponds to that of FIG. 2 used for the discussion of the first preferred embodiment. These sections are the same except that the tungsten nitride 6b is provided in FIG. 2. In other words, the section of FIG. 7 is obtained through the process for obtaining the section of FIG. 2 without the step of forming the tungsten nitride 6b. After that, through the process for manufacturing the semiconductor device of the first preferred embodiment discussed with reference to FIGS. 3 and 4, a MOS transistor having a section of FIG. 8 is obtained.

Though the tungsten nitride film ($WN_x$) is provided as the barrier layer in the first preferred embodiment, if diffusion of the metal such as the tungsten 6c is acceptable, the barrier layer may be omitted as shown in FIG. 8. In this case, though the polysilicon side walls 5 and the tungsten 6c may form a tungsten silicide in the later high-temperature heat treatment, the width of the polysilicon side wall 5 is sufficiently large and therefore the whole polysilicon sidewall 5 is not changed into the tungsten silicide.

The tungsten silicide has a lower adhesive strength with the gate insulating film 2 than the polysilicon. Therefore, the tungsten silicide, which is used as the adhesive member, has no effect to adhere the gate insulating film 2 and the tungsten 6c, and can not make the tungsten 6c hard to remove. Therefore, all the polysilicon side wall 5 can not be replaced by the tungsten silicide.

In the case of no barrier layer as shown in the second preferred embodiment, as the adhesive strength between the polysilicon side wall 5 which is partially silicified and the gate insulating film 2 and that between the tungsten 6c and the silicified polysilicon side wall 5 are each larger than that between the tungsten 6c and the gate insulating film 2, the adhesive strength of the tungsten 6c to the semiconductor substrate 1a is improved and therefore the conductor becomes hard to remove from the insulating film in the later manufacturing process, to reduce the rate of production of defective items.

It is preferable, in order to achieve a desired adhesive strength, that the conductor includes at least one of metal and superconductor, the adhesive member includes a silicon, a silicon germanium, a metal oxide or a metal nitride and the gate insulating film has a silicon oxide, a silicon nitrided oxide or a titanium nitride in the interface with the adhesive members .

The gate electrode formed by the above-discussed manufacturing method can be applied to a gate electrode used for a buried-channel MOS transistor or a flash EEPROM as well as for the surface-channel MOS transistor.

The Third Preferred Embodiment

Figure 9:
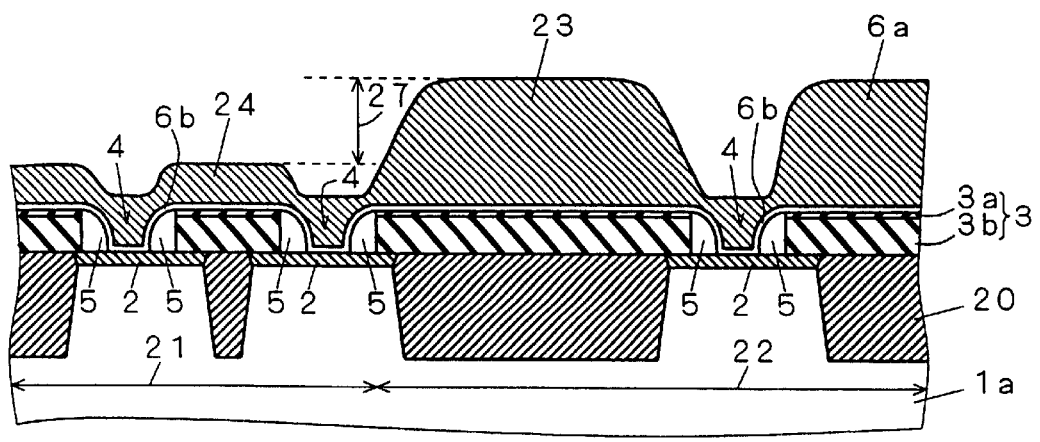
FIGS. 9 and 10 are schematic diagrams each showing a manufacturing step in a method of manufacturing a semiconductor device in the background art.
Figure 10:
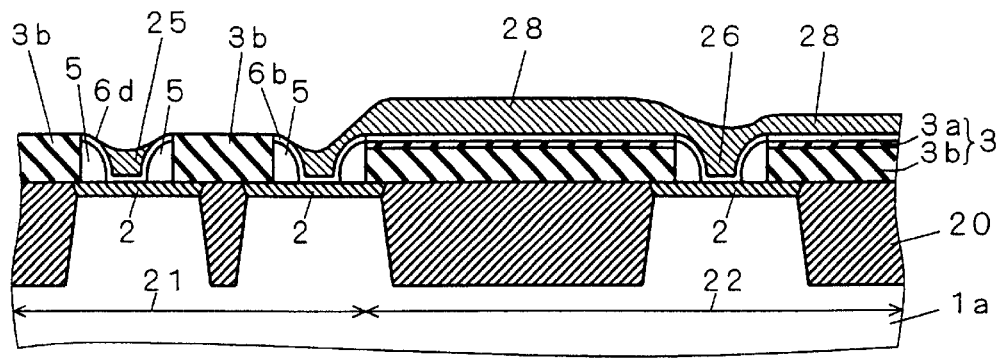

Now, a method of manufacturing a semiconductor device in accordance with the third preferred embodiment will be discussed. FIGS. 9 and 10 each show a step of manufacturing a semiconductor integrated circuit using the method of manufacturing the semiconductor device of the first preferred embodiment. To obtain a section of FIG. 9, the STI 20 is first formed on the one major surface of the semiconductor substrate 1a, and then the gate insulating film 3 is formed. After that, the gate insulating film 3 having the trench 4 is formed like in the first preferred embodiment, the polysilicon side walls 5 are formed on the inner walls of the trench 4, and the tungsten nitride 6b to form a barrier layer is deposited thereon. A tungsten is deposited on the tungsten nitride 6b, and a region 21 in which the gate electrodes are formed densely and a region 22 in which the gate electrodes are formed sparsely have different deposition states. Specifically, a portion 23 with the tungsten film 6a deposited thickly is found in the region 22 with trenches 4 provided sparsely and a portion 24 with the tungsten film 6a deposited thinly is found in the region 21 with the trenches 4 provided densely. That makes a large difference in level 27 between the thickly-deposited portion 23 and the thinly-deposited portion 24.

Planarization of the surface by the CMP in the state of FIG. 9 is made, to obtain a section of FIG. 10, for example. The CMP is a step of planarizing the tungsten film 6a with the insulating film 3 as a stopper, but the tungsten film 6a is not planarized even through the CMP because of the difference in level 27 between the thinly-deposited portion 24 and the thickly-deposited portion 23 as shown in FIG. 9. As shown in FIG. 10, in the region 21 with the gate electrodes provided densely, a recess is formed due to dishing caused by too much polishing in a tungsten 25 existing in the trench 4. The insulating film 3 which should serve as a stopper and the polysilicon side wall 5 become thinner because of too much polishing. If a slurry which has a strong polishing power is used, the insulating film 3 and the polysilicon side wall 5 may vanish. On the other hand, in the region 22 with the gate electrode provided sparsely, polishing remainders 28 of the tungsten film 6a is found on the insulating film 3 since the tungsten film 6a is not sufficiently polished. Thus, the large difference in level 27 causes the dishing, deterioration in uniformity of the tungsten thickness after polishing in a wafer surface and a decrease in thickness or vanishment of the insulating film as a stopper. As is clear from FIG. 10, the tungsten 25 has a trapezoidal section whose lower base is shorter than its upper base because of existence of the polysilicon side walls 5 and the width of an upper base of the tungsten 25 of the gate electrode becomes smaller with a decrease of an upper portion of the tungsten 25, which is a problem unique to the present invention.

Figure 11:
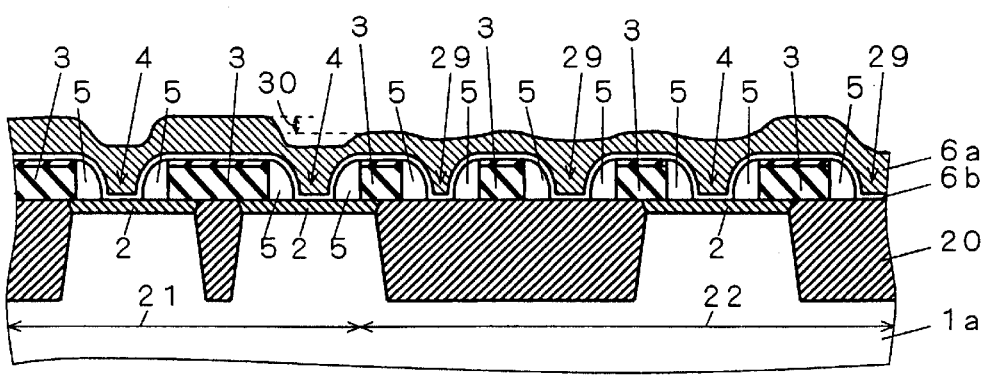
FIGS. 11 to 13 are schematic diagrams each showing a manufacturing step in a method of manufacturing a semiconductor device in accordance with a third preferred embodiment.
Figure 12:
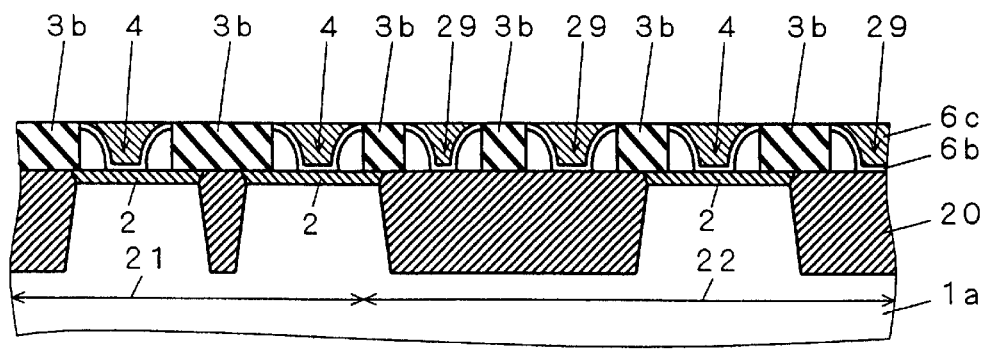
Figure 13:
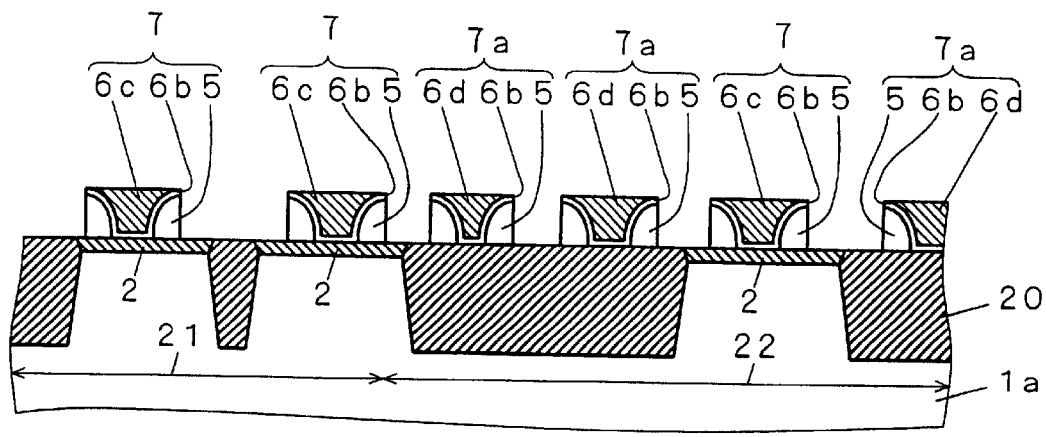

To solve the above problem, in the method of the semiconductor device of the third preferred embodiment, a trench 29, other than the trench 4 for forming the gate electrode, is provided in the region 22 with the gate electrodes provided sparsely, to planarize the tungsten film 6a as shown in FIG. 11. Burying the tungsten film 6a into the trench 29 uniforms the thickness of the tungsten film 6a on the insulating film 3. Further, the polysilicon side wall 15 is formed also in the trench 29. In the trench 29, the tungsten nitride 6b is provided as, a barrier layer below the tungsten film 6a. When the tungsten film 6a in the state of FIG. 11 is planarized by the CMP polishing, the tungsten 6c which is to be a constituent of the gate electrode is left in the trenches 4 and 29 with a silicon oxide film 3b as a stopper. Further, because of a small difference in level 30, the tungsten film 6a on the silicon oxide film 3b is removed with no remainder. By removing the silicon oxide film 3b by etching, as shown in FIG. 13, the gate electrode 7 constituted of the tungsten 6c, the tungsten nitride 6b and the polysilicon side walls 5 and a dummy gate electrode 7a constituted of a tungsten 6d, the tungsten nitride 6b and the polysilicon side walls 5 are formed. The gate electrode 7 is formed on the gate insulating film 2 while the dummy gate electrode 7a is formed on the STI 20, which is not a constituent element for the device. Since the dummy gate electrode 7a is provided with the polysilicon side walls, 5, the tungsten 6d is hard to remove in the manufacturing process. Reference signs of FIGS. 11 to 13 identical to those of FIG. 9 or 10 denote components corresponding to those of FIG. 9 or 10.

Though the case where the polysilicon side wall 5 is a constituent element for the gate electrode 7 and the dummy gate electrode 7a has been discussed, a gate electrode or a dummy gate electrode with no polysilicon side wall 5 may be formed in the damascene process to have the same effect of planarizing the tungsten film 6a as the third preferred embodiment.

Figure 66:
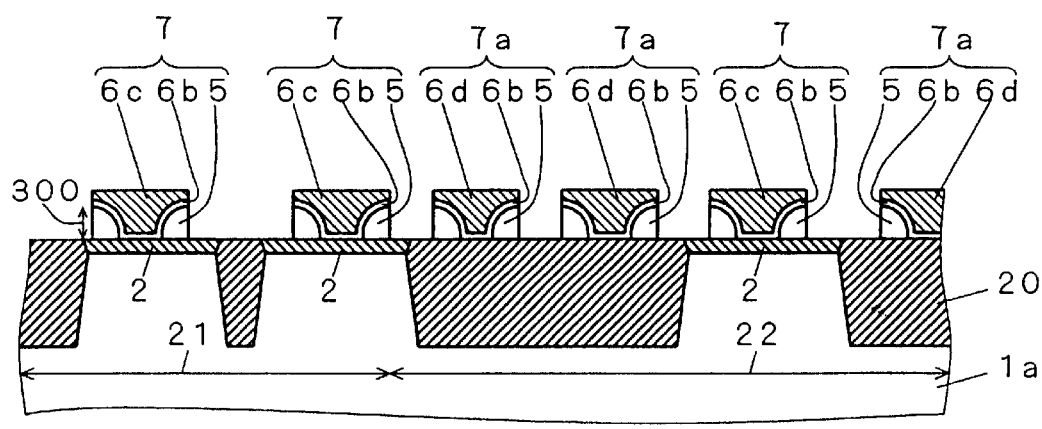
FIGS. 66 and 67 are schematic diagrams each showing another manufacturing step in the method of manufacturing a semiconductor device in accordance with the third preferred embodiment.
Figure 67:
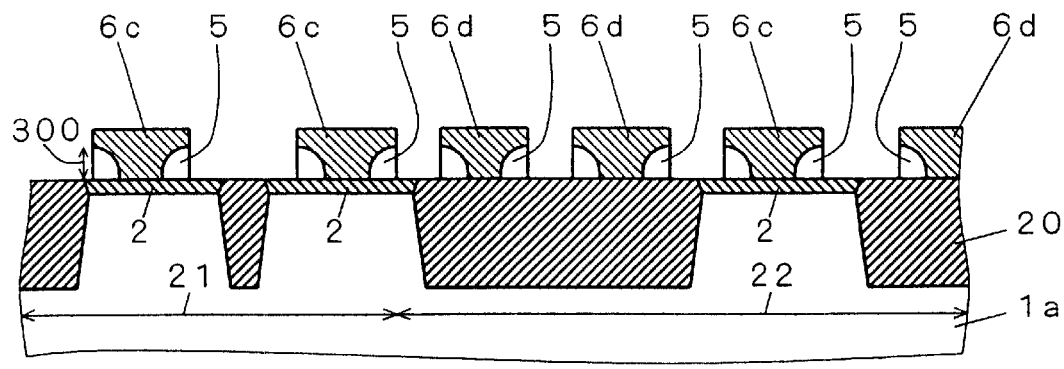

The problem that the tungsten 25 has a trapezoidal section whose lower base is shorter than its upper base because of existence of the polysilicon side walls 5 and the width of the upper base of the tungsten 25 becomes smaller with a decrease of the upper portion of the tungsten 25 due to dishing as shown in FIG. 10 can be eased by lowering the height 300 of polysilicon side wall 5 as shown in FIGS. 66 and 67. Further, this structure has an advantage that the resistance of the gate electrode becomes lower by an increase of cross-sectional area of the tungsten 6c in all the cross-section area of the gate electrode.

The Fourth Preferred Embodiment

Figure 14:
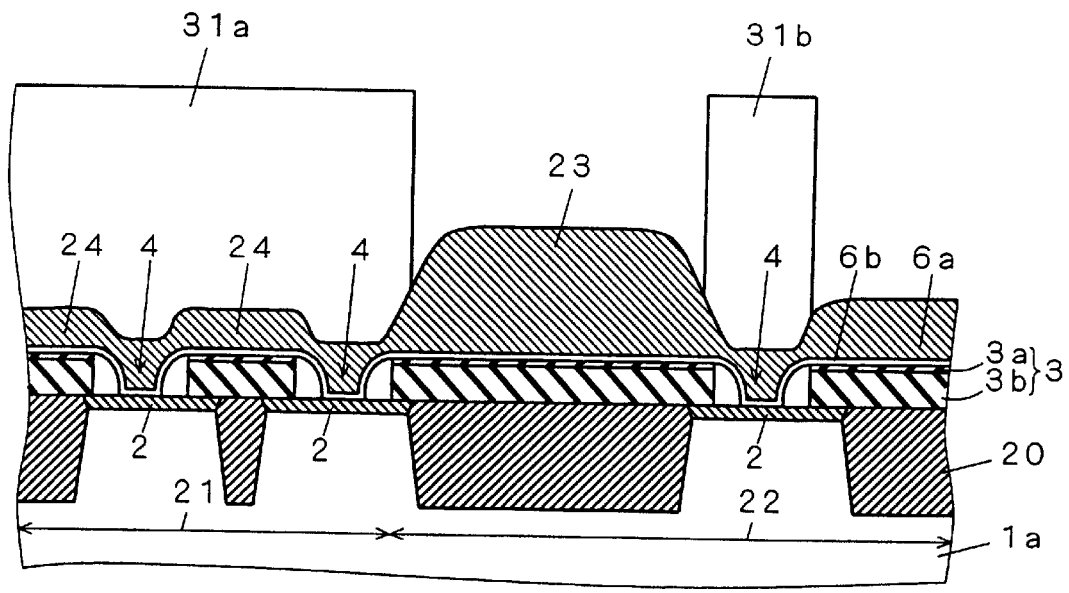
FIGS. 14 to 16 are schematic diagrams each showing a manufacturing step in a method of manufacturing a semiconductor device in accordance with a fourth preferred embodiment.
Figure 15:
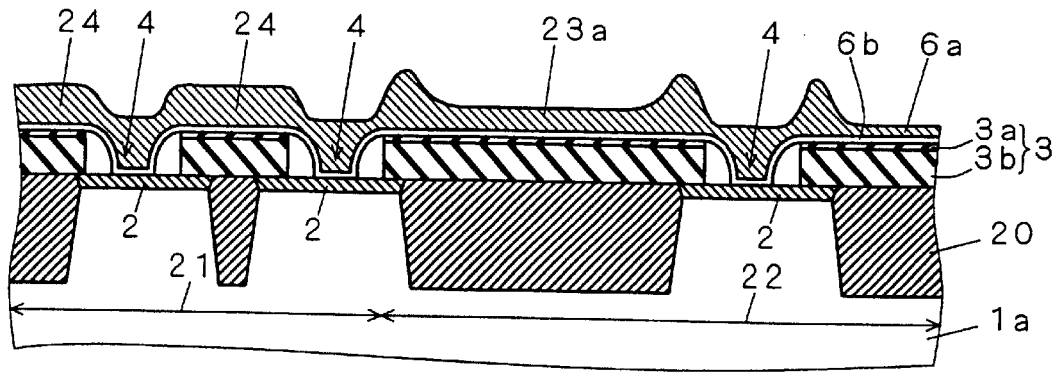
Figure 16:
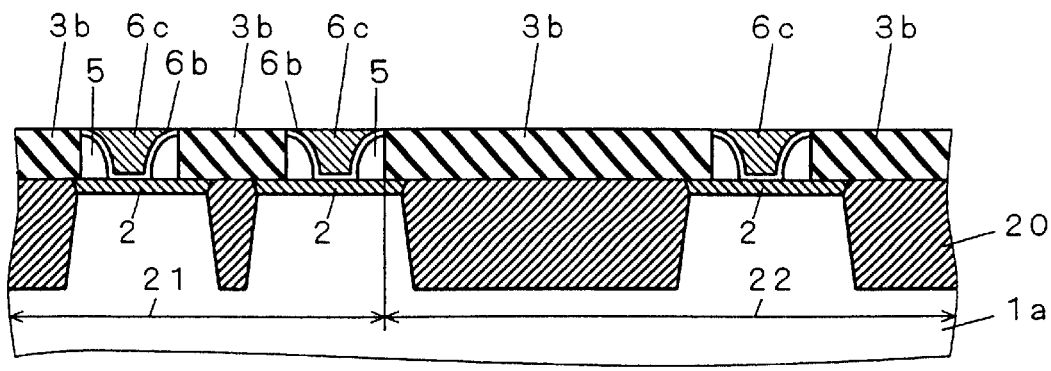

Though the dummy gate electrode 7a is formed to allow stable planarization of the gate electrode in the method of manufacturing the semiconductor device of the third preferred embodiment, the needless dummy gate electrode 7a is disadvantageously left. In the fourth preferred embodiment supposed is a method of manufacturing a semiconductor device which allows planarization of the gate electrode with no dummy gate electrode 7a left. In the method of manufacturing the semiconductor device of the fourth preferred embodiment, the portion 23 with the tungsten film 6a deposited thickly existing in the region 22 with the gate electrodes provided sparsely is thinned by etching. For this, as shown in FIG. 14, a resist 31a is formed in the region 21 with the gate electrodes provided densely. Further, a resist 31b is formed to cover the tungsten film 6a formed on the trench 4 in which the gate electrode is to be formed in the region 22 with the gate electrodes provided sparsely. Next, the tungsten 6a in the portion 23 with the tungsten film 6a deposited thickly is etched back to control its thickness, and thereafter the resists 31a and 31b are removed (see FIG. 15). The tungsten film 6a in the state of FIG. 15 is planarized by the CMP polishing, to thereby uniformly planarize both the region 21 with the gate electrodes provided densely and the region 22 with the gate electrodes provided sparsely (see FIG. 16). Reference signs of FIGS. 14 to 16 identical to those of FIG. 11, 12 or 13 denote components corresponding to those of FIG. 11, 12 or 13.

Though the case where the polysilicon side wall 5 is a constituent element for the gate electrode 7 has been discussed, a gate electrode with no polysilicon side wall 5 may be formed in the damascene process to have the same effect of planarizing the tungsten film 6a as the third preferred embodiment.

The Fifth Preferred Embodiment

Figure 17:
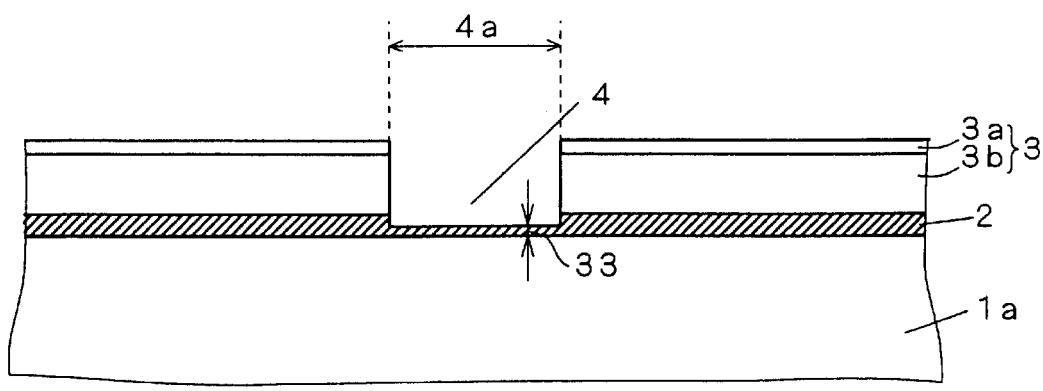
FIGS. 17 to 19 are schematic diagrams each showing a manufacturing step in a method of manufacturing a semiconductor device in the background art.
Figure 18:
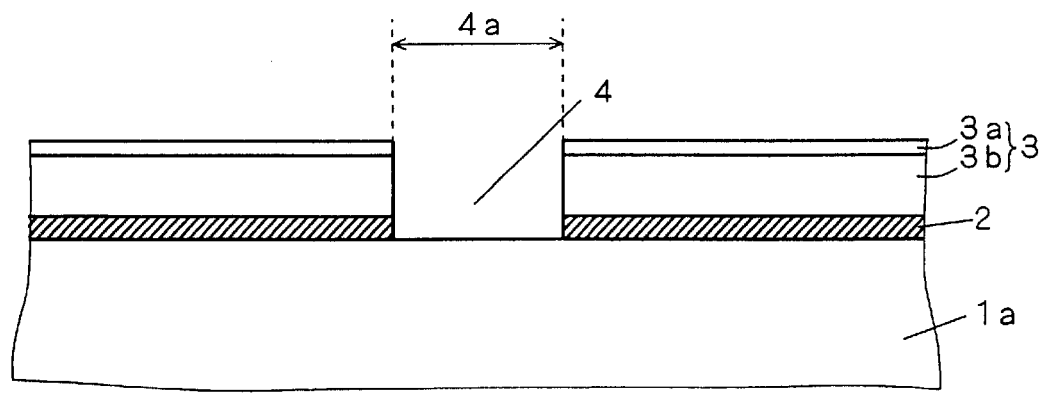

Now, a method of manufacturing a semiconductor device in accordance with the fifth preferred embodiment will be discussed. The method of manufacturing a semiconductor device of the fifth preferred embodiment is different from that of the first preferred embodiment in a structure of the insulating film having the trench for forming the gate electrode. FIGS. 17 and 18 are schematic diagrams showing an example of sectional structure of the semiconductor substrate 1a in the manufacturing process of the first preferred embodiment. The gate insulating film 2 is formed on the one major surface of the semiconductor substrate 1a and the insulating film 3 is deposited thereon, and then they are patterned with a mask to form the trench 4. Both FIGS. 17 and 18 show the states immediately after the trench 4 is formed. FIG. 17 shows a state where the thickness of the gate insulating film 2 is not uniform with a thickness 33 of the gate insulating film 2 thinned in the trench 4 because of overetching that works even on the gate insulating film 2.

Figure 19:
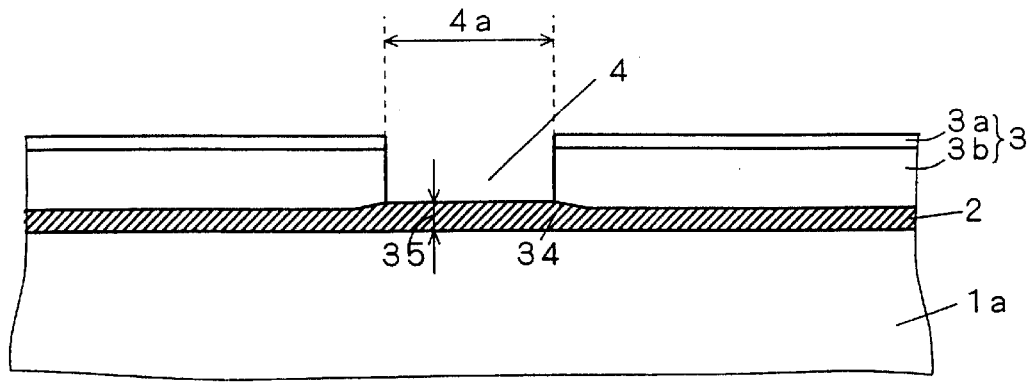

Thus, when the gate insulating film 2 suffers from a damage of anisotropic etching, the reliability of the gate insulating film 2 is deteriorated. FIG. 18 shows a state where the gate insulating film 2 is removed by overetching. When no gate insulating film 2 is found in the trench 4 as shown in FIG. 18, the gate insulating film may be formed again by thermal oxidation as disclosed in Japanese Patent Application Laid Open Gazette No. 5-243564. As shown in FIG. 19, however, a thickness 35 of the gate insulating film 2 further varies in the same semiconductor substrate 1a due, to a bird's beak 34 and variation in width of the trench 4. Furthermore, a stress concentrated on the bird's beak 34 deteriorates the reliability of the oxide film 3.

Figure 20:
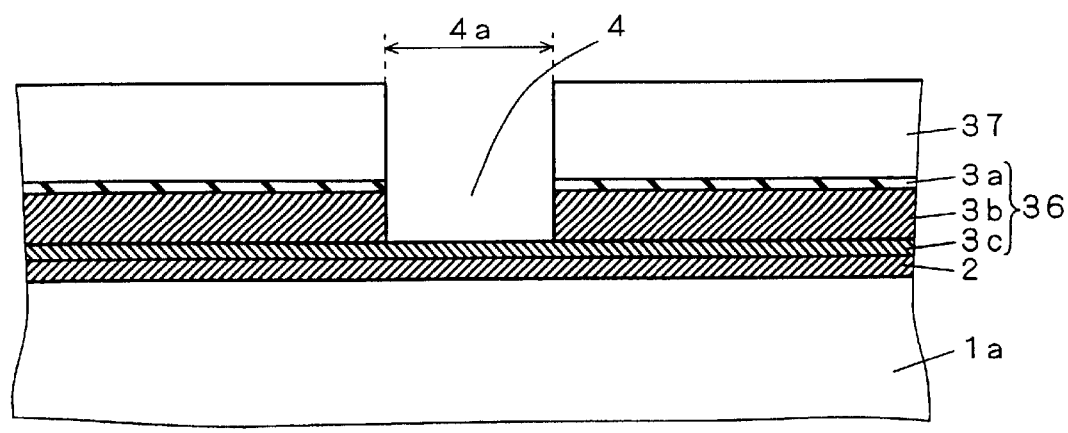
FIGS. 20 and 21 are schematic diagrams each showing a manufacturing step in a method of manufacturing a semiconductor device in accordance with a fifth preferred embodiment.
Figure 21:
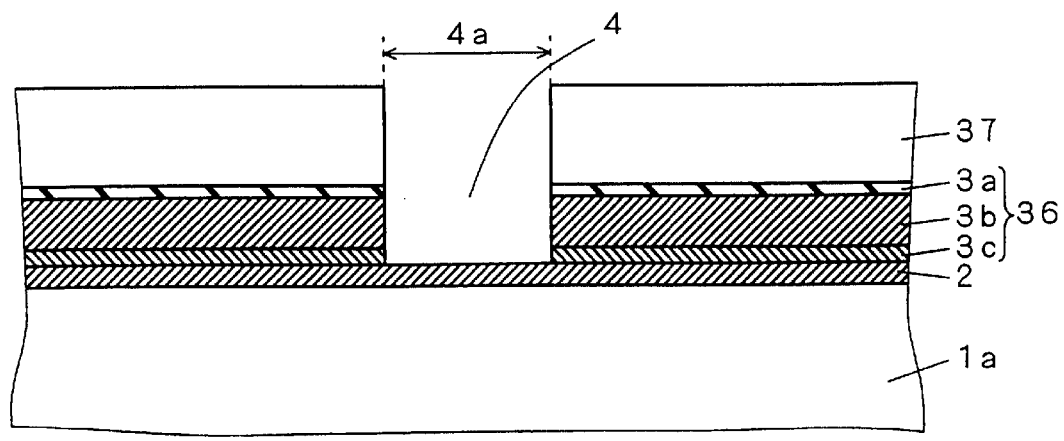

FIGS. 20 and 21 show formation of the trench 4, corresponding to FIG. 1 used for discussion of the method of manufacturing the semiconductor device of the first preferred embodiment. To obtain a sectional structure of FIG. 20, the semiconductor substrate 1a is first prepared with its one major surface provided with the gate insulating film 2. On the gate insulating film 2, an insulating film 36 is deposited. The insulating film 36 consists of the silicon nitride film 3a, a silicon nitride film 3c and the silicon oxide film 3b between the silicon nitride films 3a and 3c. FIG. 20 shows a state where the silicon nitride film 3a and the silicon oxide film 3b are etched with a resist 37 patterned in accordance with the-position-for forming the trench 4 as a mask. Since the silicon oxide film 3b and the silicon nitride film 3c have an etching selection ratio, too much small amount of silicon nitride film 3c is overetched. In short, the silicon nitride film 3c serves as a protection for the gate insulating film 2 against the damage of anisotropic etching.

The silicon nitride film 3c is removed by etching with thermal phosphoric acid (see FIG. 21). Since the gate insulating film 2 is made of a silicon oxide film or a silicon nitrided oxide film and the gate insulating film 2 and the silicon nitride film 3c have a large etching selection ratio, too much small amount of gate insulating film 2 is overetched. Further, since the silicon nitride film 3c is wet-etched, the gate insulating film 2 suffers from no damage of the etching. The structure where the insulating film 36 having the trench 4 is constituted of the double-layered silicon nitride films and the silicon oxide film therebetween can reduce the damage that the gate insulating film 2 would suffer from.

The Sixth Preferred Embodiment

Though a case, where a gate electrode of a MOS transistor is applied as a conductor electrically associated with constituent elements has been discussed in the first to fifth preferred embodiments, for example, a metal wire electrically connected to constituent elements in a semiconductor integrated circuit may be applied as the conductor electrically associated with constituent elements. For example, a bit line electrically connected to a memory cell which is a constituent element of a DRAM is made of tungsten having a line width of about 0.1 to 0.2 μm on an interlayer insulating film. Since the tungsten and the interlayer insulating film have poor chemical cohesiveness therebetween, the tungsten is easy to remove from the interlayer insulating film and especially a thin bit line has a problem of break.

Figure 22:
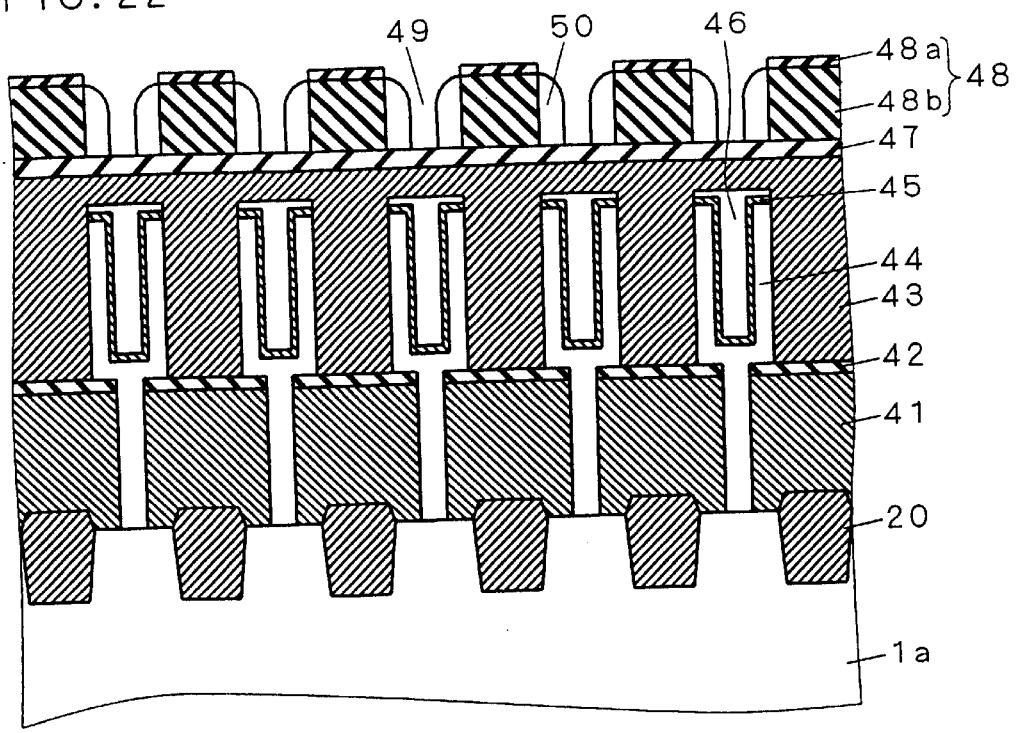
FIGS. 22 to 24 are schematic diagrams each showing a manufacturing step in a method of manufacturing semiconductor device in accordance with a sixth preferred embodiment.

FIG. 22 is a schematic diagram showing a sectional structure of a portion in which a memory cell is formed in a DRAM when cut in parallel to a word line. A plurality of storage nodes 44 which are, each a constituent of a capacitor for storing information are connected to the one major surface of the semiconductor substrate 1a isolated by the STIs 20. The storage nodes 44 are formed on a nitride film 42 over an interlayer insulating film 41 disposed on the one major surface of the semiconductor substrate 1a. Each of the,storage nodes 44 and each of cell plates 46 opposed thereto with highly-dielectric film's 45 interposed therebetween constitute the capacitor. The storage node 44 and the cell plate 46 are covered with the interlayer insulating film 43, and on the interlayer insulating film 43, an insulating film 47 is formed. Bit lines are formed on the insulating film 47, and since manufacturing steps of the conventional method are performed up to formation of the insulating film 47, discussion thereof is omitted.

An insulating film 48 is deposited entirely on the insulating film 47. The insulating film 48 is patterned with a mask to form a trench 49. The insulating film 48 is made of two films, i.e., a silicon nitride film 48 a and a silicon oxide film 48b. Subsequently, a polysilicon doped with phosphorus having a concentration of $1\times10^{21}/cm^3$ is deposited and an anisotropic etching is performed to form polysilicon side walls 50 along walls of the trench 49 in the insulating film 48 (see FIG. 22). The polysilicon doped with high concentration is used as the polysilicon side wall 50 in order that the polysilicon side wall 50 should be prevented from being depleted to work as a dielectric and the polysilicon side wall 50 should work as a metal. If the polysilicon side wall 50 works as a dielectric, as the silicon oxide film has a relative dielectric constant of about 3.9 while the silicon has that of about 11.7, the silicon has the relative dielectric constant three times higher than the silicon oxide film and a large wiring capacitance. By preventing depletion of the polysilicon side wall 50, it is possible to prevent an increase of delay time. Further; to obtain the polysilicon which works as a metal, doping phosphorus of high concentration.produces the same effect.

Next, on the walls of the trench 49, a tungsten nitride, for example, is thinly formed. On the tungsten nitride, a tungsten film is deposited to fill the trench 49. Planarization is performed with the silicon oxide film 48b as a stopper to form a bit line 53. The bit line 53 is made of the polysilicon side wall 50, a tungsten nitride 51 and a tungsten 52. The tungsten nitride 51 works in the same manner as, for example, the tungsten nitride 6b does. Subsequently, an interlayer insulating film 54 is deposited, to obtain a DRAM having a section of FIG. 23. Since the cohesiveness between the insulating film 47 and the polysilicon side wall 50 and that between the polysilicon side wall 50 and the tungsten nitride 6b are each higher than that between the tungsten nitride 6b and the tungsten 52, the bit line 53 having a trapezoidal section whose lower base is shorter than its upper base has more contact area by its inclined side and therefore the bit line 53 becomes hard to remove. Further, as the polysilicon side wall 50 does not become thicker than the width of an upper side of the bit line 53, it is possible to prevent deteriorate integration of the DRAM.

Figure 23:
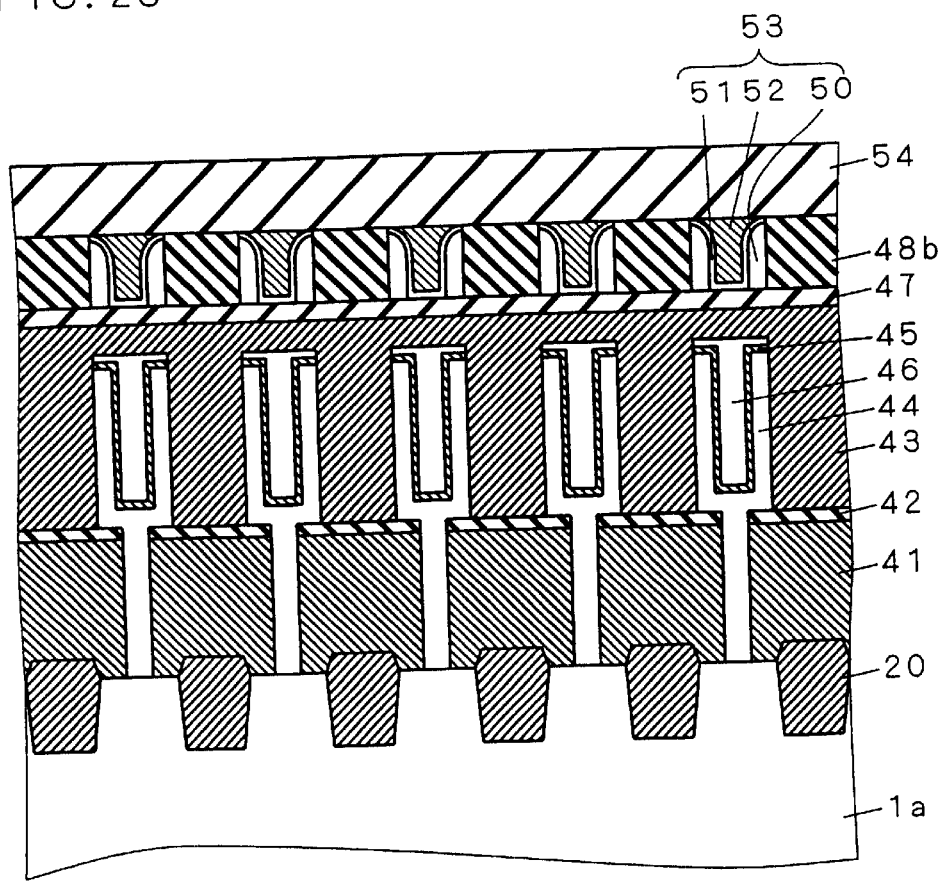
Figure 24:
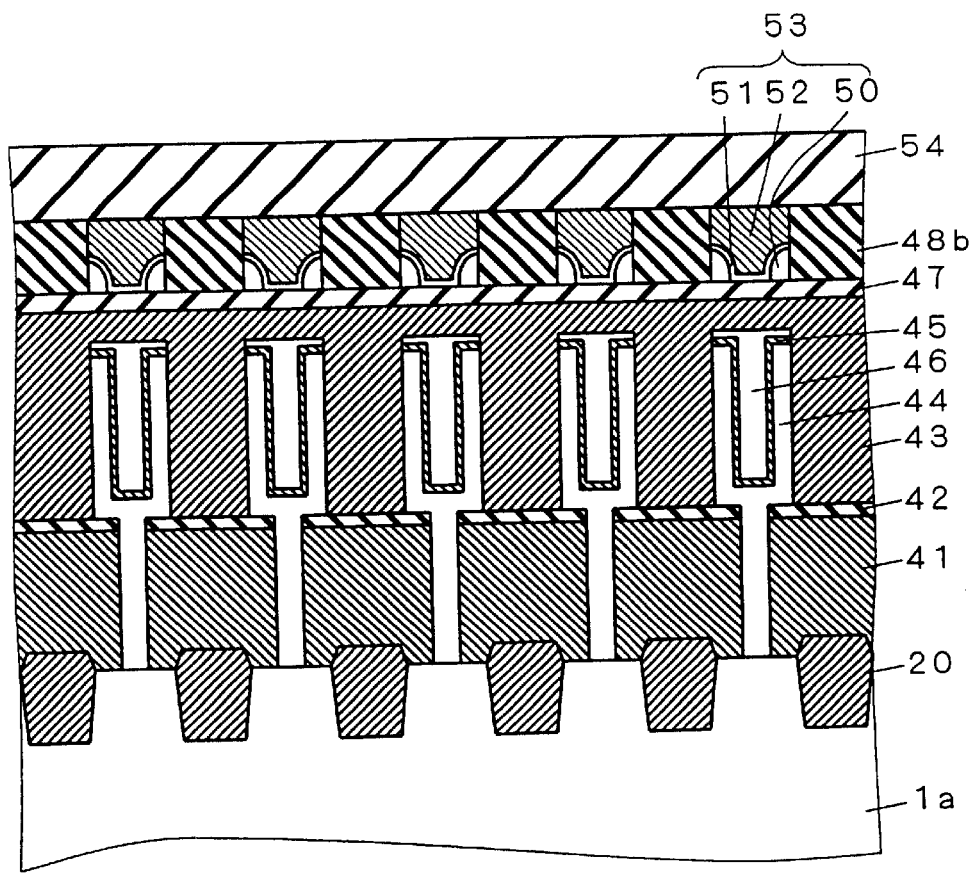

Though even the structure of FIG. 23 can sufficiently reduce the wire resistance of the bit line 53, the resistance value of the bit line 53 can be lowered by increasing the area of the tungsten 52 in the cross-sectional area of the bit line 53 (see FIG. 24). To obtain a structure of FIG. 24, by changing the condition of the anisotropic etching from that in the manufacturing process of FIG. 23, the height and width of the polysilicon side wall 50 are further reduced. If the height and width of the polysilicon side wall 50 are each about 20 to 30 nm, the adhesive strength between the polysilicon side wall 50 and the insulating film 47 and that between the polysilicon side wall 50 and the tungsten 52 can be sufficiently obtained.

An advantage other than improvement in adhesive strength in the method of manufacturing the semiconductor-device of the sixth preferred embodiment is that there is little thinning or variation in width of metal wire due to halation in a transfer process since the metal wire is not directly patterned with a resist. Therefore, because of no halation, an ARC (Anti Reflection Coating) film is not needed.

Figure 68:
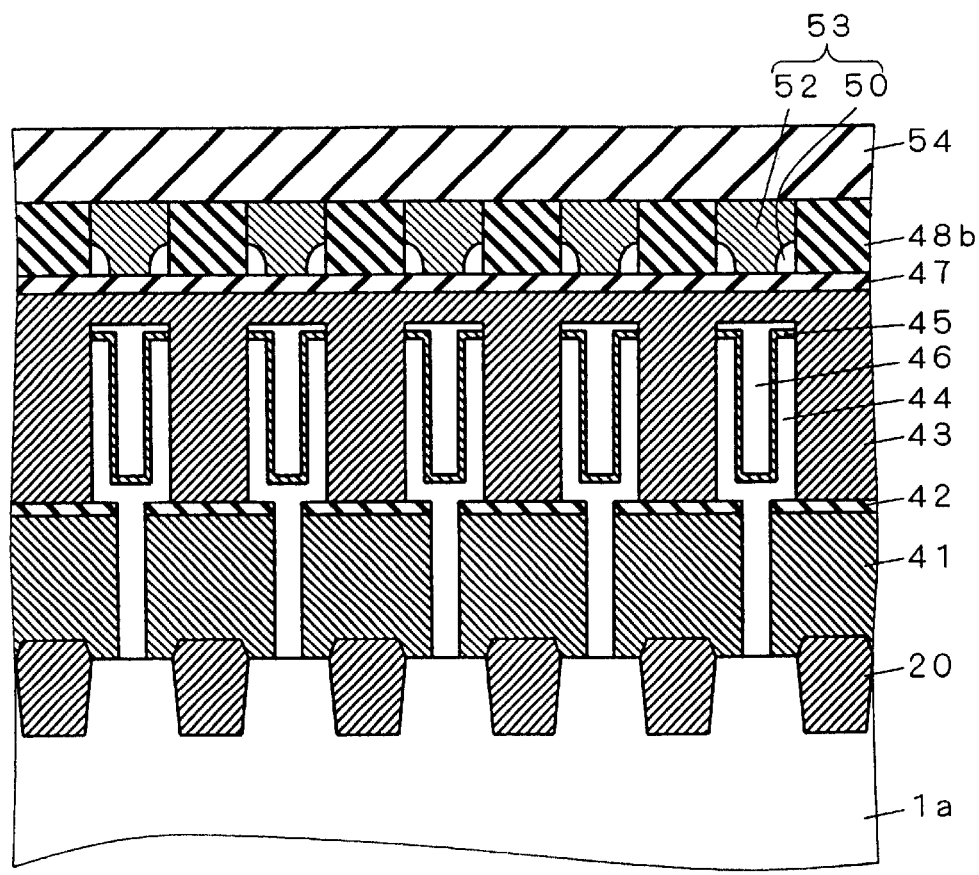
FIG. 68 is a schematic diagram showing another manufacturing step in the method of manufacturing a semiconductor device in accordance with the sixth preferred embodiment.

Further, as discussed in the second preferred embodiment, also when the tungsten 52 is deposited on the insulating film 47 and the polysilicon side walls 50 without depositing the tungsten nitride 6b as shown in FIG. 68, as the adhesive strength between the tungsten 52 and the polysilicon side wall 50 and that between the polysilicon side wall 50 and the insulating film 47 are each higher than that between the tungsten 52 and the insulating film 47, it becomes possible to significantly suppress removal of the metal wire as compared with the conventional structure.

The Seventh Preferred Embodiment

Figure 25:
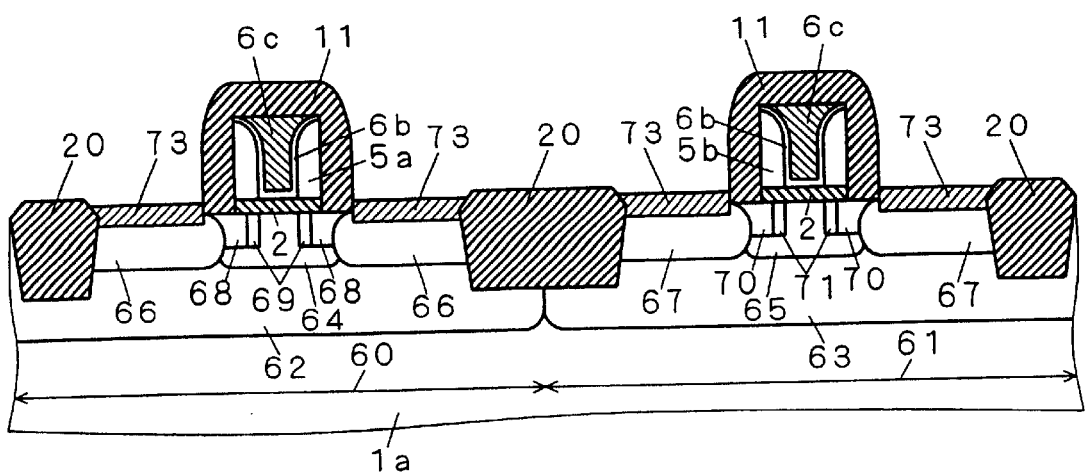
FIG. 25 is a schematic diagram showing an example of structure of a semiconductor device in accordance with a seventh preferred embodiment.

A semiconductor device of the seventh preferred embodiment comprises, as shown in FIG. 25, the semiconductor substrate 1a having the one major surface provided with the gate insulating film 2 thereon and constituent elements of the semiconductor device (MOS transistor) therein, the tungsten 6c (a first conductor) formed on the gate insulating film 2 and electrically associated with the constituent elements (working as a gate electrode), polysilicon side walls 5a and 5b formed on the gate insulating film 2, coming into contact with the side surfaces of the tungsten 6c, and the tungsten nitride 6b (adhesive member).

The polysilicon side walls 5a and 5b are lower layer portions disposed on the gate insulating film 2. The tungsten nitride 6b is a barrier layer which is disposed on the gate insulating film 2 and the tungsten nitride 6b, coming into contact with the tungsten 6c, to prevent composition material of the tungsten 6c from entering the inside of the polysilicon side walls 5a and 5b. The adhesive strength between the gate insulating film 2 and the polysilicon side walls 5a and 5b and that between the polysilicon side walls 5a and 5b and the tungsten nitride 6b are each higher than that between the tungsten 6c and the tungsten nitride 6b. With this structure, the contact area between the tungsten 6c and the tungsten nitride 6b increases by the side surfaces of the tungsten 6c, and therefore the tungsten 6c has higher adhesive strength and becomes hard to remove.

Figure 26:
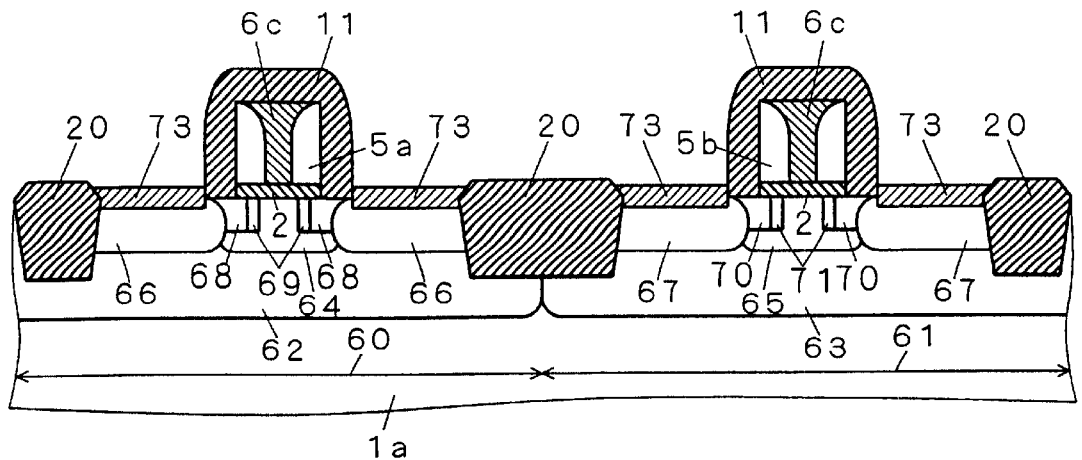
FIG. 26 is a schematic diagram showing another example of structure of a semiconductor device in accordance with the seventh preferred embodiment.

As another structure, the semiconductor device of the seventh preferred embodiment comprises, as shown in FIG. 26, the semiconductor substrate 1a having the one major surface provided with the gate insulating film 2 thereon and the constituent elements of the semiconductor device (MOS transistor) therein, the tungsten 6c (a first conductor) of inverted trapezoid formed on the gate insulating film 2 and electrically associated with the constituent elements, the polysilicon side wall 5a or 5b (adhesive member) formed on the gate insulating film 2, coming into contact with the side surfaces of and the tungsten 6c and adhering to the gate insulating film 2 and the tungsten 6c with an adhesive strength higher than that between the gate insulating film 2 and the tungsten 6c. With this structure, by the adhesive strength between the polysilicon side wall 5a or 5b and the tungsten 6c, the tungsten 6c becomes hard to remove. The adhesive member is so formed as to come into contact with an inclined side of the conductor having an inverted trapezoidal section whose lower base is shorter than upper base, and when the width of the adhesive member and the conductor is not larger than the width of the upper portion of the conductor, providing the adhesive member prevents deterioration of integration.

Further, a characteristic feature of the semiconductor device (MOS transistor) of the seventh preferred embodiment is that the polysilicon side walls 5a and 5b are different in conductivity type from the channel regions 64 and 65 of their MOS transistors, respectively. The polysilicon side walls 5a and 5b are doped with dopants of high concentration and the respective amounts of dopants are large enough to obtain the polysilicon side walls 5a and 5b which electrically work as metals. Therefore, the polysilicon side walls 5a and 5b are not depleted.

Now, referring to FIGS. 25 and 26, among the constituent elements of the MOS transistor, those which are formed in the semiconductor substrate 1a will be discussed. The gate insulating film 2, the polysilicon side walls 5a and 5b, the tungsten nitride 6b, the tungsten 6c and the side walls 11 which are formed on the semiconductor substrate 1a have been discussed in the first to sixth preferred embodiments, so discussion thereof is omitted. As an N channel MOS transistor 60 and a P channel MOS transistor 61 are formed adjacently, a P well 62 and an N well 63 are formed adjacently from the one major surface of the semiconductor substrate 1a inwardly and the STIs 20 are so formed as to surround the P well 62 and the N well 63 in the one major surface of the semiconductor substrate 1a. The P-type channel region 64 is formed in a surface of the P well 62 and the N-type channel region 65 is formed in a surface of the N well 63. Two N⁻ source/drain regions 68 are formed in the surface of the P well 62, sandwiching the channel region 64. Two P⁻ source/drain regions 70 are formed in the surface of the N well 63, sandwiching the channel region 65. N⁺ source/drain regions 66 are formed outside the N⁻ source/drain region 68 in the surface of the P well 62. P⁺ source/drain regions 67 are formed outside the P⁻ source/drain region 70 in the surface of the N well 63. A P⁻ pocket implantation layer 69 is disposed between the channel region 64 and the N⁻ source/drain region 68. An N⁻ pocket implantation layer 71 is disposed between the channel region 65 and the P⁻ source/drain region 70. In surfaces of the source/drain regions 66 and 67, silicides 73 are formed.

Figure 27:
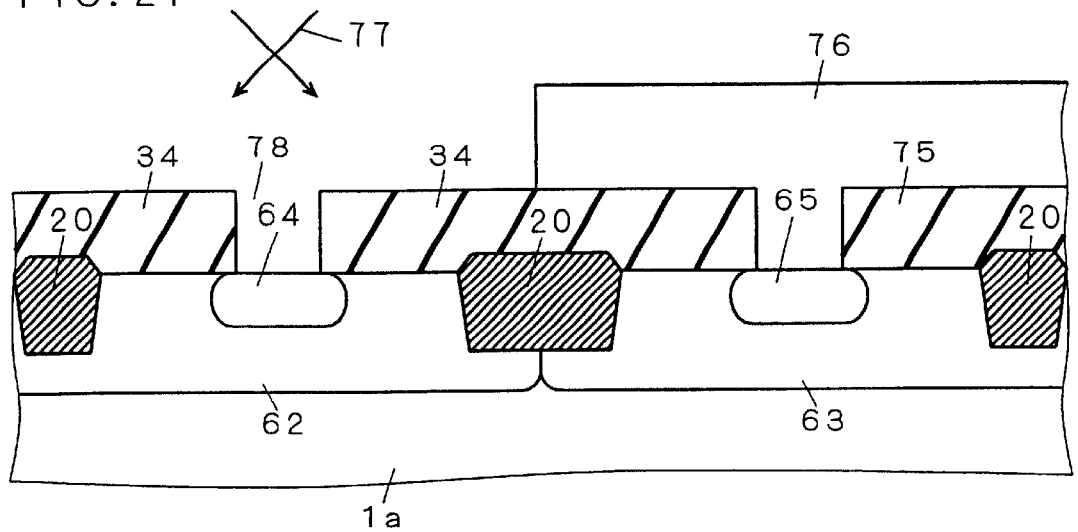
FIGS. 27 to 30 are schematic diagrams each showing a manufacturing step in a method of manufacturing a semiconductor device in accordance with the seventh preferred embodiment.

Next, a method of manufacturing a CMOS transistor of FIG. 25 will be discussed. After the STIs 20 for isolation are formed on the semiconductor substrate 1a, an NMOS transistor formation region and a PMOS transistor formation region are alternately implanted with ions while being masked with resists, to form the P well 62 and the N well 63, respectively. Subsequently, after depositing an insulating film 75, the insulating film 75 is partially removed by etching with a patterned mask, to form a trench 78. Using the etched insulating film 75 as a mask, the NMOS transistor formation region and the PMOS transistor formation region are alternately implanted with ions while being masked with resists, to form the channel regions 64 and 65. FIG. 27 shows a state where the PMOS transistor formation region is covered with a resist 76 and the bottom of the trench 78 in the NMOS transistor formation region is implanted with e.g., boron 77 at a dose of $1 \times 10^{13}/cm^2$ at an energy of 30 keV at incident angle of 15 to 30 degrees.

Next, after etching the insulating film 75, the one major surface of the semiconductor substrate 1a is sacrifice-oxidized and the sacrifice oxide film is removed. After that, the gate insulating film 2 is formed in the one major surface of the semiconductor substrate 1a. Subsequently, after depositing an insulating film constituted of two layers, i.e., the silicon oxide film 3b and the silicon nitride film, with a mask which is so patterned as to have opening portions above the channel regions 64 and 65, the insulating film is; partially removed by etching to form the trench 4. A non-doped polysilicon is deposited on the insulating film, and an anisotropic etching is performed to form polysilicon side walls 5c on the side surfaces of the trench 4. Further, depositing the tungsten nitride 6b thinly, a tungsten film is deposited on the tungsten nitride 6b. Then, planarization is performed by the CMP with the silicon oxide film 3b as a stopper, to fill the trench 4 with the polysilicon side-walls 5c, the tungsten nitride 6b and the tungsten 6c.

Figure 29:
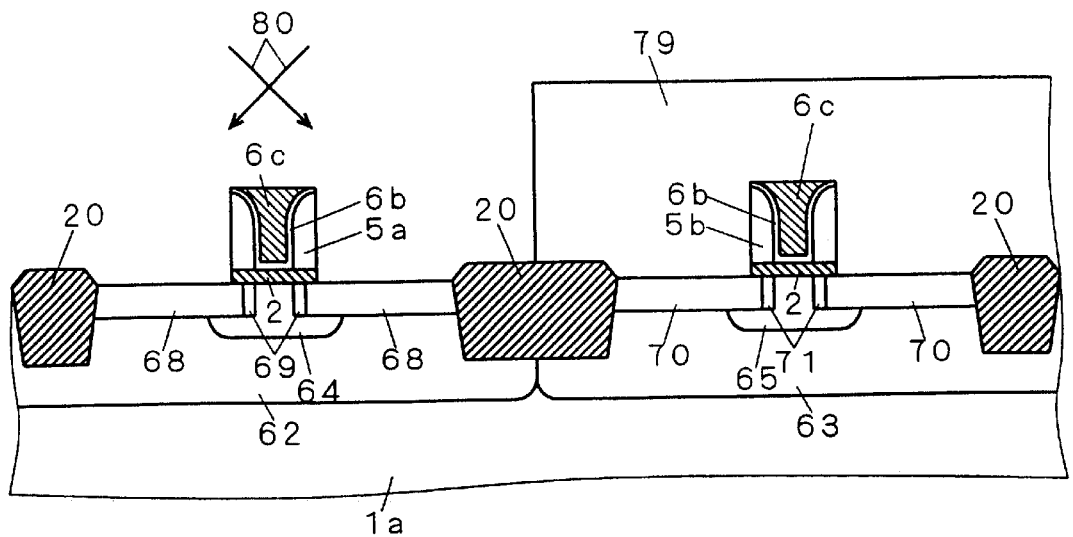

Next, the silicon oxide film 3b is removed by etching and the gate insulating film 2 is partially removed by etching with the polysilicon side walls 5c and the tungsten 6c as masks. A region for forming an NMOS transistor and a region for forming a PMOS transistor in the one major-surface of-the semiconductor substrate 1a are alternately implanted with ions while being masked with resists. FIG. 29 shows a state where the region for forming the PMOS transistor is covered with a resist 79 and implanted with arsenic ions 80 to form the N⁻ source/drain region 68. Before the step of FIG. 29, the P⁻ pocket implantation layer 69 is formed using the resist 79 in the region for forming the NMOS transistor. Similarly, the region for forming the NMOS transistor is covered with the resist 79 and the P⁻ source/drain region 70 and the N⁺ pocket implantation layer 71 are formed. The pocket implantation layers 69 and 71 are provided in order to relieve a sharp roll-off of the threshold voltage.

When the source/drain regions 68 and 70 and the pocket implantation layers 69 and 71 are formed, the polysilicon side walls 5c are implanted with dopant. To form the source/drain regions 68 and 70, ions are implanted at a dose of $1 \times 10^{15}/cm^2$. This amount of doses is hundred times higher than that for forming the pocket implantation layers 69 and 71. Therefore, the polysilicon side walls 5a and 5b are changed into an N-type doped polysilicon and a P-type doped polysilicon, respectively. The N-type and P-type doped polysilicons formed with the above amount of doses electrically work in the same manner as metal, so the polysilicon side walls 5a and 5b are not depleted.

Figure 30:
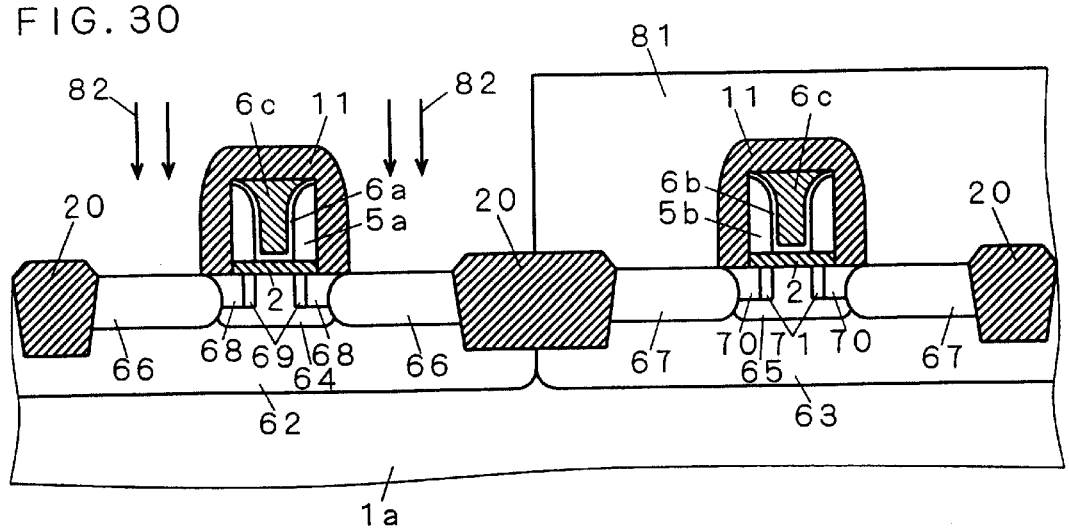

Next, depositing an insulating film entirely on the one major surface of the semiconductor substrate 1a, an anisotropic etching is performed to form the side wall spacer 11. The tungsten 6c is covered with the insulating film which forms the side wall spacer 11 in order to prevent diffusion of the tungsten into other regions resulting in formation of contaminants in reaction to ambient substances. While the PMOS transistor formation region is covered with a resist 81, arsenic ions 82 are implanted through the side wall spacer 11 to form the N+ source/drain region 66 (see FIG. 30). While the NMOS transistor formation region is covered with the resist, boron ions or boron fluoride ($BF_2$) are implanted through the side wall spacer 11 to form the P+ source/drain region 67.

In a state where the N⁺ source/drain region 66 and the P⁺ source/drain region 67 are exposed on the one major surface of the semiconductor substrate 1a, cobalt (Co) is deposited entirely on the semiconductor substrate 1a and heat-treated in high temperature, to form the cobalt silicide 73 on the N⁺ source/drain region 66 and the P⁺ source/drain region 67. When the cobalt is deposited, as the cobalt in contact with the silicon reacts while the cobalt in contact with the insulating film does not react, the cobalt silicide 73 can be formed selectively on the surface portions of the N⁺ source/drain region 66 and the P⁺ source/drain region 67. For example, the side wall spacer 11 prevents the tungsten 6c from reacting with the cobalt. The unreacted cobalt is removed by etching, to obtain a structure of FIG. 25. Since the cobalt silicide 73 has a resistance lower than the source/drain regions 68 and 69, the resistances of the source/drain regions are significantly reduced. Though a cobalt is used here as a metal to form the silicide, metals such as nickel (Ni), titanium (Ti), tantalum (Ta), chromium (Cr), molybdenum (Mo), platinum (Pt), tungsten (W) and zirconium (Zr) may be used. Instead of forming the silicide, a superconductor may be used to produce the same effect.

Further, by omitting the step of forming the tungsten nitride 6b in the above steps, a CMOS structure of FIG. 26 can be formed.

As is clear from FIG. 10, the problem that the tungsten 25 has an inverted trapezoidal section whose lower base is shorter than its upper base because of existence of the polysilicon side walls 5 and the width of an upper base of the tungsten 25 in the gate electrode disadvantageously becomes shorter as the upper portion of the tungsten 25 is reduced by dishing can be eased by reducing the height of the polysilicon side wall 5 as shown in FIGS. 66 and 67. Further, this structure has an advantage that the resistance of the gate electrode decreases by an increase of the cross-sectional area of the tungsten 6c in the whole cross-sectional area of the gate electrode.

The Eighth Preferred Embodiment

Figure 31:
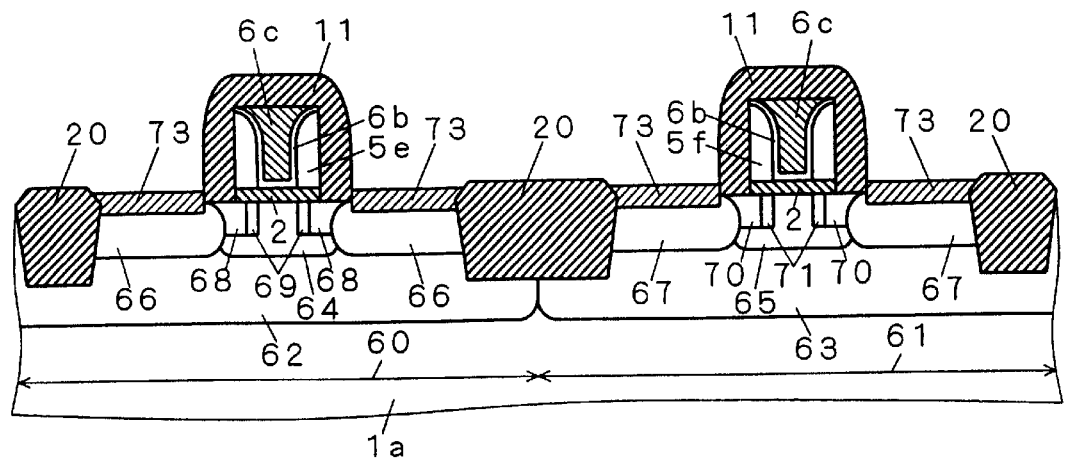
FIG. 31 is a schematic diagram showing an example of structure of a semiconductor device in accordance with the seventh preferred embodiment.

A semiconductor device (MOS transistor) of the eighth preferred embodiment is different from that of the seventh preferred embodiment in that the dopant for polysilicon side walls 5e and 5f of FIGS. 31 and 32 have the same conductivity type as the dopant for the channel regions 64 and 65, respectively. Specifically, in the N channel MOS transistor 60, both the polysilicon side wall 5e and the channel region 64 have a conductivity of P type, and in the P channel MOS transistor 61, both the polysilicon side wall 5f and the channel region 65 have a conductivity of N type. Moreover, the polysilicon side walls 5e and 5f are doped with dopants of high concentration, and the amount of dopants is large enough to obtain the polysilicon sidewalls 5e and 5f which electrically work in the same manner as metal. By doping the polysilicon side walls 5e and 5f with the dopants as above, the roll-off of the threshold voltage is relieved.

The reason why the roll-off of the threshold voltage is relieved will be discussed referring to FIGS. 33A–33D to 44. FIGS. 33A to 33D are conceptual diagrams each showing a sectional structure of a MOS capacitor. FIG. 33A shows a structure where a gate insulating film 95 is formed between an N⁺ doped polysilicon 91 and an N-type silicon substrate 93. FIG. 33B shows a structure where the gate insulating film 95 is formed between a P⁺ doped polysilicon 92 and the N-type silicon substrate 93. FIG. 33C shows a structure where the gate insulating film 95 is formed between the N⁺ doped polysilicon 91 and a P-type silicon substrate 94. FIG. 33D shows a structure where the gate insulating film 95 is formed between the P⁺ doped polysilicon 92 and the P-type silicon substrate 94. Since there are gate electrodes and the silicon substrates both of two conductivity types, i.e., N and P, the above four combinations are possible. The N⁺ doped polysilicon 91 and the P⁺ doped polysilicon 92 are doped with dopants at concentration of $10^{20}/cm^3$ or more, and therefore these polysilicons electrically work in the same manner as metal. The reason for this will be discussed referring to FIGS. 34A to 34D.

FIGS. 34A to 34D are energy band diagrams each showing an ideal band structure of an N-type semiconductor and a P-type semiconductor. In these figures, reference signs $E_c$, $E_i$, $E_F$, $E_v$ and $E_g$ represent an energy level at a lower end of a conduction band, an intrinsic Fermi level, a Fermi level, an energy level at an upper end of a valence band and a bandgap energy, respectively. The bandgap energy $E_g$ of a silicon is about 1.1 eV. Further, $\psi_B$ represents a potential indicating a difference between the Fermi level and the intrinsic Fermi level. The intrinsic Fermi level is positioned at the center of the bandgap. The Fermi level refers to an energy for existence of an electron with a probability of 50 percent. Therefore, when the Fermi level is positioned below the conduction band, the electrons becomes more sparse as goes upper in a region between the conduction band and the Fermi level.

When an N-type dopant is introduced into a semiconductor substrate, the Fermi level becomes higher than the intrinsic Fermi level as shown in FIG. 34A. As the concentration of the dopant is made higher, the Fermi level goes closer to the conduction band. This means that the resistance of the N-type semiconductor to the electron becomes lower. When the concentration is in a range from $10^{20}$ to $10^{21}/cm^3$ or more, the Fermi level coincides with the lower end of the conduction level, as shown in FIG. 34B. This state is called "degeneration". A band structure of the degenerated semiconductor becomes the same as that of metal. In other words, the electrons move as free electrons.

On the other hand, when a P-type dopant is introduced into the semiconductor substrate, the Fermi level becomes lower than the-intrinsic Fermi level as shown in FIG. 34C. As the concentration of the dopant is made higher, the Fermi level goes closer to the valence band. This means that the resistance of the P-type semiconductor to a positive hole becomes lower. When the concentration is in a range from $10^{20}$ to $10^{21}/cm^3$ or more, the Fermi level coincides with the upper end of the valence band, as shown in FIG. 34D. This state is also called "degeneration". The band structure of the degenerated semiconductor becomes the same as that of metal. In other words, the positive hole moves as a free hole.

Figure 35A:
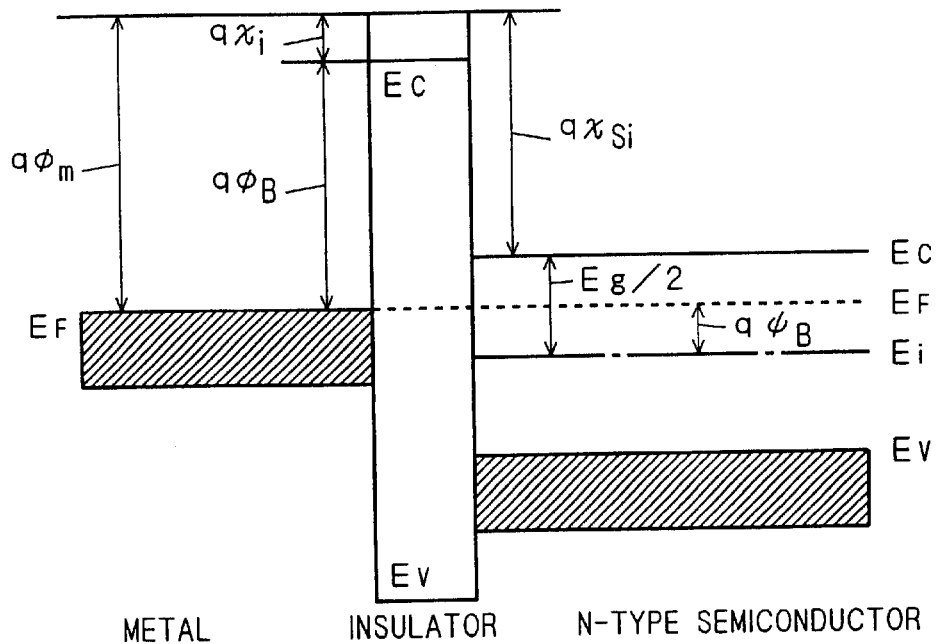
FIGS. 35A and 35B are diagrams each showing a band structure of a MOS structure.
Figure 35B:
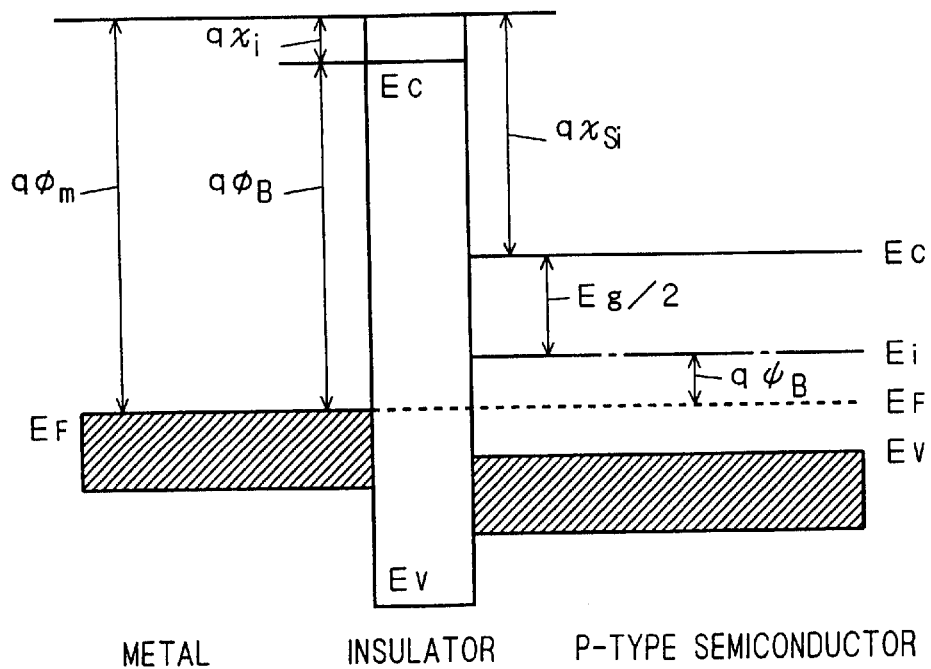

Next, a band structure of an ideal MIS (Metal Insulator Semiconductor) structure will be discussed. FIGS. 35A and 35B show band structures of MIS structures formed on the N-type semiconductor and the P-type semiconductor, respectively, when no potential is applied to a metal. These structures are different from each other in that the Fermi level exists over the intrinsic Fermi level in the N-type semiconductor while the Fermi level exists below the intrinsic Fermi level in the P-type semiconductor. In these figures, reference signs $\phi_m$, $\chi_{Si}$, $\chi_i$, $E_g$, $\phi_B$ and $\psi_B$ represent a metal work function, a semiconductor electron affinity, an insulator electron affinity, a bandgap energy, a potential difference between a metal and an insulator and a potential difference between the Fermi level $E_F$ and the intrinsic Fermi level $E_i$, respectively.

A work function difference $\phi_{ms}$ between a metal and a semiconductor is expressed by Eq. 1:

$$\phi_{ms} \equiv \phi_m - \left(\chi_{Si} + \frac{E_g}{2q} - |\varphi_B|\right) \tag{1}$$

A work function difference $\phi_{ms}$ between the metal and the P-type semiconductor is expressed by Eq. 2:

$$\phi_{ms} \equiv \phi_m^- - \left(\chi_{Si} + \frac{E_g}{2q} - |\varphi_B|\right) \tag{2}$$

When an applied voltage is 0, the work function difference $\phi_{ms}=0$.

Figure 36:
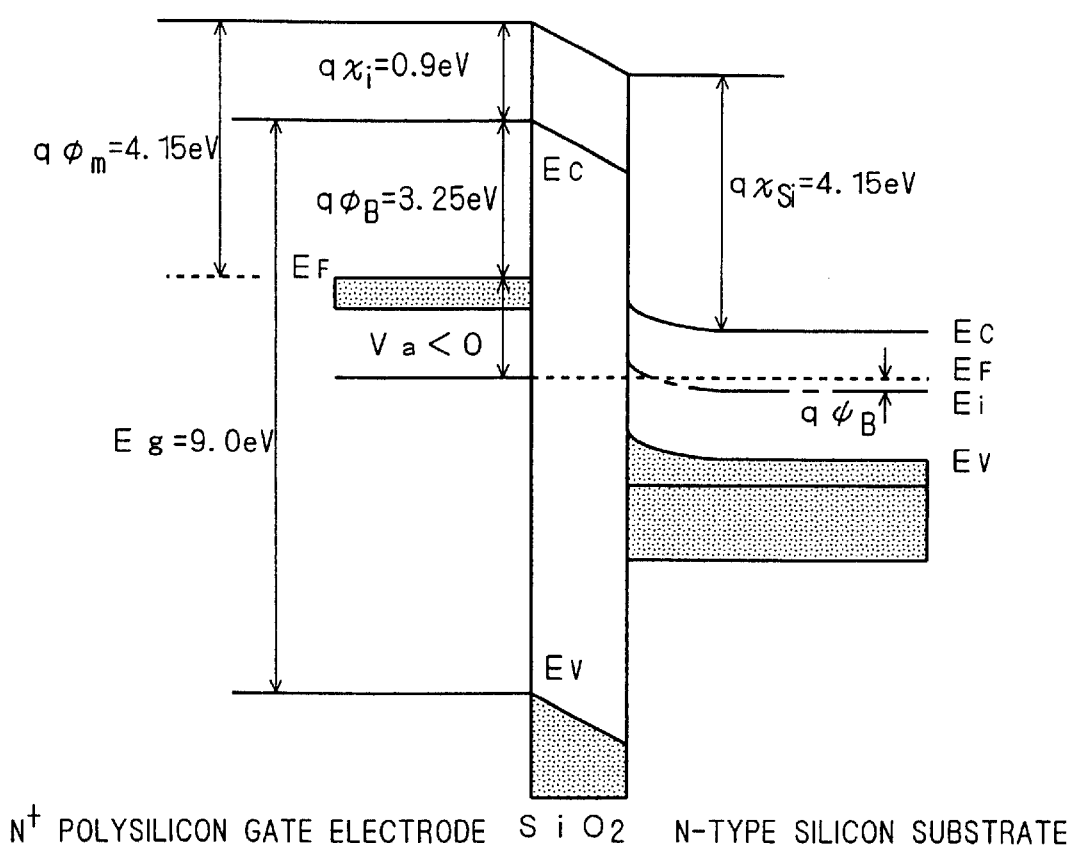
FIG. 36 is a band diagram showing a MOS structure having an $N^+$ polysilicon gate electrode formed on an N-type semiconductor substrate.

FIGS. 36 to 39 are energy-band diagrams showing band structures of the respective MOS structures of FIGS. 33A to 33D when surfaces of the semiconductors are inverted. FIG. 36 is a band diagram showing a structure where an N$^+$ polysilicon gate electrode is formed on an: N-type semiconductor through a gate oxide film. To invert the surface of the N-type semiconductor, a negative voltage $V_a$ ($V_a<0$) is applied thereto. The N$^+$ polysilicon gate electrode of this figure is degenerated, and work on electrons in the same manner as metal. Since the Fermi level of the polysilicon coincides with the bottom of the conduction band, the work function $\phi_m$ is equivalent to the electron affinity $\chi_{Si}$. As $\chi_{Si}$ is 4.15 V, $\phi_m$ is 4.15 V. On the other hand, since the electron affinity $\chi_i$ of a silicon oxide film is 0.9 V, the potential difference $\phi_B$ between the N$^+$ polysilicon and the silicon oxide film is 3.25 V. The work function difference $\phi_{ms}^{NN}$ between the N$^+$ polysilicon and the N-type silicon oxide film is obtained as Eq. 3 by calculation using Eq. 1:

$$\phi_{ms}^N \equiv \phi_m - \left(\chi_{Si} + \frac{E_g}{2q} - |\varphi_B|\right) \tag{3}$$
$$= 4.15 - (4.15 + 0.55 - |\varphi_B|)$$
$$= -0.55 + |\varphi_B|$$

In Eq. 3, reference sign $\psi_B$ represents a potential difference between the intrinsic Fermi level and the Fermi level, expressed as Eq. 4:

$$\varphi_B = \frac{kT}{q}\ln\left(\frac{N_D}{n_i}\right) \tag{4}$$

where reference signs $N_D$ and $n_i$ represent a concentration of donor in the semiconductor substrate and a concentration of intrinsic electrons, respectively.

Figure 37:
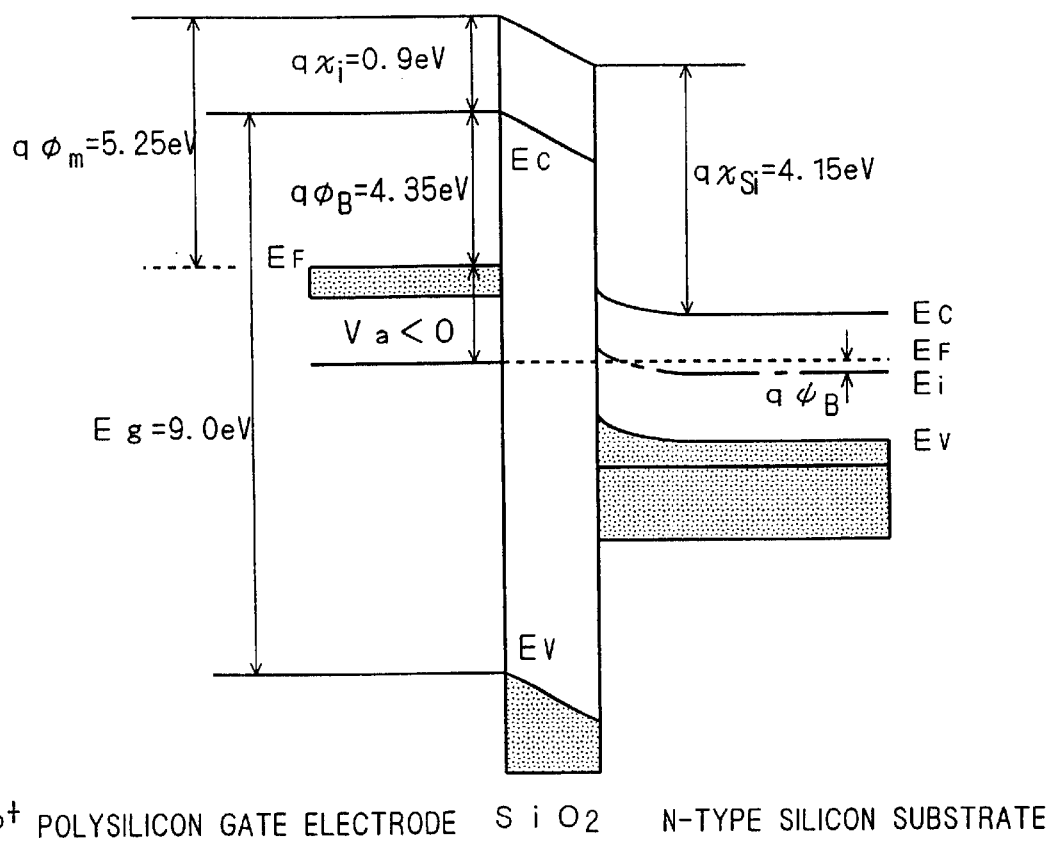
FIG. 37 is a band diagram showing a MOS structure having a $P^+$ polysilicon gate electrode formed on the N-type semiconductor substrate.

FIG. 37 is a band diagram showing a structure where a P$^+$ polysilicon gate electrode is formed on the N-type semiconductor through the gate oxide film. To invert the surface of the N-type semiconductor, the negative voltage $V_a$ ($V_a<0$) is applied thereto. The P$^+$ polysilicon gate electrode of this figure is degenerated, and work on a positive hole in the same manner as metal. Since the Fermi level of the polysilicon coincides with the upper end of the valence band, the work function $\phi_m$ is equivalent to the sum of the electron affinity $\chi_{Si}$ and the bandgap potential. As $\chi_{Si}$ is 4.15 V and the bandgap energy of a silicon is 1.1 eV, $\phi_m$ is 5.25 V. On the other hand, since the electron affinity $\chi_i$ of the silicon oxide film is 0.9 V, the potential difference $\phi_B$ between the P$^+$ polysilicon and the silicon oxide film is 4.35 V. The work function difference $\phi_{ms}^{PN}$ between the P$^+$ polysilicon and the N-type silicon layer is obtained as Eq. 5 by calculation using Eq. 1, where $\psi_B$ is given by Eq. 4:

$$\phi_{ms}^{PN} \equiv \phi_m - \left(\chi_{Si} + \frac{E_g}{2q} - |\varphi_B|\right) \tag{5}$$
$$= 5.25 - (4.15 + 0.55 - |\varphi_B|)$$
$$= 0.55 + |\varphi_B|$$

Figure 38:
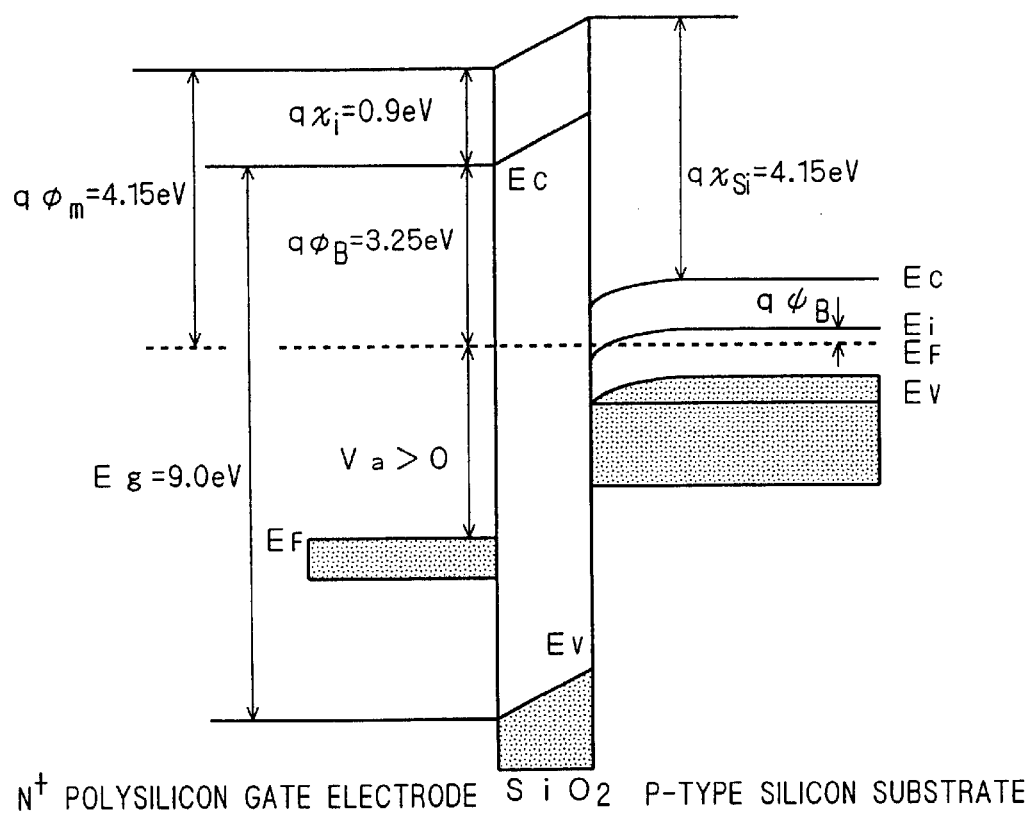
FIG. 38 is a band diagram showing a MOS structure having the $N^+$ polysilicon gate electrode formed on a P-type semiconductor substrate.

FIG. 38 is a band diagram showing a structure where the N$^+$ polysilicon gate electrode is formed on the P-type semiconductor through the gate oxide film. To invert the surface of the P-type semiconductor, a positive voltage $V_a$ ($V_a>0$) is applied thereto. The N$^+$ polysilicon gate electrode of this figure is degenerated, and work on electrons in the same manner as metal. Since the Fermi level of the polysilicon coincides with the bottom of the conduction band, the work function $\phi_m$ is equivalent to the electron affinity $\chi_{Si}$. As $\chi_{Si}$ is 4.15 V, $\phi_m$ is 4.15 V. On the other hand, since the electron affinity $\chi_i$ of the silicon oxide film is 0.9 V, the potential difference $\phi_B$ between the N$^+$ polysilicon and the silicon oxide film is 3.25 V. The work function difference $\phi_{ms}^{NP}$ between the N$^+$ polysilicon and the P-type silicon layer is obtained as Eq. 6 by calculation using Eq. 2:

$$\phi_{ms}^{NP} \equiv \phi_m - \left(\chi_{Si} + \frac{E_g}{2q} - |\varphi_B|\right) \quad (6)$$
$$= 4.15 - (4.15 + 0.55 + |\varphi_B|)$$
$$= -0.55 - |\varphi_B|$$

In Eq. 6, reference sign $\psi_B$ represents a potential difference between the intrinsic Fermi level and the Fermi level, expressed as Eq. 7:

$$\varphi_B = -\frac{kT}{q}\ln\left(\frac{N_A}{n_i}\right) \quad (7)$$

where reference signs $N_A$ and $n_i$ represent a concentration of donor in the semiconductor substrate and a concentration of intrinsic electrons, respectively.

Figure 39:
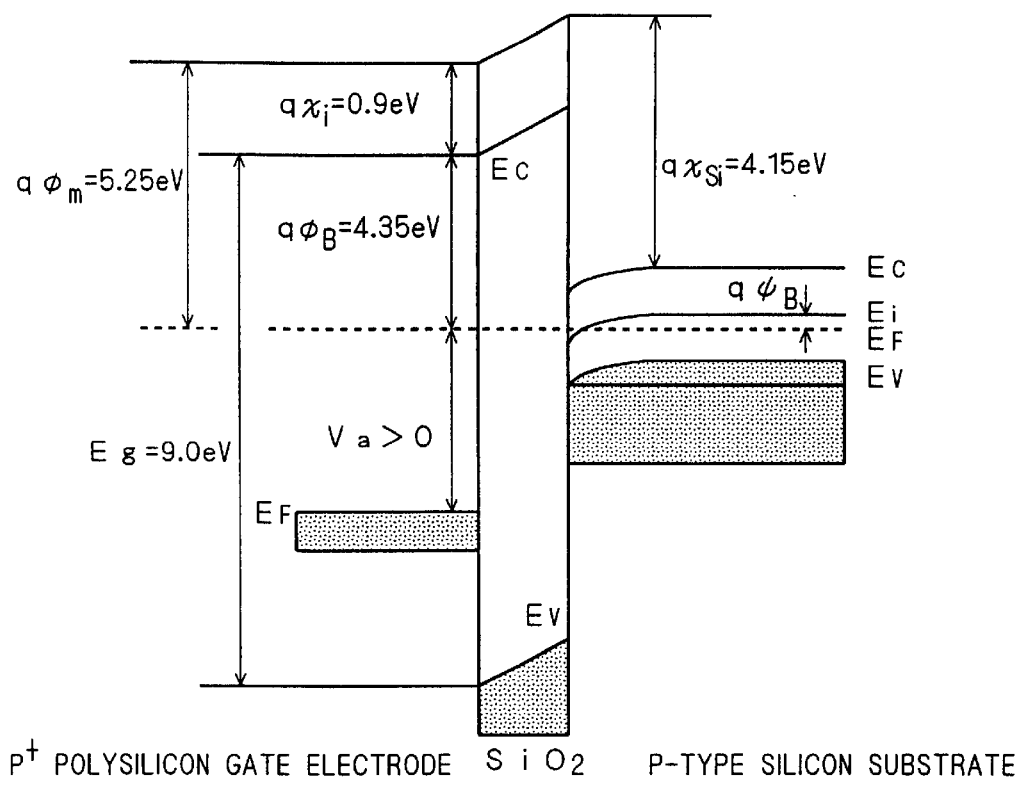
FIG. 39 is a band diagram showing a MOS structure having the $P^+$ polysilicon gate electrode formed on the P-type semiconductor substrate.

FIG. 39 is a band diagram showing a structure where the P$^+$ polysilicon gate electrode is formed on the P-type semiconductor through the gate oxide film. To invert the surface of the P-type semiconductor, the positive voltage $V_a$ ($V_a$>0) is applied thereto. The P$^+$ polysilicon gate electrode of this figure is degenerated, and work on a positive hole in the same manner as metal. Since the Fermi level of the polysilicon coincides with the upper end of the valence band, the work function $\phi_m$ is equivalent to the sum of the electron affinity $\chi_{Si}$ and the bandgap potential. As $\chi_{Si}$ is 4.15 V and the bandgap energy of the silicon is 1.1 eV, $\phi_m$ is 5.25 V. On the other hand, since the electron affinity $\chi_i$ of the silicon oxide film is 0.9 V, the potential difference $\phi_B$ between the P$^+$ polysilicon and the silicon oxide film is 4.35 V. The work function difference $\phi_{ms}^{PP}$ between the P$^+$ polysilicon and the P-type silicon oxide film is obtained as Eq. 8 by calculation using Eq. 2, where $\psi_B$ is given by Eq. 7:

$$\phi_{ms}^{PP} \equiv \phi_m - \left(\chi_{Si} + \frac{E_g}{2q} + |\varphi_B|\right) \quad (8)$$
$$= 5.25 - (4.15 + 0.55 + |\varphi_B|)$$
$$= 0.55 - |\varphi_B|$$

where reference sign $\psi_B$ represents a potential difference between the intrinsic Fermi level and the Fermi level.

Figure 40:
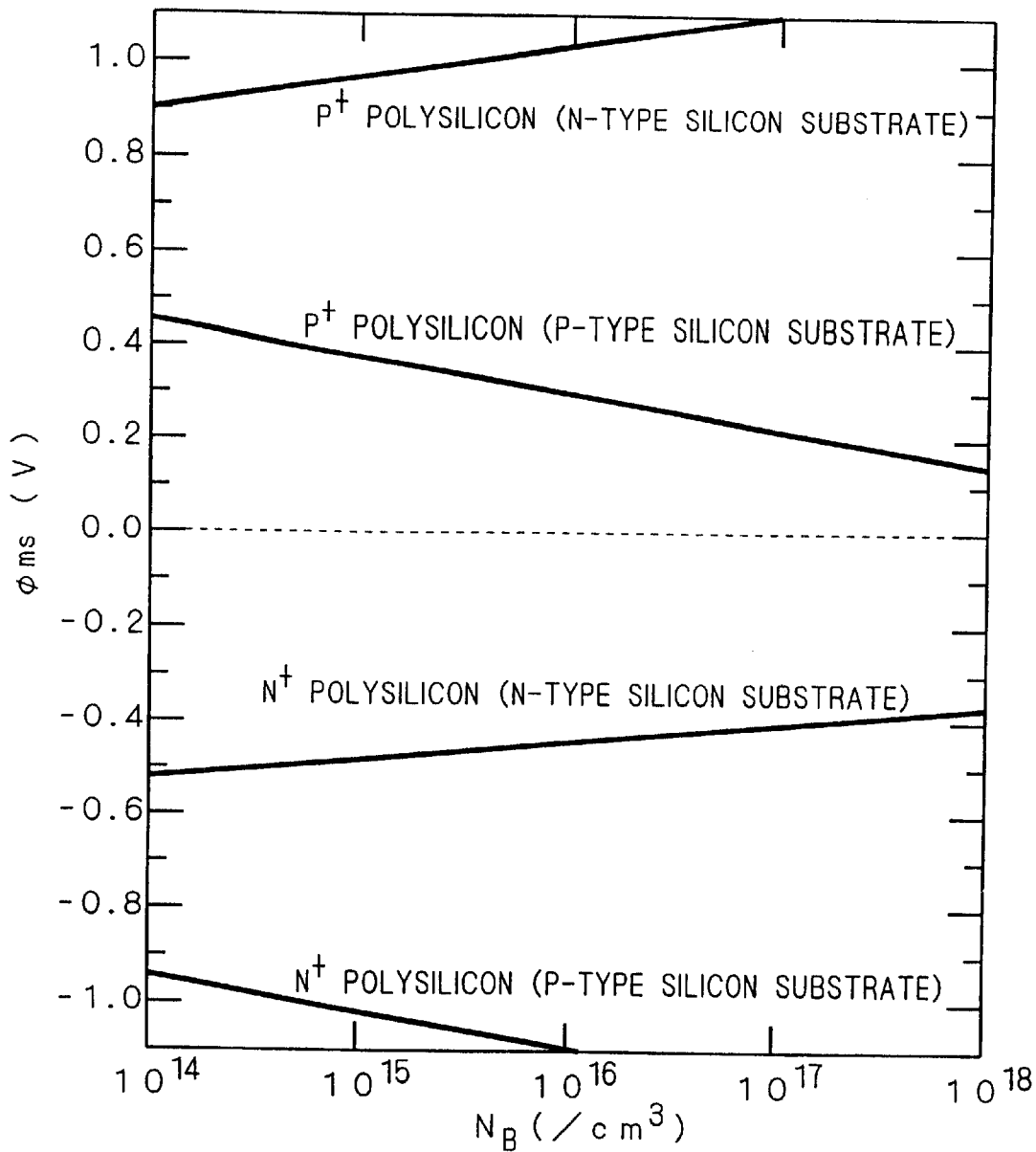
FIG. 40 is a graph showing a relation between a work function difference between a gate electrode and a semiconductor and a dopant concentration of the semiconductor.

FIG. 40 is a graph on which measured values of the work function difference in the respective MOS structures are plotted as a function of a dopant concentration $N_B$ in the semiconductor substrate, showing a qualitative result of the above equations.

Next, threshold voltages in the respective MIS structures of FIGS. 33A to 33D are calculated. A threshold voltage $V_{TH}$ of the N-type MOSFET is given by Eq. 9:

$$V_{TH} = V_{FB} + |2\varphi_B| + \frac{\sqrt{2\varepsilon_{Si}qN_A(|2\varphi_B| + |V_{BS}|)}}{C_{OX}} \quad (9)$$
$$= \left(\phi_{ms} - \frac{Q_f}{C_{OX}}\right) + |2\varphi_B| + \frac{\sqrt{2\varepsilon_{Si}qN_A(|2\varphi_B| + |V_{BS}|)}}{C_{OX}}$$

where reference signs $V_{FB}$, $Q_f$, $C_{ox}$ and $\in_{Si}$ represent a flat-band voltage, fixed charges in the gate insulating film, capacitance of the gate insulating film and permittivity of the silicon, respectively. Threshold voltages $V_{TH}^{PP}$ and $V_{TH}^{NP}$ of enhancement type NMOSFETs using the P-type polysilicon gate electrode and the N-type polysilicon gate electrode respectively, are expressed as Eqs. 10 and 11:

$$V_{TH}^{PP} = \left(\phi_{ms}^{PP} - \frac{Q_f}{C_{OX}}\right) + |2\varphi_B| + \frac{\sqrt{2\varepsilon_{Si}qN_A(|2\varphi_B| + |V_{BS}|)}}{C_{OX}} \quad (10)$$
$$= \left(0.55 - \frac{kT}{q}\ln\left(\frac{N_A}{n_i}\right) - \frac{Q_f}{C_{OX}}\right) + |2\varphi_B| +$$
$$\frac{\sqrt{2\varepsilon_{Si}qN_A(|2\varphi_B| + |V_{BS}|)}}{C_{OX}}$$

$$V_{TH}^{NP} = \left(\phi_{ms}^{NP} - \frac{Q_f}{C_{OX}}\right) + |2\varphi_B| + \frac{\sqrt{2\varepsilon_{Si}qN_A(|2\varphi_B| + |V_{BS}|)}}{C_{OX}} \quad (11)$$
$$= \left(-0.55 - \frac{kT}{q}\ln\left(\frac{N_A}{n_i}\right) - \frac{Q_f}{C_{OX}}\right) + |2\varphi_B| +$$
$$\frac{\sqrt{2\varepsilon_{Si}qN_A(|2\varphi_B| + |V_{BS}|)}}{C_{OX}}$$

It is clear from Eqs. 10 and 11 that $0 < V_{TH}^{NP} < V_{TH}^{PP}$. On the other hand, a threshold voltage $V_{TH}$ of an enhancement type PMOSFET is expressed as Eq. 12:

$$V_{TH} = V_{FB} + |2\varphi_B| - \frac{\sqrt{2\varepsilon_{Si}qN_D(|2\varphi_B| + |V_{BS}|)}}{C_{OX}} \quad (12)$$
$$= \left(\phi_{ms} - \frac{Q_f}{C_{OX}}\right) + |2\varphi_B| - \frac{\sqrt{2\varepsilon_{Si}qN_D(|2\varphi_B| + |V_{BS}|)}}{C_{OX}}$$

Threshold voltages $V_{TH}^{PN}$ and $V_{TH}^{NN}$ of NMOSFETs using the P-type polysilicon gate electrode and the N-type polysilicon gate electrode, respectively, are expressed as Eqs. 13 and 14:

$$V_{TH}^{PN} = \left(\phi_{ms}^{PN} - \frac{Q_f}{C_{OX}}\right) + |2\varphi_B| + \frac{\sqrt{2\varepsilon_{Si}qN_D(|2\varphi_B| + |V_{BS}|)}}{C_{OX}} \quad (13)$$
$$= \left(0.55 + \frac{kT}{q}\ln\left(\frac{N_D}{n_i}\right) - \frac{Q_f}{C_{OX}}\right) + |2\varphi_B| -$$
$$\frac{\sqrt{2\varepsilon_{Si}qN_D(|2\varphi_B| + |V_{BS}|)}}{C_{OX}}$$

$$V_{TH}^{NN} = \left(\phi_{ms}^{NN} - \frac{Q_f}{C_{OX}}\right) + |2\varphi_B| - \frac{\sqrt{2\varepsilon_{Si}qN_D(|2\varphi_B| + |V_{BS}|)}}{C_{OX}} \quad (14)$$
$$= \left(-0.55 + \frac{kT}{q}\ln\left(\frac{N_D}{n_i}\right) - \frac{Q_f}{C_{OX}}\right) + |2\varphi_B| -$$
$$\frac{\sqrt{2\varepsilon_{Si}qN_D(|2\varphi_B| + |V_{BS}|)}}{C_{OX}}$$

It is clear from Eqs. 12 and 13 that $V_{TH}^{NN} < V_{TH}^{PN} < 0$.

Figure 41:
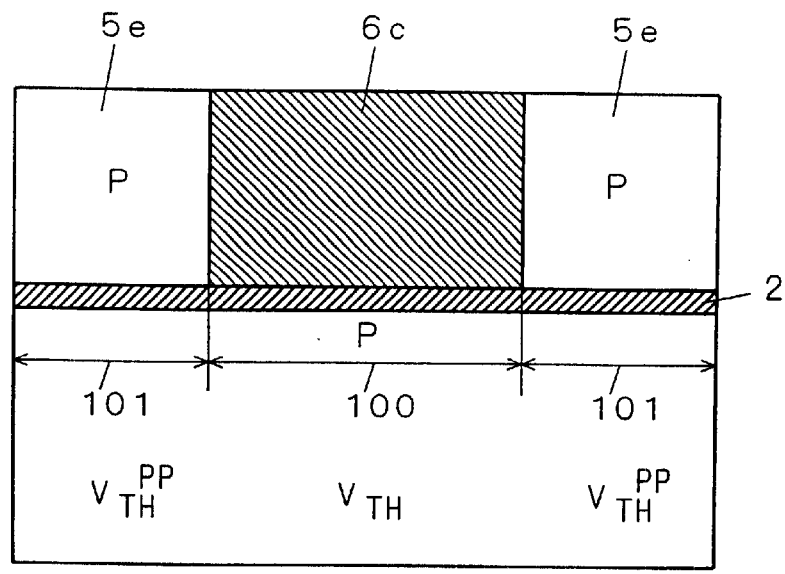
FIGS. 41 to 44 are schematic diagrams each showing a gate electrode portion of a semiconductor device in accordance with an eighth preferred embodiment.
Figure 42:
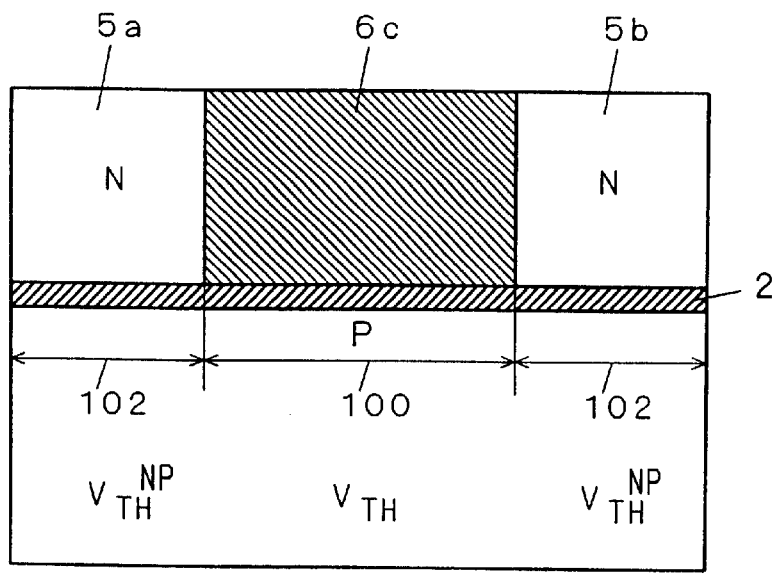

FIGS. 41 and 42 are enlarged schematic diagrams showing structures in the vicinity of the gates of the NMOSFETs of FIGS. 32 and 26, respectively. The channel can be divided into three regions. Specifically, FIG. 41 shows a case where polysilicon of side walls is of P type and FIG. 42 shows a case where polysilicon of side walls is of N type. FIGS. 41 and 42 correspond to the gate electrodes of FIGS. 32 and 26, respectively. It is assumed that a threshold voltage of a P-type channel region 100 is $V_{TH}$. From the above discussion, a threshold voltage of a P-type channel region 101 is $V_{TH}^{PP}$ and a threshold voltage of a P-type channel region 102 is $V_{TH}^{NP}$. Since $0 < V_{TH}^{NN} < V_{TH}^{PP}$, a threshold voltage of the NMOSFET of FIG. 41 is higher than that of FIG. 42. This is because the work function difference between the P-type silicon substrate and the P-type polysilicon is larger than that between the P-type silicon substrate and the N-type polysilicon. Therefore, since the ratio of depletion layer charges in the channel region shared by the source/drain region becomes smaller in the structure of FIG. 41 than that in FIG. 42 and consequently the depletion layer charges controlled by the gate electrode becomes larger, the roll-off of the threshold voltage is relieved.

Figure 43:
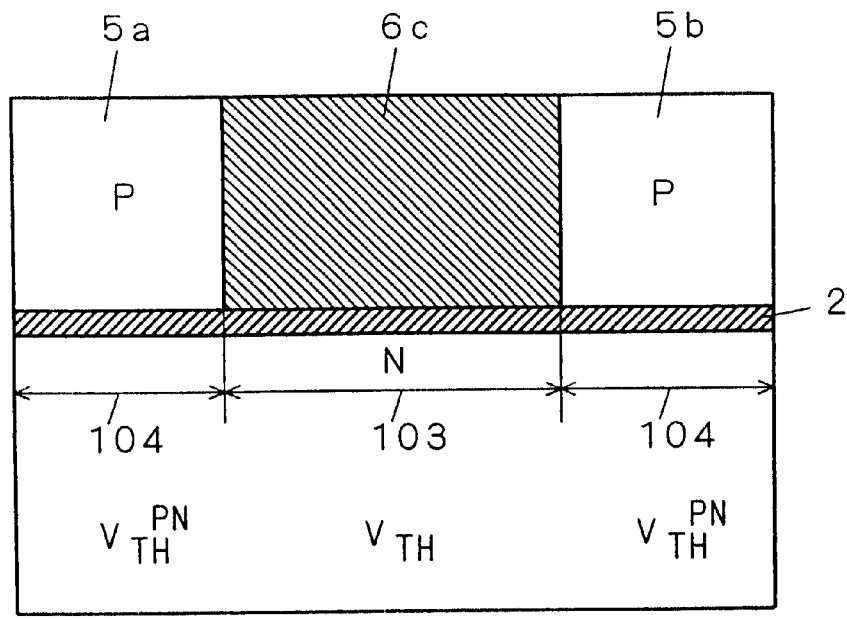
Figure 44:
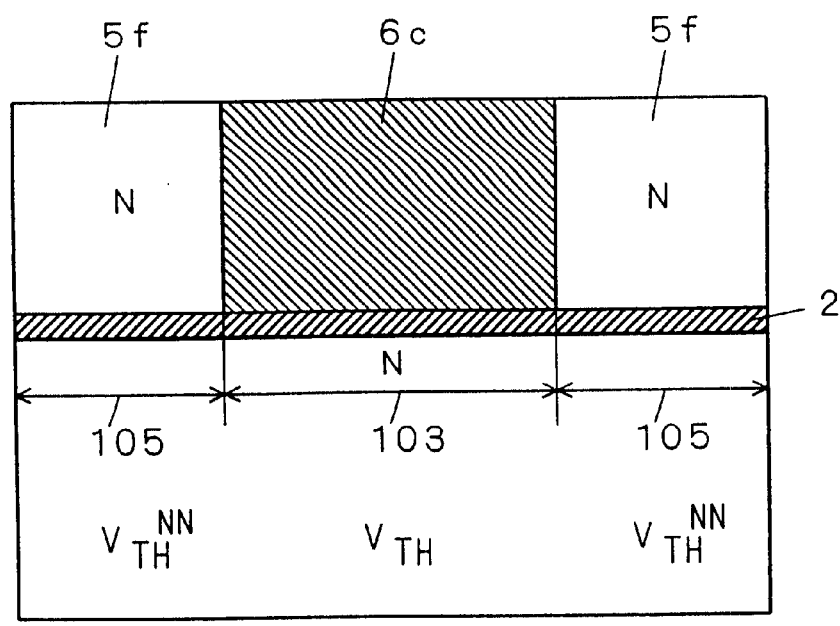

FIGS. 43 and 44 are enlarged schematic diagrams showing structures in the vicinity of the gates of the PMOSFETs of FIGS. 26 and 32, respectively. The channel can be divided into three regions. Specifically, FIG. 43 shows a case where polysilicon of side walls is of P type and FIG. 44 shows a case where polysilicon of side walls is of N type. FIGS. 43 and 44 correspond to the gate electrodes of FIGS. 26 and 32, respectively. It is assumed that a threshold voltage of an N-type channel region 103 is $V_{TH}$. From the above discussion, a threshold voltage of an N-type channel region 104 is $V_{TH}^{PN}$ and a threshold voltage of an N-type channel region 105 is $V_{TH}^{NN}$. Since $V_{TH}^{NN} < V_{TH}^{PN} < 0$, the absolute value of a threshold voltage of the PMOSFET of FIG. 44 is higher than that of FIG. 43. This is because the work function difference between the N-type silicon substrate and the N-type polysilicon is larger than that between the N-type silicon substrate and the P-type polysilicon. Therefore, since the ratio of depletion layer charges in the channel region shared by the source/drain region becomes smaller in the structure of FIG. 44 than that in FIG. 43 and consequently the depletion layer charges controlled by the gate electrode becomes larger, the roll-off of the threshold voltage is relieved.

For the above reason, since the polysilicon of the side walls is doped with a dopant of high concentration having the same conductivity type as the channel region of the MOSFET, the roll-off of the threshold voltage is relieved.

There are four possible combinations of the conductivity type of the dopant for the polysilicon of the side walls and that for the channel region. These combinations and their respective effects are shown in Table 1:

TABLE 1

| | NMOSFET Type of Dopant for Side Wall | Effect | PMOSFET Type of Dopant for Side Wall | Effect |
|---|---|---|---|---|
| ① | N+ | Increase of Drain Current | N+ | Relief of Roll-Off of Threshold Voltage |
| ② | N+ | Increase of Drain Current | P+ | Increase of Drain Current |
| ③ | P+ | Relief of Roll-Off of Threshold Voltage | N+ | Relief of Roll-Off of Threshold Voltage |
| ④ | P+ | Relief of Roll-Off of Threshold Voltage | P+ | Increase of Drain Current |

When the polysilicon of the side walls is doped with a dopant of high concentration having a conductivity different from that of the channel region, since the work function differences becomes smaller in the NMOSFET and becomes larger in the PMOSFET as can be seen from FIG. 23, the absolute values of the threshold voltages of both MOSFETs decrease. As a result, a drain current $I_D$ becomes larger as shown in Eq. 15 with respect to a linear region and as shown in Eq. 16 with respect to a saturation region.

$$I_D = \frac{W}{L}\mu C_{OX}\left[|V_{GS} - V_{TH}||V_{DS}| - \frac{1}{2}V_{DS}^2\right] \quad (15)$$

$$I_D = \frac{1}{2}\frac{W}{L}\mu C_{OX}(V_{GS} - V_{TH})^2 \quad (16)$$

All the four structures of Table 1 are feasible. In a case of the structure ① of Table 1, in order to obtain both side walls of N+ in the CMOS, it is only necessary to deposit an N+-doped polysilicon in the step of depositing a polysilicon. In a case of the structure ④, it is only necessary to deposit a P+-doped polysilicon. In cases of the structures ② and ③, as discussed above, the side walls are formed of non-doped polysilicon and then the polysilicon of the side walls is ion-implanted with a dopant in accordance with the conductivity type of the transistor.

Further, when the side walls of depleted polysilicon are formed in a direction of the gate width, since an electric field at an isolation end with which the gate electrode is in contact is relieved, the roll-off of the threshold voltage is relieved by an inverse-narrow channel effect.

The Ninth Preferred Embodiment

Figure 45:
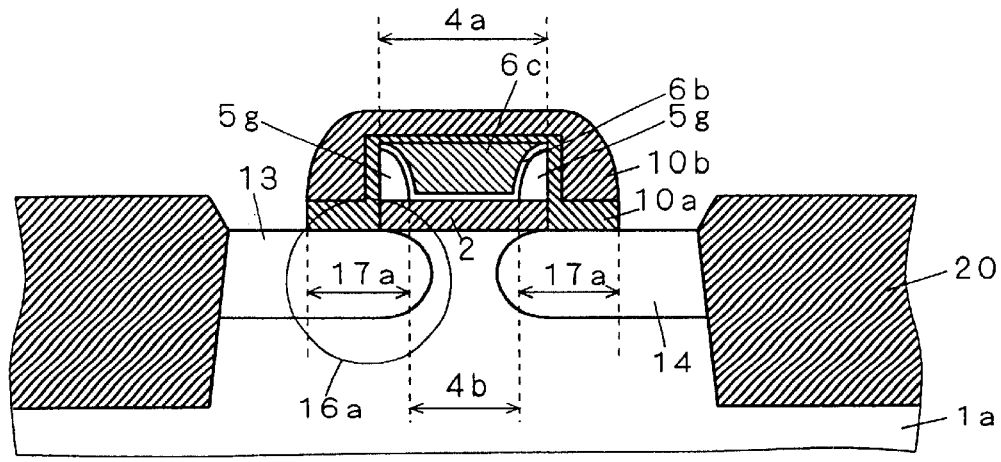
FIGS. 45 to 54 are schematic diagrams each showing a manufacturing step in a method of manufacturing a semiconductor device in accordance with a ninth preferred embodiment.
Figure 63:
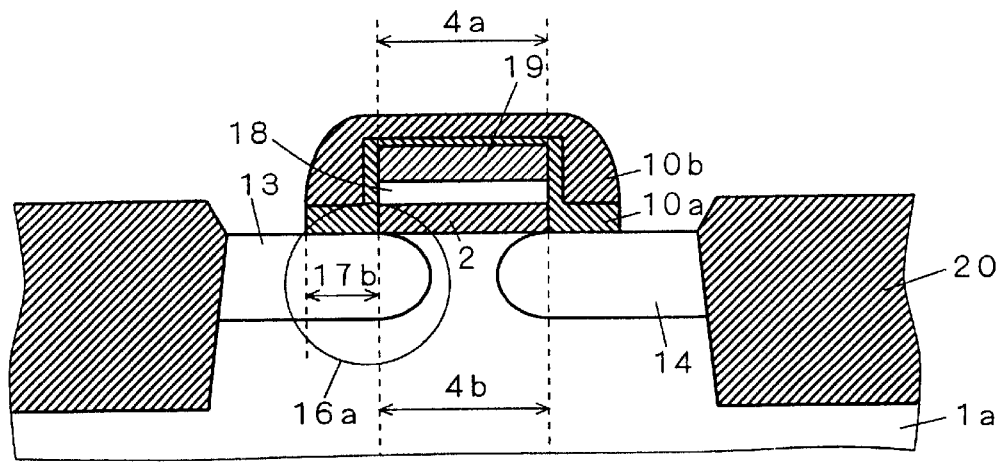
FIGS. 63 to 65 are schematic diagrams showing another example of structure of a semiconductor device in the background art.
Figure 64:
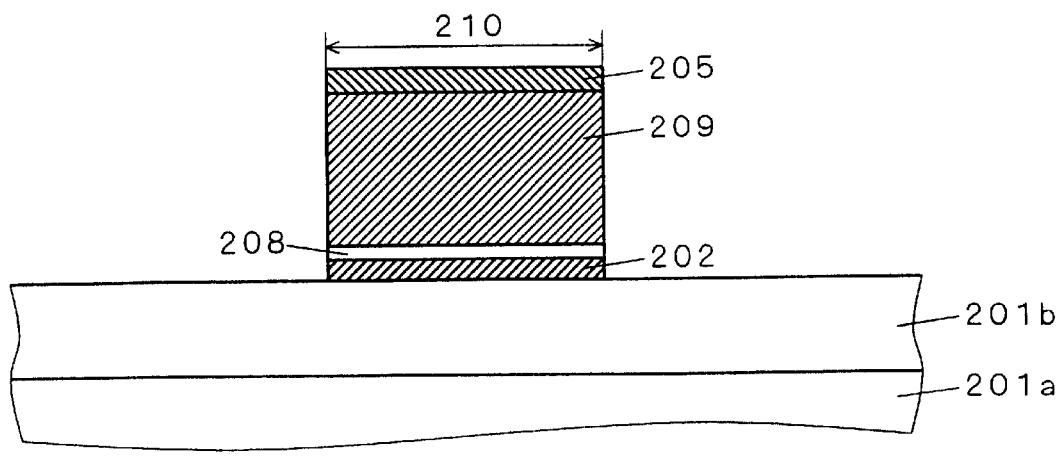
Figure 65:
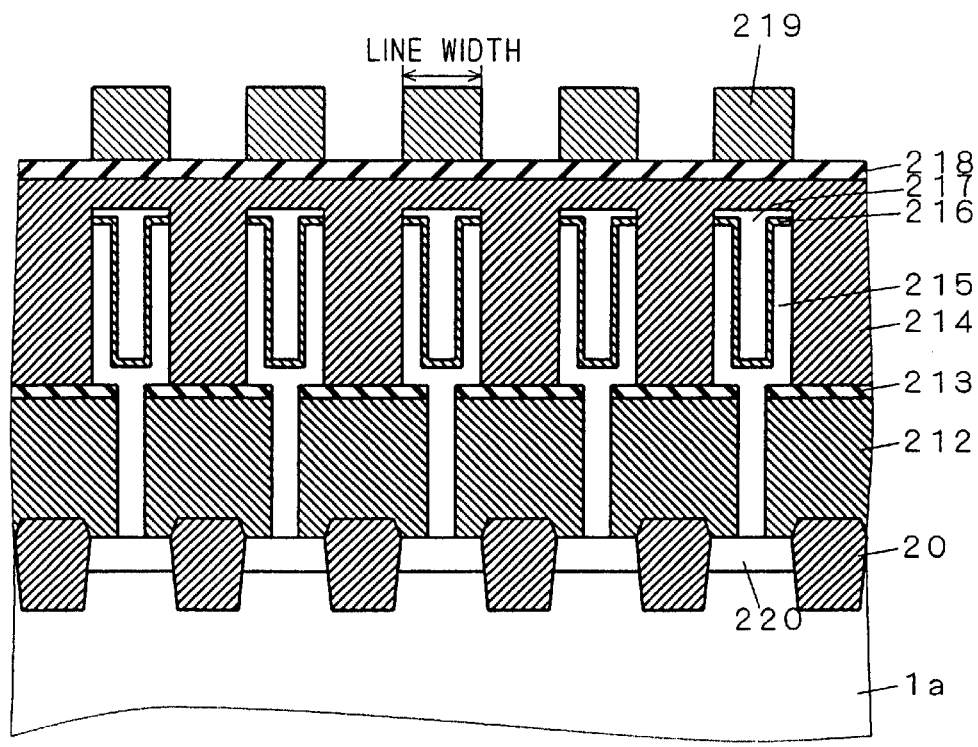

A semiconductor device (MOS transistor) of the ninth preferred embodiment is different from that of the seventh preferred embodiment in that a polysilicon side wall 5g of FIG. 45, for example, is a non-doped polysilicon. Since the polysilicon side wall 5g is a non-doped polysilicon, the resistance value of the polysilicon side wall 5g is larger than that of the tungsten 6c and it can be considered that only the tungsten 6c having an inverted trapezoidal section whose lower base is shorter than its upper base works as a gate electrode. Therefore, a finished gate length 4b is shorter than a gate length 4a on the mask by the lengths of the polysilicon side walls 5g. Accordingly, a distance 17a between a storage contact (referred to as "SC") and a transfer gate (referred to as "TG") is longer than a background-art SC-TG distance 17b (see FIG. 63) by the thickness of the polysilicon side walls 5g. The average value of the electric field in the vicinity of the TG end is obtained by dividing an SC-TG potential difference by the SC-TG distance. Therefore, when the SC and TG are given the same potential difference, the average value of the electric field in the vicinity of the TG end becomes smaller as the SC-TG distance is larger.

If the electric field is strong in the vicinity of the TG end of a memory cell transistor, a leak current becomes larger by a trap assisted tunnel phenomenon. When the leak current is larger, electric charges accumulated in a storage capacitor are leaked sooner and a pause-refresh time becomes shorter. As the pause-refresh time becomes shorter, a power consumption of the memory becomes larger. Therefore, field relieving in the vicinity of the TG end increases the pause-refresh time to achieve less power consumption of the semiconductor device. A brief discussion will be made here on the pause-refresh. In a DRAM, information is written into the storage capacitor by drawing electrons from the storage capacitor through the memory cell transistor. A bias condition for write of information is that, for example, the SC has a potential of 0 V, the TG of 3.6 V, a bit line contact (referred to as "BC") of 2 V and the substrate of −1 V. As the electrons are drawn, the storage capacitor has a positive potential. When the SC electrically connected to the storage capacitor has a potential of, e.g., 2 V, the write operation of the memory cell is terminated. Next, for example, a voltage of 2 V is applied to the SC, 0 V to the TG, 1 V to the BC and −1 V to the substrate, and this state is termed "pause". In the pause, there is a potential difference of 2 V between the SC and TG, which causes an electric field in the vicinity of the TG end in the semiconductor substrate. The pause-refresh time is a time period to assure that the stored information is not destroyed by the leak current due to the electric field. Anyway, for field relieving, it is possible to earn the SC-TG distance by increasing the width of the side wall spacer 11. When the SC-TG distance is earned in this manner, the area of the memory cell disadvantageously becomes larger. When the SC-TG distance is increased while the area of the memory cell is not changed, the contact diameters of the SC and the bit line contact become smaller, disadvantageously to make the contact resistance too high. When the semiconductor device is an integrated circuit, it is preferable that the area of the memory cell should be as small as possible to enhance integration. As can be seen from the comparison between FIGS. 45 and 63, the MOS transistor of the ninth preferred embodiment can increase a SC-TG distance 17a without changing the size of the whole gate electrode and is suitable to reduce the area of the memory cell.

The MOS transistor of FIG. 45 can be basically provided by the method of manufacturing the semiconductor device of the first preferred embodiment, though it is necessary to perform ion implantation at incident angle of 0 to 7 degrees in order to form the N⁻ source/drain regions 13 and 14. No N⁺ source/drain region is formed. The implantation is performed at incident angle of 0 to 7 degrees to suppress introduction of phosphorus into the polysilicon side wall 5g. When the impurity concentration of the polysilicon side wall 5g becomes higher and the polysilicon side wall 5g electrically works like metal the polysilicon sidewall 5g also serves as a gate electrode, not to increase the SC-TG distance. Further, no N⁺ source/drain region makes a condition to stimulate a depletion layer near a gate end region 16a to extend in a horizontal direction and relieve the electric field strength inside the gate end region 16a.

Figure 46:
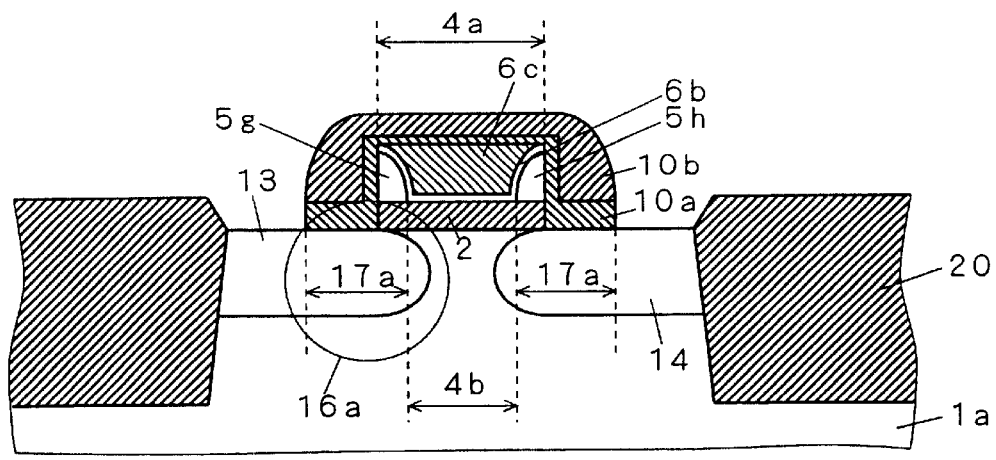

As shown in FIG. 46, a polysilicon side wall 5h on a side of the BC is doped to have an N-type conductivity at high concentration. On the other hand, the polysilicon side wall 5g on a side of the SC is a non-doped polysilicon. In the structure of FIG. 46, as shown in Table 1, a drain current in the write operation increases. Further, in the pause, the electric field at the gate end in vicinity of the SC is relieved to reduce the leak current, and it is thereby possible to provide a long refresh time. When there is a margin in the drain current in the write operation, it is possible to make the polysilicon side walls 5g and 5h on the sides of the SC and BC non-doped.

Figure 47:
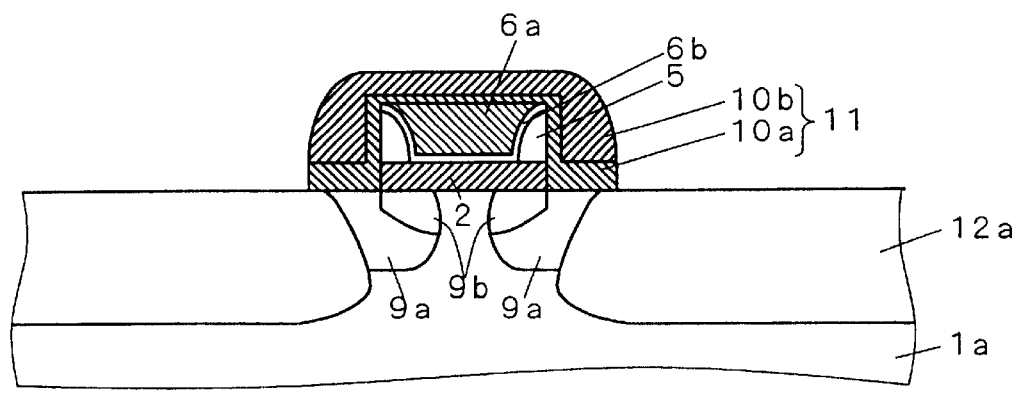

Next, another structure of the source/drain region will be discussed. An entire surface of the semiconductor substrate 1a having a sectional structure of FIG. 47 is ion-implanted with, e.g., arsenic at a dose of 5×10¹⁵/cm² at an energy of 30 keV using the gate electrode 7 and the side wall spacer 11 as a mask. After that, when a heat treatment is performed, the ion-implanted dopant becomes electrically active to form an N⁺ source/drain region 12a as shown in FIG. 47, to be deeper than the N⁻ source/drain region. Specifically, an LDD (Lightly Doped Drain) structure is obtained. When the polysilicon side wall 5 is, for example, an intrinsic semiconductor including no impurity in the LDD structure, the electric field is relieved near the end portion of the gate insulating film 2 more than in the LDD structure having a usual gate electrode structure. Further, a greater effect of relieving the roll-off of the threshold voltage is achieved.

In the gate electrode structure of FIG. 47, since the tungsten 6a which is a constituent of a gate metal electrode is connected to the gate insulating film 2 through the tungsten 6b in a vertical direction, there is no variation of the threshold voltage or deterioration of the drain current due to the depletion of the electrode, which is a problem in the polysilicon gate electrode.

Figure 5:
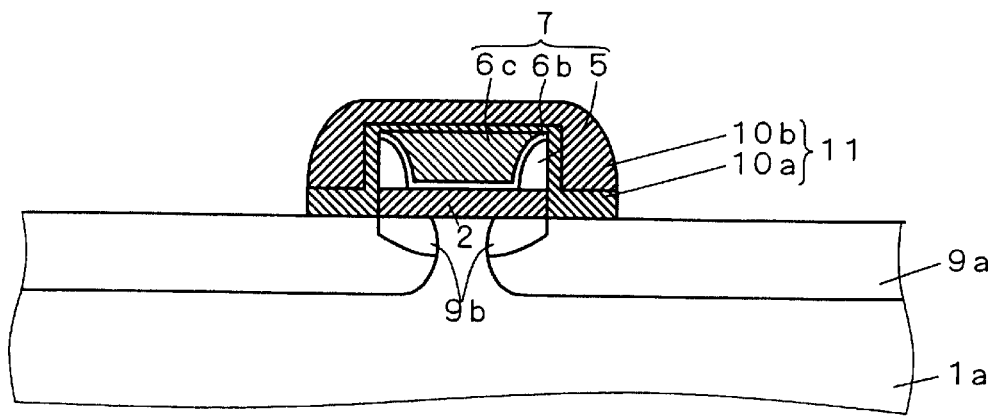

In the state of FIG. 5, e.g., arsenic is implanted at a dose of 1×10¹⁴/cm² at an energy of 50 keV, to form a second N⁻ source/drain region. After that, e.g., arsenic is implanted at a dose of 5×10¹⁵/cm² at an energy of 20 keV, to form the N⁺ source/drain region 12a. Subsequently, e.g., cobalt is deposited entirely on the semiconductor substrate 1a, and then performing a heat treatment at 1000° C. for 30 seconds by the RTA (Rapid Thermal Anneal), the cobalt reacts only with the semiconductor substrate 1a, to form a silicide 12c. The cobalt does not react with the insulating film 10b and is not changed also after the RTA treatment. Therefore, the silicide 12c is in a close contact with the semiconductor substrate 1a and the cobalt is not in a close contact with the insulating film 10b. For this reason, by wet etching, the cobalt on the insulating film 10b is removed and the silicide 12c is formed only on the N⁺ source/drain region 12a. The silicide 12c is formed on the semiconductor substrate 1a in order to reduce the sheet resistance of the N⁺ source/drain region 12a. When the sheet resistance is reduced, the drain current of the transistor increases to improve the circuit performance even under the same condition of externally applied voltage.

Figure 48:
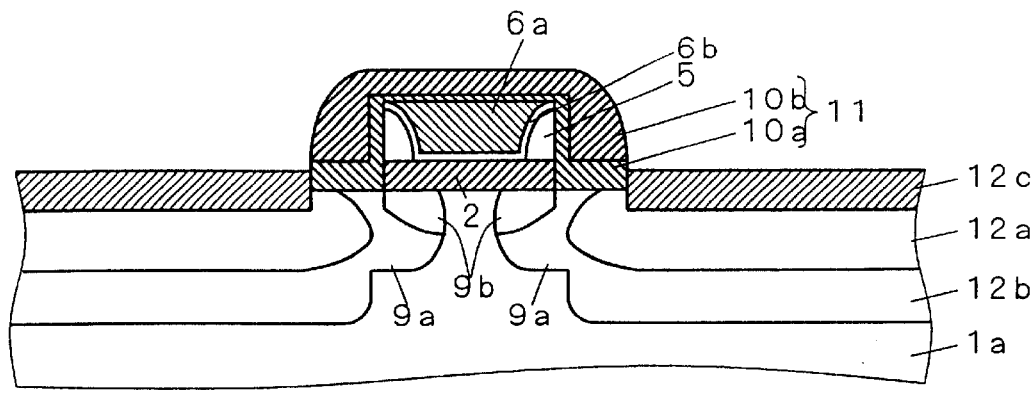

The second N⁻ source/drain region is thus formed in order to prevent the silicide 12c from reaching a source/drain junction as the result of deepening the source/drain junction. When the silicide 12c reaches the junction, the leak current increases to raise problems of an increase in power consumption of the circuit, operation of the circuit not in accordance with the design and the like. FIG. 48 shows a DDD (Doubly Doped Drain) structure. In the DDD structure, when the polysilicon side wall 5 is, for example, an intrinsic semiconductor including no impurity, the field strength is relieved near the end portion of the gate insulating film 2 more than in a DDD structure having a usual gate electrode structure. Further, a greater effect of relieving the roll-off of the threshold voltage is achieved.

Figure 49:
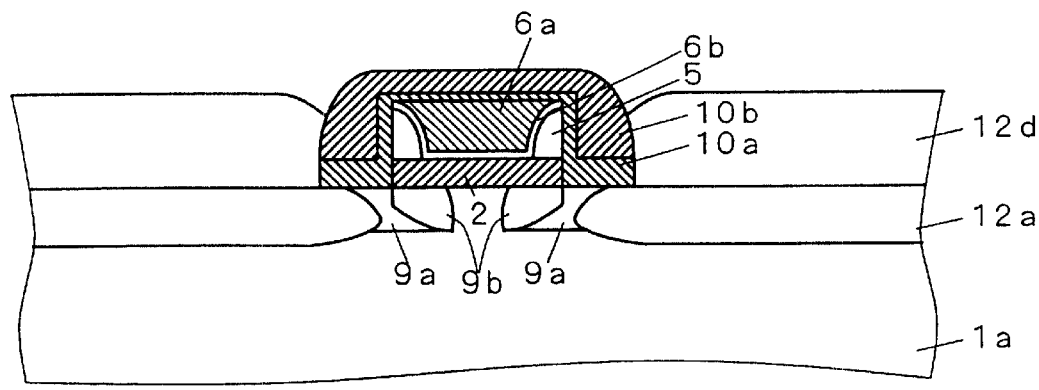
Figure 50:
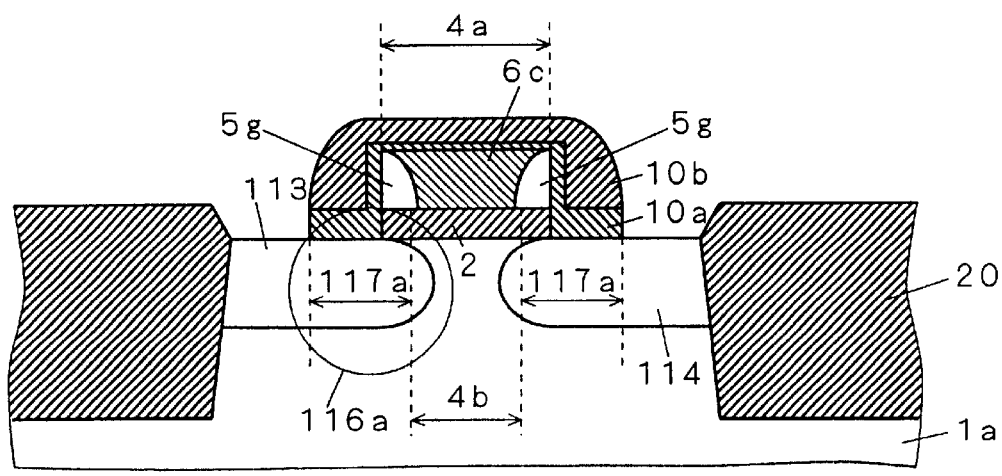
Figure 51:
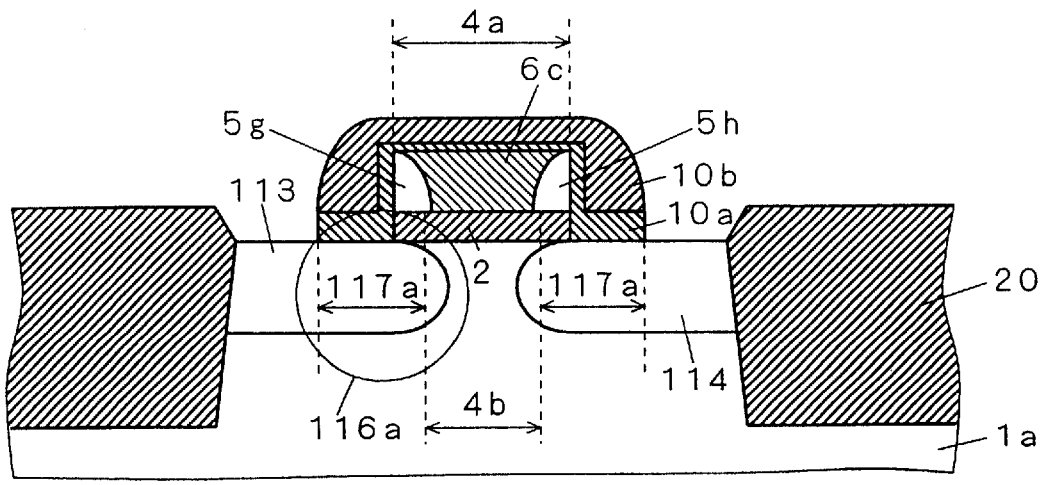
Figure 52:
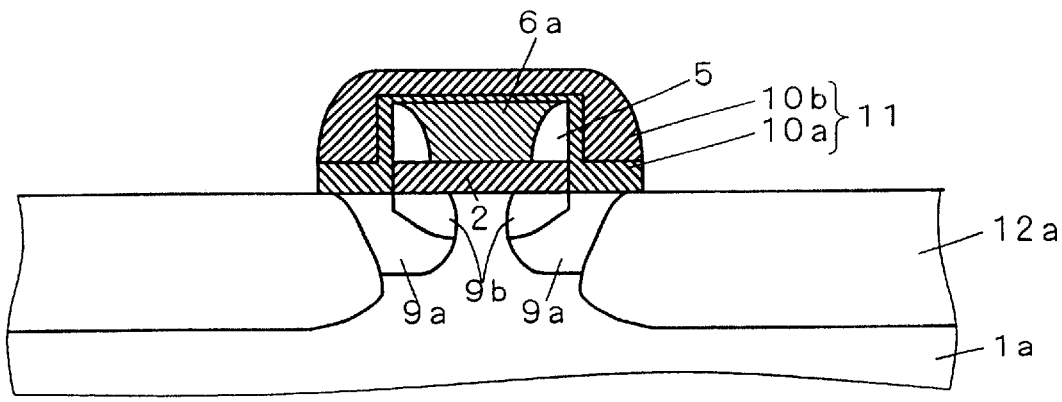
Figure 53:
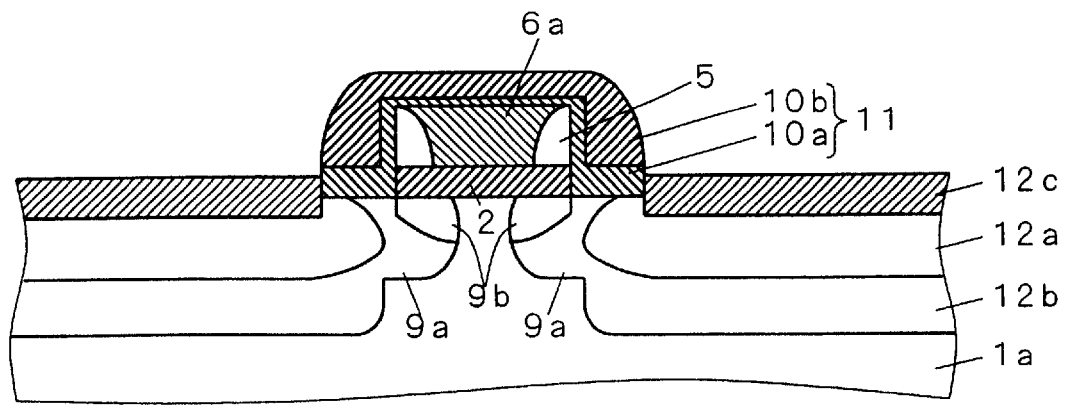
Figure 54:
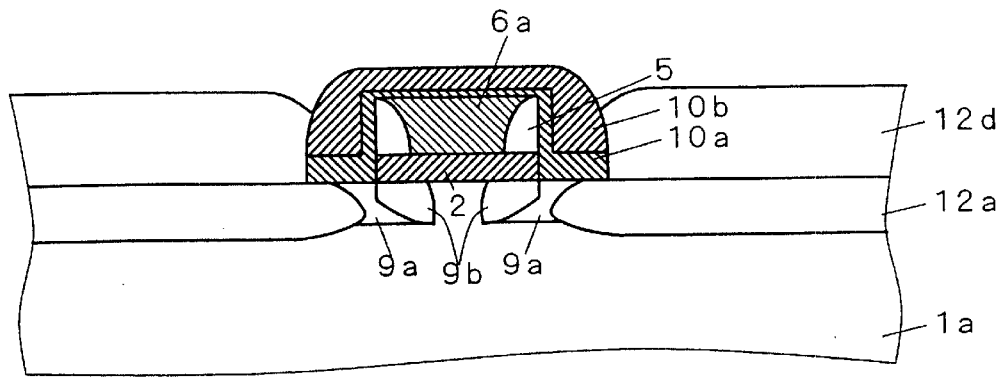

In the state of FIG. 5, e.g., arsenic is implanted at a dose of 5×10¹⁵/cm² at an energy of 10 keV, to form the N⁺ source/drain region 12a. Subsequently, an SiGe doped with highly-concentrated N-type dopant is selectively crystal-grown on, for example, the N⁺ source/drain region 12a, to form an-elevated source/drain region 12d, as shown in FIG. 49. Since the implantation energy of arsenic is lower, the N⁺ source/drain region 9a of FIG. 49 is formed shallower than the transistor having the LDD structure of FIG. 48, in order to suppress a punch through between the source/drain regions 9a. When the junction becomes shallower, however, the sheet resistance of the N⁺ source/drain region 12a increases. The elevated source/drain region 12d is formed in order to reduce the sheet resistance of the source/drain region 12a. Also in the structure of FIG. 49, when the polysilicon side wall 5 is, for example, an intrinsic semiconductor including no impurity, the field strength near the end portion of the gate insulating film 2 is relieved and a greater effect of relieving the roll-off of the threshold voltage is achieved, like in the LDD structure of FIG. 48.

In the gate electrode structures shown in FIGS. 47 to 49, the finished gate length 4b of the tungsten 6b serving as the gate metal electrode is shorter than the gate length 4a on the mask by the thickness of the polysilicon side walls 5, and a superfine transistor can be formed beyond the transfer ability, like the above structure of this preferred embodiment.

Though the above discussion has been made taking an N-type transistor as an example, it is needless to say that the present invention can be applied to a P-type transistor to produce the same effect. In this case, the N-type dopant used for the source/drain region in the-N-type-transistor is-replaced by a P-type dopant and the P-type dopant used for the N-type transistor is replaced by an N-type dopant.

Though the structure in which the tungsten nitride 6b is formed has been discussed in the ninth preferred embodiment, as shown in FIGS. 50 to 54, the tungsten nitride 6b may be omitted to produce the same effect.

The Tenth Preferred Embodiment

Figure 55:
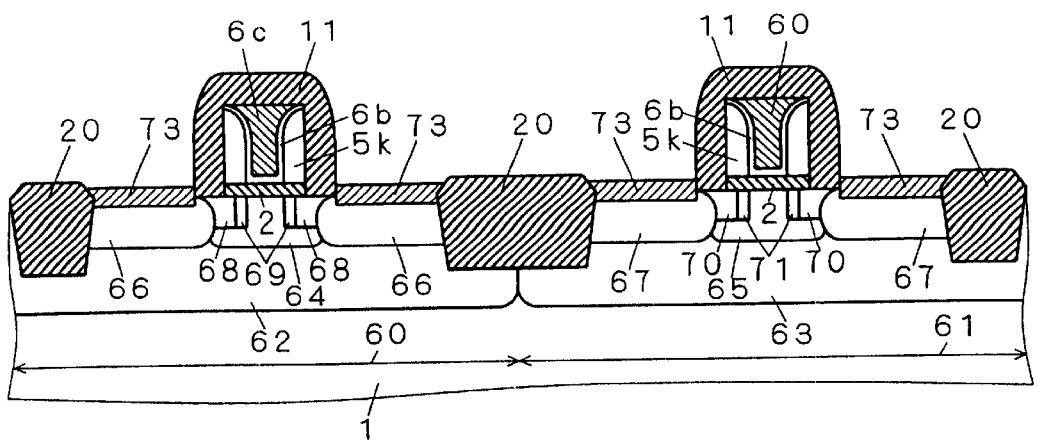
FIG. 55 is a schematic diagram showing an example of structure of a semiconductor device in accordance with a tenth preferred embodiment.
Figure 56:
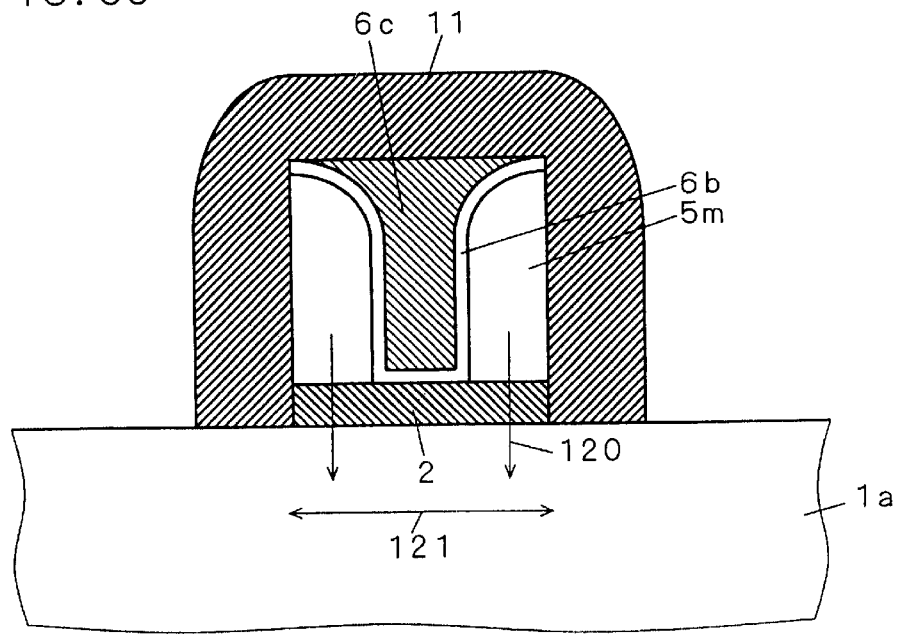
FIG. 56 is an enlarged view of part of the semiconductor device in accordance with the first preferred embodiment.

Now, a semiconductor device of the tenth preferred embodiment will be discussed. The semiconductor device of the tenth preferred embodiment is different from that of the seventh preferred embodiment in composition of a polysilicon side wall used as the adhesive member. A polysilicon side wall of the tenth preferred embodiment is implanted with nitrogen, as well as boron as a dopant, to suppress diffusion of the boron. FIG. 55 is a schematic diagram showing an example of sectional structure of a semiconductor device (CMOS transistor) of the tenth preferred embodiment. In FIG. 55, a polysilicon side wall 5k formed on the side surface of the tungsten 6c is doped with boron and nitrogen of high concentration. Since a polysilicon side wall 5m of FIG. 56 is doped with only boron not nitrogen, diffusion of the boron from the polysilicon side wall 5m to the gate insulating film 2 can not be suppressed. Therefore, as indicated by arrows 120, the boron enters the semiconductor substrate 1a from the polysilicon side wall 5m through the gate insulating film 2. When the boron reaches a channel region 121, this may cause variation of threshold value of the MOSFET. On the other hand, in the polysilicon side wall 5k doped with nitrogen by ion implantation and the like, penetration of boron is suppressed.

Figure 28:
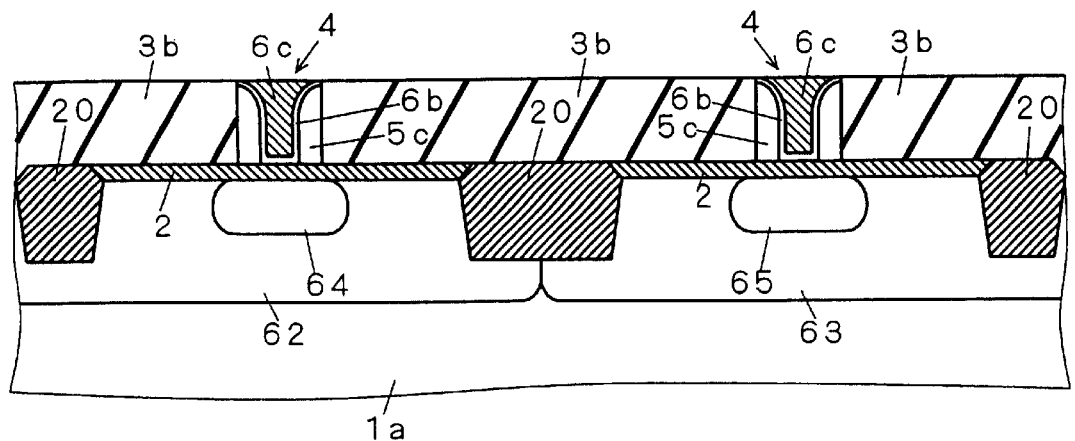
Figure 57:
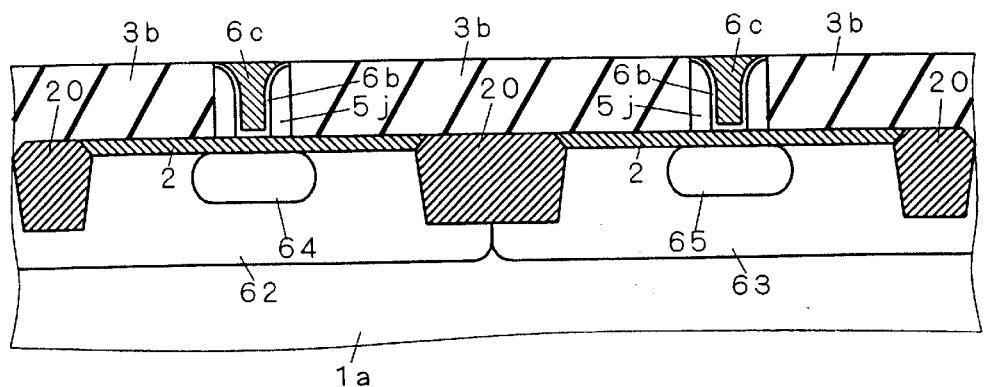
FIGS. 57 and 58 are schematic diagrams each showing a manufacturing step in a method of manufacturing a semiconductor device in accordance with the tenth preferred embodiment.
Figure 58:
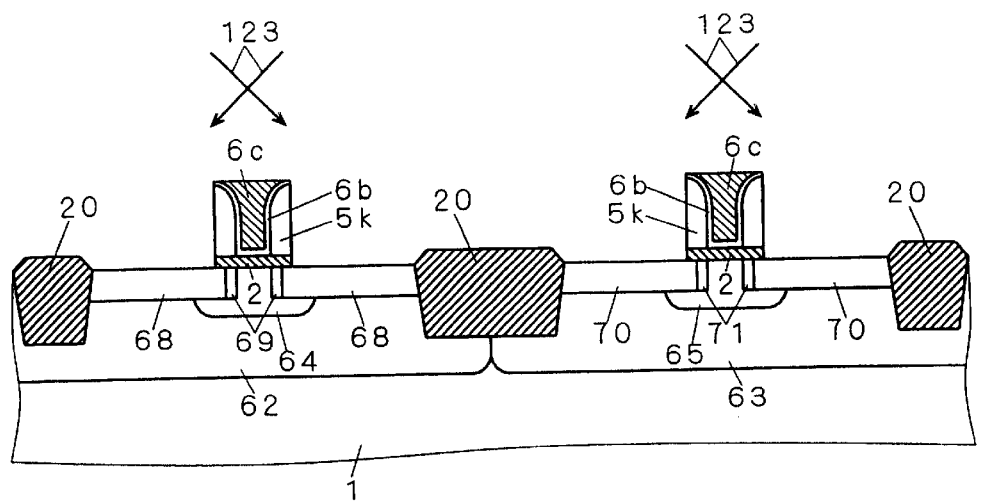

A step of introducing nitrogen into the polysilicon side wall 5k by ion implantation will be discussed. FIG. 57 shows a sectional structure of the semiconductor substrate 1a obtained through almost the same step as the semiconductor substrate 1a having the sectional structure of FIG. 28. The structure of FIG. 57 is different from that of FIG. 28 in that a polysilicon side wall 5j is doped with boron of high concentration while the polysilicon side wall 5c is a non-doped polysilicon. Other than the above, reference signs of FIG. 57; identical to those of FIG. 28 denote components corresponding to those of FIG. 28. After removing the silicon oxide film 3b of FIG. 57 by etching, pocket implantation layers 69 and 71 in the source/drain regions 68 and 70 of the PMOS transistor and the NMOS transistor, respectively, are formed by ion implantation. After that, the whole surface of the semiconductor substrate 1a is diagonally ion-implanted to dope the polysilicon side wall 5k with nitrogen 123 of high concentration (see FIG. 58). At this time, the nitrogen 123 is also introduced into the surface of the semiconductor substrate 1a. After that, through the steps discussed referring to FIGS. 30 and 26, the sectional structure of FIG. 55 is obtained.

Figure 59:
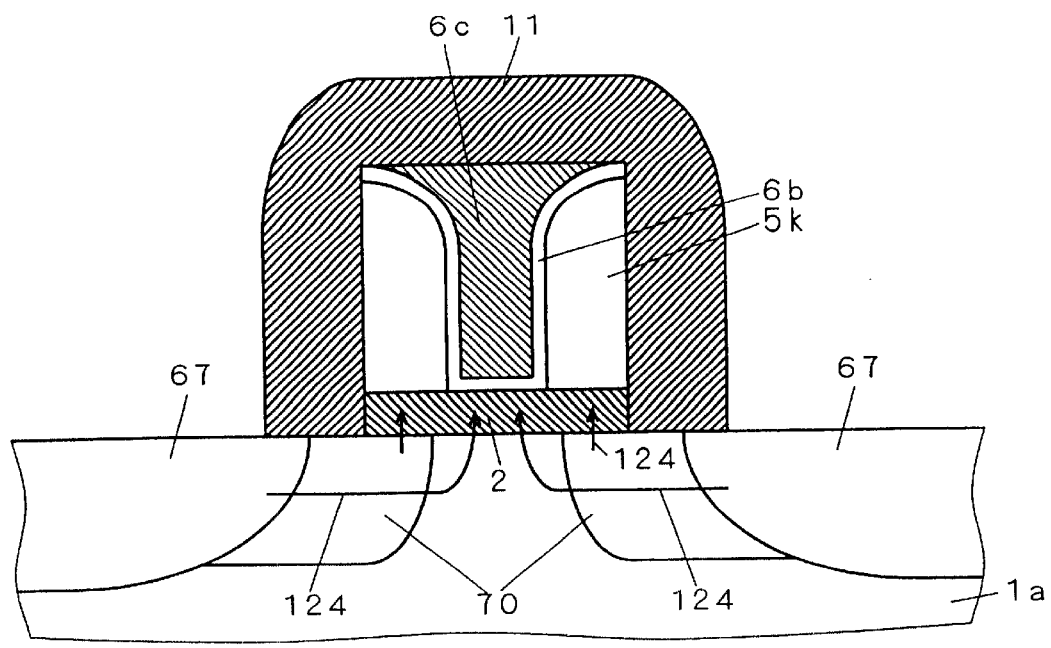
FIG. 59 is an enlarged view of part of the semiconductor device in accordance with the tenth preferred embodiment.
Figure 60:
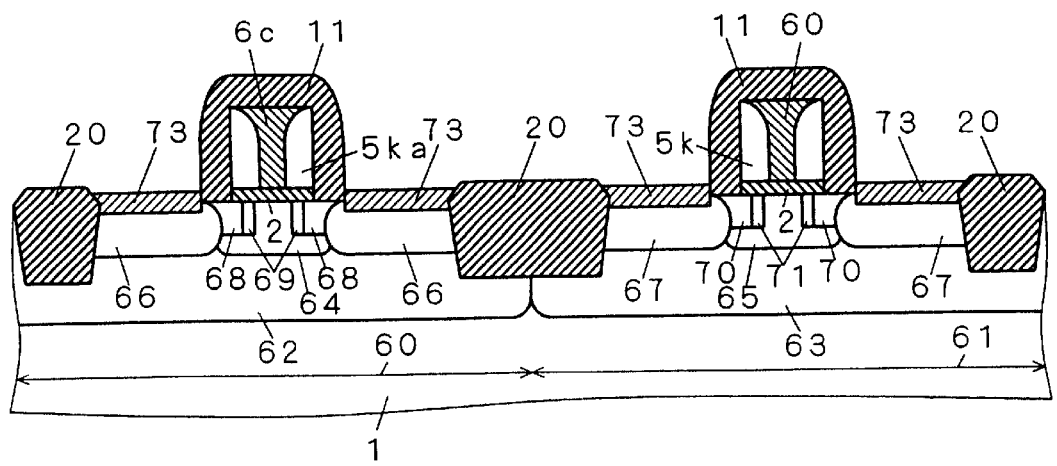
FIG. 60 is a schematic diagram showing an example of structure of a semiconductor device in accordance with the tenth preferred embodiment.
Figure 61:
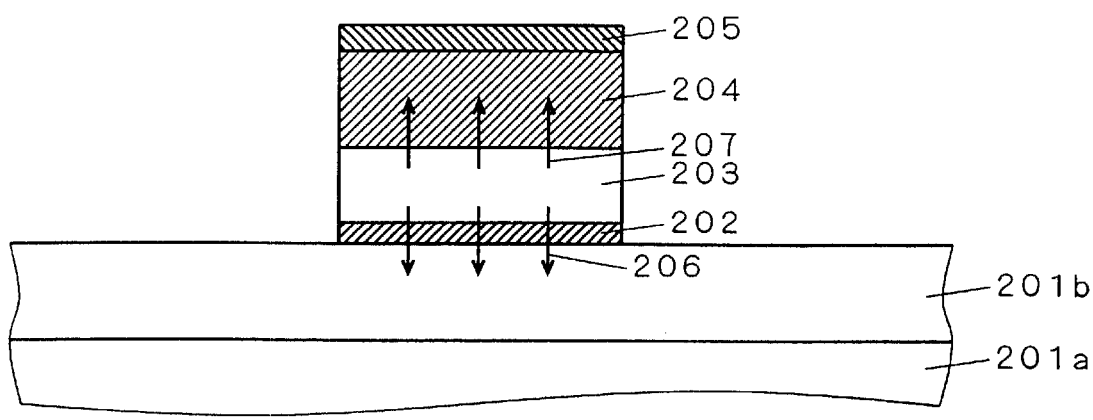
FIG. 61 is a schematic diagram showing an example of structure of a semiconductor device in the background art.
Figure 62:
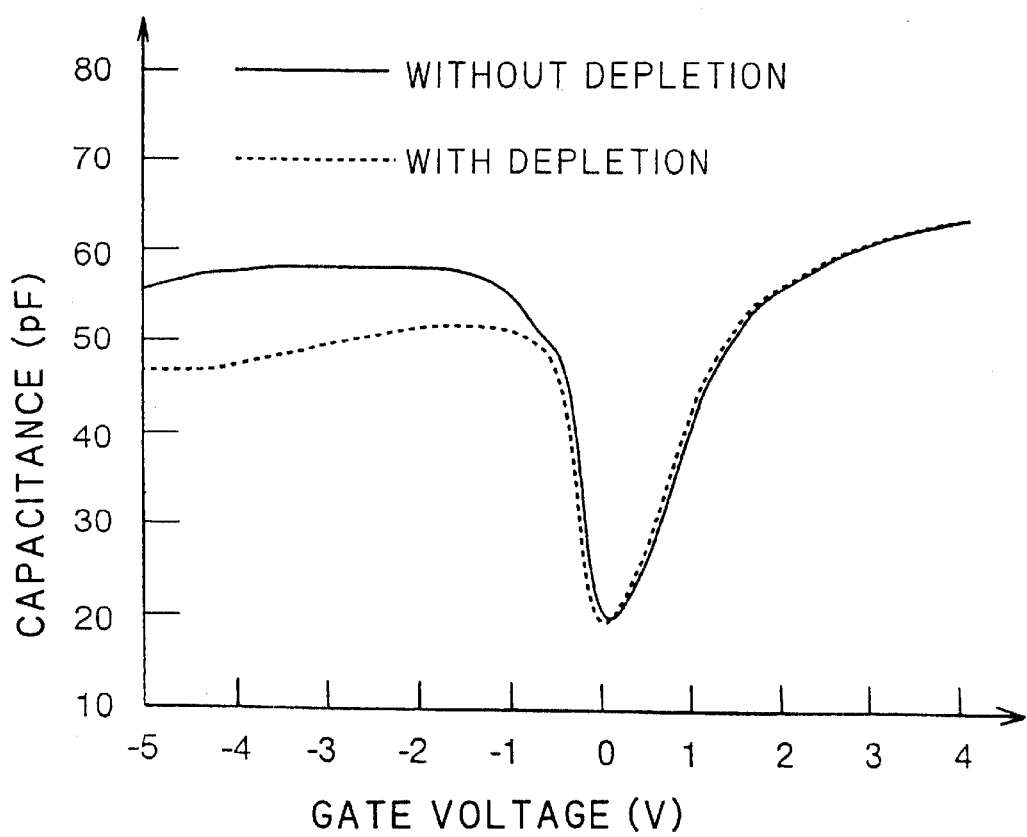
FIG. 62 is a graph showing gate voltage dependency of gate capacitance of the semiconductor device in the background art.

Further, in a case of P-type transistor having the LDD structure and the DDD structure, it is observed that the reliability of the gate insulating film 2 is more deteriorated as the amount of boron in the P$^-$ and P$^+$ source/drain regions 70 and 67 to be diffused into the gate insulating film 2 becomes larger. Since a smaller width of the side wall spacer 11 increases the amount of boron to be diffused from the P$^+$ source/drain region to the gate insulating film 2, it is preferable that the width of the side wall spacer should be larger. Therefore, the PMOS transistor of FIG. 59 in which the effective width of the side wall spacer is larger by the thickness of the polysilicon side walls 5k is advantageous in terms of reliability of the gate insulating film 2. Further, when the nitrogen ion is introduced into the surface of the semiconductor substrate 1a, diffusion of the boron ion in the semiconductor is suppressed and the flow of the boron from the semiconductor substrate 1a to the gate insulating film is prevented, and therefore the gate insulating film achieves a reliability than that in the background art. Furthermore, the nitrogen ion has an effect of suppressing deterioration of the MOSFET due to hot carriers as it terminates dangling bond existing in the interface between the gate oxide film and the semiconductor substrate to reduce the interface level density, as well as the effect of suppressing diffusion of boron. As shown in FIG. 60, the tungsten nitride 6b may be omitted to produce the same effect.

In the first to tenth preferred embodiments, a side wall made of polysilicon germanium (poly-$Si_{1-x}G_x$) may be used instead of using the polysilicon side wall 5. The polysilicon germanium has advantages of low sheet resistance and high activation rate of dopant, to thereby make the gate electrode hard to deplete. Especially, a silicon germanium ($Si_{0.8}Ge_{0.2}$) whose mole ratio of silicon and germanium is eight to two achieves high activation rate. Further, instead of using the polysilicon side wall 5, a metal nitride such as titanium nitride (TiNx) and tungsten nitride (WNx) and a metal oxide film such as aluminum oxide ($Al_2O_3$) and tantalum oxide ($Ta_2O_5$) may be used to produce the same effect as a side wall made of any of these materials is not depleted. A thin film made of any of these materials can be formed by the CVD method.

As a material of conductor in the first to tenth preferred embodiments, metal such as tungsten (W), copper (Cu), aluminum (Al), cobalt (Co), titanium (Ti) and nickel (Ni) may be used.

Further, a superconductor may be used instead of metal as a material of conductor.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a semiconductor substrate having an insulating film directly on one major surface thereof where constituent elements of a semiconductor device are incorporated;
    a first conductor formed in direct contact with an upper surface of said insulating film;
    a barrier layer formed having a first portion that extends over and in parallel with the upper surface of said insulating film and a second portion in direct contact with side surfaces of said first conductor; and
    a second conductor formed in direct contact with a surface of said barrier layer,
    wherein said first conductor and said second conductor are included as part of a wiring or a gate electrode of an MOS type transistor, and
    wherein the insulating film is a gate insulating layer or an isolation structure.

2. The semiconductor device according to claim 1, wherein
    said second conductor has a trapezoidal section whose lower base on a side of said insulating film is shorter than its upper base, and the widest portion in a section of said wiring or said gate electrode consisting of said second conductor and said first conductor includes said upper base of said second conductor.

3. The semiconductor device according to claim 1, wherein
said barrier layer includes tungsten nitride, tantalum nitride or titanium nitride.

4. The semiconductor device according to claim 1, wherein
said second conductor includes at least one of a metal and a superconductor.

5. The semiconductor device according to claim 1, wherein
said first conductor includes any one of a silicon, a silicon germanium, a metal oxide or a metal nitride.

6. The semiconductor device according to claim 1, wherein
said insulating film includes a gate insulating film of said MOS type transistor, and
said gate insulating film has
a surface layer including a silicon oxide, a silicon nitride oxide or a titanium nitride in an interface with said first conductor; and
a dielectric layer provided below said surface layer, having permittivity higher than that of said surface layer.

7. The semiconductor device according to claim 1, wherein
said insulating film includes an interlayer insulating film covering a plurality of elements in a semiconductor integrated circuit or an isolation insulating film for isolating a plurality of elements, and
said first conductor and said second conductor included as part of said wiring configured to electrically connect with said plurality of elements.

8. The semiconductor device according to claim 1, wherein said first conductor includes an undoped silicon layer or an undoped silicon germanium layer.

9. The semiconductor device according to claim 1, wherein
said insulating film includes a gate insulating film of said MOS transistor, and
said first conductor includes a silicon layer or a silicon germanium layer as a degenerate semiconductor having a conductivity type different from that of a channel of said MOS transistor in an interface with said insulating film.

10. The semiconductor device according to claim 1, wherein
said insulating film includes a gate insulating film of said MOS transistor,
and said first conductor includes a silicon layer or a silicon germanium layer as a degenerate semiconductor having the same conductivity type as that of a channel of said MOS transistor in an interface with said insulating film.

11. A semiconductor device, comprising:
a semiconductor substrate having an insulating film in direct contact with one major surface thereof where constituent elements of a semiconductor device are incorporated;
a first conductor formed in direct contact with an upper surface of said insulating film; and
a second conductor having a first portion that extends over and in parallel with the upper surface of said insulating film and a second portion that is not insulated from any part of side surfaces of said first conductor and extends over said side surfaces of said first conductor that contact the insulating film,
wherein said first conductor and said second conductor are included as part of a wiring or as part of a gate electrode of an MOS type transistor, and
wherein the insulating film is a gate insulating layer or an isolation structure.

12. The semiconductor device according to claim 11, wherein
said second conductor has a trapezoidal section whose lower base on a side of said insulating film is shorter than its upper base, and
the widest portion in a section of said wiring or said gate electrode consisting of said first conductor and said second conductor includes said upper base of said second conductor.

13. The semiconductor device according to claim 11, wherein
said second conductor includes at least one of a metal and a superconductor.

14. The semiconductor device according to claim 11, wherein
said first conductor includes any one of a silicon, a silicon germanium, a metal oxide or a metal nitride.

15. The semiconductor device according to claim 11, wherein
said insulating film includes a gate insulating film of said MOS type transistor, and
said gate insulating film has
a surface layer including a silicon oxide, a silicon nitride oxide or a titanium nitride in an interface with said first conductor; and
a dielectric layer provided below said surface layer, having permittivity higher than that of said surface layer.

16. The semiconductor device according to claim 11, wherein
said insulating film includes an interlayer insulating film covering a plurality of elements of a semiconductor integrated circuit or an isolation insulating film for isolating a plurality of elements, and
said second conductor and said first conductor included as part of said wiring configured to electrically connect with said plurality of elements.

17. The semiconductor device according to claim 11, wherein
said first conductor includes an undoped silicon layer or an undoped silicon germanium layer.

18. The semiconductor device according to claim 11, wherein
said insulating film includes a gate insulating film of said MOS transistor, and
said first conductor includes a silicon layer or a silicon germanium layer as a degenerate semiconductor having a conductivity type different from that of a channel of said MOS transistor in an interface with said insulating film.

19. The semiconductor device according to claim 9, wherein
said insulating film includes a gate insulating film of said MOS transistor, and
said first conductor includes a silicon layer or a silicon germanium layer as a degenerate semiconductor having the same conductivity type as that of a channel of said MOS transistor in an interface with said insulating film.

20. A semiconductor device, comprising:

a semiconductor substrate;

an insulating film in direct contact with said semiconductor substrate;

a first conductor in direct contact with a first portion of an upper surface of the insulating film;

a barrier layer configured to stop diffusion of a particular material there through, said barrier layer extending in direct contact with a second portion of the upper surface of the insulating film that extends in a same direction as said first portion of the upper surface of the insulating film and side surfaces of said first conductor; and a second conductor including the particular material, said second conductor having a portion in contact with a top surface of said barrier layer, wherein the insulating film is a gate insulating layer or an isolation structure.

* * * * *